United States Patent
Yang et al.

(10) Patent No.: US 9,800,267 B2
(45) Date of Patent: *Oct. 24, 2017

(54) APPARATUS AND METHOD FOR TRANSMITTING AND RECEIVING A QUASI-CYCLIC LOW DENSITY PARITY CHECK CODE IN A MULTIMEDIA COMMUNICATION SYSTEM

(71) Applicant: Samsung Electronics Co., Ltd., Gyeonggi-do (KR)

(72) Inventors: Hyun-Koo Yang, Seoul (KR); Sung-Hee Hwang, Gyeonggi-do (KR); Seho Myung, Seoul (KR)

(73) Assignee: Samsung Electronics Co., Ltd (KR)

( * ) Notice: Subject to any disclaimer, the term of this patent is extended or adjusted under 35 U.S.C. 154(b) by 181 days.

This patent is subject to a terminal disclaimer.

(21) Appl. No.: 14/739,825

(22) Filed: Jun. 15, 2015

(65) Prior Publication Data
US 2015/0280743 A1 Oct. 1, 2015

Related U.S. Application Data

(63) Continuation of application No. 14/579,146, filed on Dec. 22, 2014, now Pat. No. 9,059,741, which is a (Continued)

(30) Foreign Application Priority Data

Nov. 11, 2011 (KR) .................. 10-2011-0117855
Oct. 8, 2012 (KR) .................. 10-2012-0111459

(51) Int. Cl.
*H03M 13/00* (2006.01)
*H03M 13/11* (2006.01)
*H04L 1/00* (2006.01)

(52) U.S. Cl.
CPC ........ *H03M 13/116* (2013.01); *H03M 13/611* (2013.01); *H03M 13/616* (2013.01); (Continued)

(58) Field of Classification Search
CPC ............. H03M 16/116; H03M 13/616; H03M 13/1105; H03M 13/1111; H03M 13/1162; (Continued)

(56) References Cited

U.S. PATENT DOCUMENTS 6,633,856 B2 * 10/2003 Richardson .............. G06N 3/02
                                                    341/107
7,127,659 B2 * 10/2006 Richardson ........ H03M 13/1105
                                                    714/758

(Continued)

FOREIGN PATENT DOCUMENTS

CN    1499731    5/2004
CN    1836394    9/2006
(Continued)

OTHER PUBLICATIONS

Kenya Sugihara et al., "Coding Rate Adjustment for LDPC Codes by Row-Splitting", Electronic Information Communication Conference, Mar. 1, 2010, 2 pages.

(Continued)

*Primary Examiner* — Christine Tu
(74) *Attorney, Agent, or Firm* — The Farrell Law Firm, P.C.

(57) ABSTRACT

A method and apparatus are provided for transmitting an LDPC code in a multimedia system. The method includes generating an LDPC code based on a resulting parity check matrix which is generated by performing a row splitting operation on a base parity check matrix; and transmitting the LDPC code. The row splitting operation includes splitting each row block included in the base parity check matrix into (Continued)

row blocks, a number of the row blocks is determined based on a splitting factor, and the splitting factor is determined based on a number of repair symbols included in a repair symbol block of the base parity check matrix, a number of rows included in the base parity check matrix, and a scaling factor for determining a size of each permutation matrix in the resulting parity check matrix and a size of each zero matrix included in the resulting parity check matrix.

10 Claims, 4 Drawing Sheets

Related U.S. Application Data continuation of application No. 13/674,651, filed on Nov. 12, 2012, now Pat. No. 8,918,697.

(52) U.S. Cl.
CPC ..... *H03M 13/618* (2013.01); *H03M 13/6362* (2013.01); *H03M 13/6516* (2013.01); *H03M 13/6544* (2013.01); *H04L 1/0041* (2013.01); *H03M 13/1171* (2013.01)

(58) Field of Classification Search
CPC ......... H03M 13/1165; H03M 13/1168; H03M 13/1148; H03M 13/1171; H03M 13/116; H03M 13/611; H03M 13/618; H03M 13/6362; H03M 13/6516; H03M 13/65; G11B 2020/185
USPC ................ 714/752, 758, 786, 799, 800, 801
See application file for complete search history.

(56) References Cited

U.S. PATENT DOCUMENTS

| | | | |
|---|---|---|---|
| 7,805,652 | B1 | 9/2010 | Varnica |
| 7,900,127 | B2 | 3/2011 | Shen et al. |
| 8,656,244 | B1 | 2/2014 | Chang |
| 2004/0153959 | A1 | 8/2004 | Kim et al. |
| 2005/0050435 | A1 | 3/2005 | Kyung et al. |
| 2008/0126916 | A1 | 5/2008 | Chung et al. |
| 2008/0178065 | A1 | 7/2008 | Khandekar et al. |
| 2009/0210767 | A1 | 8/2009 | Myung et al. |
| 2010/0023838 | A1 | 1/2010 | Shen et al. |
| 2010/0058139 | A1 | 3/2010 | Wang et al. |
| 2010/0229066 | A1 | 9/2010 | Matsumoto et al. |
| 2011/0047433 | A1 | 2/2011 | Abu-Surra et al. |
| 2011/0154168 | A1 | 6/2011 | Lee et al. |
| 2012/0210189 | A1 | 8/2012 | Sugihara et al. |
| 2014/0013180 | A1 | 1/2014 | Noda |
| 2014/0344639 | A1 | 11/2014 | Kyung et al. |

FOREIGN PATENT DOCUMENTS

| | | |
|---|---|---|
| CN | 101753149 | 6/2010 |
| JP | 2009-021676 | 1/2009 |
| JP | 2010-517444 | 5/2010 |
| KR | 1020090093778 | 9/2009 |
| WO | WO 2006/057879 | 6/2006 |
| WO | WO 2010/022602 | 3/2010 |
| WO | WO 2011/062111 | 5/2011 |

OTHER PUBLICATIONS

Japanese Office Action dated Oct. 31, 2016 issued in counterpart application No. 2014-540953, 12 pages.
Chinese Office Action dated May 23, 2016 issued in counterpart application No. 201280055114.5, 15 pages.
Japanese Office Action dated Jun. 6, 2016 issued in counterpart application No. 2014-540953, 7 pages.
Jong-Ee Oh et al., "Row-Splitting Design of Low-Density Parity-Check Codes for Gbps Wireless Transmission", 2nd International Conference on Wireless.
Chinese Office Action dated Jan. 26, 2017 issued in counterpart application No. 201280055114.5, 14 pages.
Hyeong-Gun Joo et al., "New Construction of Rate-Compatible Block-Type Low Density Parity-Check Codes using Splitting", 17th Annual IEEE International Symposium on Personal, Indoor and Mobile Radio Communications, Sep. 1, 2006, 5 pages.
Jong-Ee Oh et al., "Row-Splitting Design of Low-Density Parity-Check Codes for Gbps Wireless Transmission", 2nd International Conference on Wireless Broadband and Ultra Wideband Communications, Aug. 1, 2007, 5 pages.
Nicola Moschini et al., "STMicroelectronics LDPCC Proposal for 802.11n CFP", IEEE P802.11 Working Group for Wireless Local Area Networks (WLANs), Aug. 13, 2004, 30 pages.
Andres I. Vila Casado et al., "Multiple Rate Low-Density Parity-Check Codes with Constant Blocklength", Nov. 7, 2004, 5 pages.
European Search Report dated Jun. 29, 2015 issued in counterpart application No. 12848353.4-1906, 13 pages.

* cited by examiner $c_0$ $c_1$ $c_2$ $c_3$ $c_4$ $c_5$ $c_6$ $c_7$ $c_8$ $c_9$
0 −1 0 −1 3 −1 3 −1 −1 −1   $T_0 = \{(0, 0), (2, 0), (4, 3), (6, 3)\}$

APPARATUS AND METHOD FOR TRANSMITTING AND RECEIVING A QUASI-CYCLIC LOW DENSITY PARITY CHECK CODE IN A MULTIMEDIA COMMUNICATION SYSTEM

PRIORITY

This application is a continuation of U.S. Ser. No. 14/579,146, which was filed in the U.S. Patent and Trademark Office on Dec. 22, 2014, which is a continuation of U.S. Ser. No. 13/674,651, which was filed in the U.S. Patent and Trademark Office on Nov. 12, 2012, issued as U.S. Pat. No. 8,918,697 on Dec. 23, 2014, and claims priority under 35 U.S.C. §119(a) to Korean Patent Application Serial No. 10-2011-0117855, which was filed in the Korean Intellectual Property Office on Nov. 11, 2011, and to Korean Patent Application Serial No. 10-2012-0111459, which was filed in the Korean Intellectual Property Office on Oct. 8, 2012, the entire disclosure of each of which is hereby incorporated by reference.

BACKGROUND OF THE INVENTION

1. Field of the Invention

The present invention relates to an apparatus and method for transmitting and receiving a quasi-cyclic Low Density Parity Check (LDPC) code in a multimedia communication system, and more particularly to a quasi-cyclic LDPC code transmission and reception apparatus and method that support various codeword lengths and code rates.

2. Description of the Related Art

A multimedia communication system, for example, a Moving Picture Experts Group (MPEG) Media Transport (MMT) system provides various large-capacity content, such as High Definition (HD) content, Ultra High Definition (UHD) content, etc. Further, according to a diversification of this content and especially increases in large-capacity content, data congestion has become a more serious issue. As a result of the data congestion, content transmitted by a signal transmission device is not always completely transferred to a signal reception device, and some of the content is lost en route.

In general, data is transmitted on a packet basis, and accordingly, data loss is generated on a transmission packet basis. For example, if the transmission packet is lost on a network, the signal reception device cannot receive the lost transmission packet, and thus, cannot know the data within the lost transmission packet. As a result, user inconvenience occurs, such as audio quality deterioration, video quality deterioration, video break, caption omissions, file loss, etc.

Therefore, the MMT system may enhance system reliability using various error-control schemes in order to reduce information data loss that is often caused by an error that occurs on a network according to channel status. A typical example of an error-control scheme is an Application Layer-Forward Error Correction (AL-FEC) scheme.

However, a multimedia communication system, such as an MMT system, requires usage of a Forward Error Correction (FEC) code supporting a codeword length and a code rate, which vary according to a code rate and delay time required by a service.

Further, when a conventional AL-FEC scheme is used, a signal transmission and reception apparatus should use different FEC codes according to a codeword length and a code rate, thereby increasing the complexity of the MMT system.

Consequently, it is difficult to implement an MMT system due to this increased complexity.

SUMMARY OF THE INVENTION

Accordingly, the present invention is designed to address at least the problems and/or disadvantages described above and to provide at least the advantages described below.

An aspect of the present invention is to provide an apparatus and method for transmitting and receiving a quasi-cyclic LDPC code in a multimedia communication system.

Another aspect of the present invention is to provide a quasi-cyclic LDPC code transmission and reception apparatus and method that support various codeword lengths in a multimedia communication system.

Another aspect of the present invention is to provide a quasi-cyclic LDPC code transmission and reception apparatus and method that support various code rates in a multimedia communication system.

Another aspect of the present invention is to provide a quasi-cyclic LDPC code transmission and reception apparatus and method that support various codeword lengths using a scaling scheme and a shortening scheme in a multimedia communication system.

Another aspect of the present invention is to provide a quasi-cyclic LDPC code transmission/reception apparatus and method that support various code rates using one of a row separation scheme and a row merge scheme, and a puncturing scheme in a multimedia communication system.

In accordance with an aspect of the present invention, a method is provided for transmitting an LDPC code by a signal transmission apparatus in a multimedia system. The method includes generating an LDPC code based on a resulting parity check matrix which is generated by performing a row splitting operation on a base parity check matrix; and transmitting the LDPC code. The row splitting operation includes splitting each row block included in the base parity check matrix into row blocks, a number of the row blocks is determined based on a splitting factor, and the splitting factor is determined based on a number of repair symbols included in a repair symbol block of the base parity check matrix, a number of rows included in the base parity check matrix, and a scaling factor for determining a size of each permutation matrix in the resulting parity check matrix and a size of each zero matrix included in the resulting parity check matrix.

In accordance with another aspect of the present invention, a signal transmission apparatus is provided for use in a multimedia system. The signal transmission apparatus includes an encoder configured to generate a Low Density Parity Check (LDPC) code based on a resulting parity check matrix which is generated by performing a row splitting operation on a base parity check matrix; and a transmitter configured to transmit the LDPC code. The row splitting operation includes splitting each row block included in the base parity check matrix into row blocks, a number of the row blocks is determined based on a splitting factor, and the splitting factor is determined based on a number of repair symbols included in a repair symbol block of the base parity check matrix, a number of rows included in the base parity check matrix, and a scaling factor for determining a size of each permutation matrix in the resulting parity check matrix and a size of each zero matrix included in the resulting parity check matrix.

BRIEF DESCRIPTION OF THE DRAWINGS

The above and other aspects, features, and advantages of certain embodiments of the present invention will be more apparent from the following detailed description taken in conjunction with the accompanying drawings, in which:

FIG. 3 schematically illustrates a row separation process according to an embodiment of the present invention;

FIG. 4 schematically illustrates a row merge process according to an embodiment of the present invention;

Throughout the drawings, the same drawing reference numerals will be understood to refer to the same elements, features and structures.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Although embodiments of the present invention will be described below with reference to an MPEG MMT system, it will be understood by those of ordinary skill in the art that the present invention is also applicable to any one of a Long-Term Evolution (LTE) mobile communication system, a Long-Term Evolution Advanced (LTE-A) mobile communication system, and an Institute of Electrical and Electronics Engineers (IEEE) 802.16m communication system.

Figure 1:
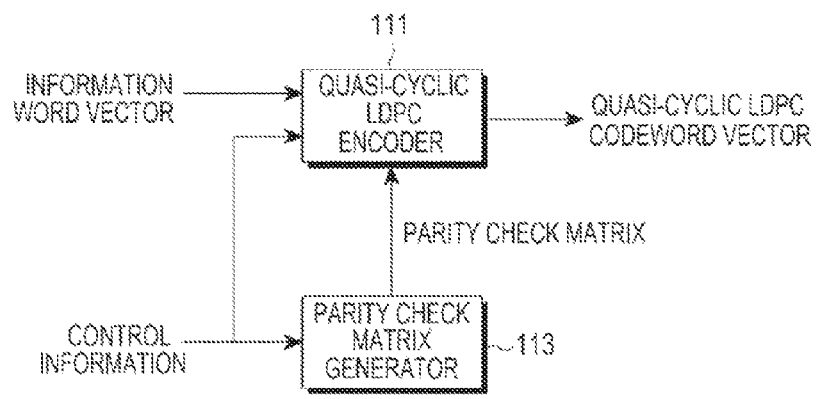
FIG. 1 is a block diagram illustrating a quasi-cyclic LDPC code generator included in a signal transmission apparatus in an MMT system according to an embodiment of the present invention.

FIG. 1 is a block diagram illustrating a quasi-cyclic LDPC code generator included in a signal transmission apparatus in an MMT system according to an embodiment of the present invention.

Referring to FIG. 1, a quasi-cyclic LDPC code generator includes a quasi-cyclic LDPC encoder 111 and a parity check matrix generator 113. An information word vector is input to the quasi-cyclic LDPC encoder 111. The information word vector includes k information symbols. Additionally, control information including includes (k,n,m) information is input to the quasi-cyclic LDPC encoder 111, where k denotes a number of information word symbols included in the information word vector, n denotes a number of codeword symbols, i.e., quasi-cyclic LDPC codeword symbols, included in a codeword vector, i.e., a quasi-cyclic LDPC codeword vector, and m denotes a number of parity symbols included in a parity vector.

The parity check matrix generator 113 also receives the control information, converts a prestored base matrix into a parity check matrix, based on the control information, and outputs the converted parity check matrix to the quasi-cyclic LDPC encoder 111.

The quasi-cyclic LDPC encoder 111 generates a quasi-cyclic LDPC codeword vector by quasi-cyclic LDPC encoding the information word vector using the received control information and converted parity check matrix.

Although FIG. 1 illustrates the parity check matrix generator 113 generating the parity check matrix and outputting the parity check matrix to the quasi-cyclic LDPC encoder 111, alternatively, the quasi-cyclic LDPC encoder 111 may prestore the parity check matrix, and in this case, the parity check matrix generator 113 is not utilized.

Additionally, although FIG. 1 illustrates the control information being input from the outside to the quasi-cyclic LDPC encoder 111 and the parity check matrix generator 113, alternatively, the quasi-cyclic LDPC encoder 111 and the parity check matrix generator 113 may prestore the control information, and in this case, need not receive the control information from the outside.

Further, although FIG. 1 illustrates the quasi-cyclic LDPC encoder 111 and the parity check matrix generator 113 are shown in FIG. 1 as separate units, the quasi-cyclic LDPC encoder 111 and the parity check matrix generator 113 may also be incorporated into a single unit.

Although not illustrated, a signal transmission apparatus includes the quasi-cyclic LDPC code generator and a transmitter, and the quasi-cyclic LDPC code generator and the transmitter may be incorporated into a single unit.

Figure 2:
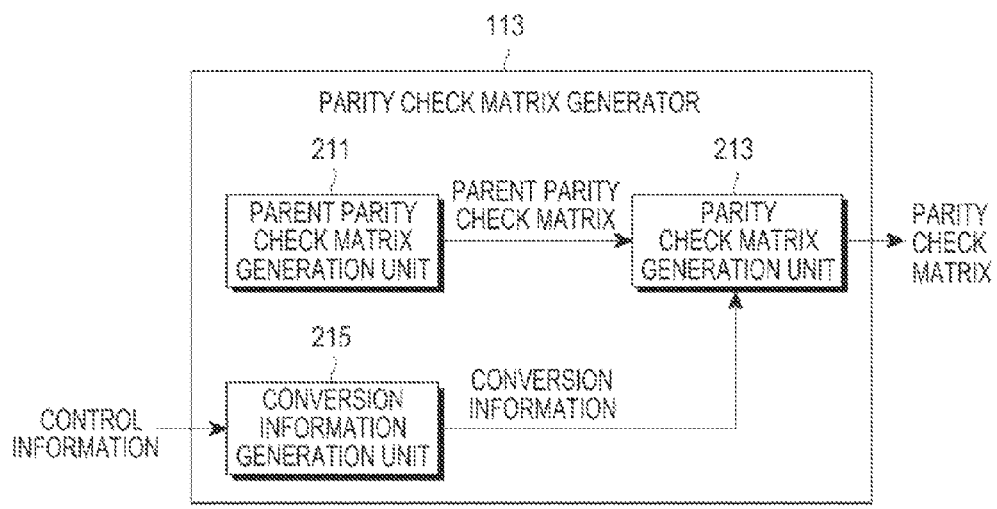
FIG. 2 is a block diagram illustrating a parity check matrix generator according to an embodiment of the present invention.

FIG. 2 is a block diagram illustrating a parity check matrix generator according to an embodiment of the present invention.

Referring to FIG. 2, a parity check matrix generator 113 includes a parent parity check matrix generation unit 211, a parity check matrix generation unit 213, and a conversion information generation unit 215. The parent parity check matrix generation unit 211 reads a parent parity check matrix from an internal storage unit, or generates the parent parity check matrix using a preset scheme, and outputs the parent parity check matrix to the parity check matrix generation unit 213.

In accordance with an embodiment of the present invention, a parent parity check matrix Q is generated using a base matrix B, which includes K columns and M rows, and each of K columns maps to an information symbol block. Each element included in the base matrix B has a value of 0 or 1, and locations of elements with a value of 1 in each of the M rows may be expressed as a sequence, as shown in Equation (1).

$$R_i = \{j|0 \leq j < K, B_{i,j}=1\} = \{r_{i,0}, r_{i,1}, \ldots, r_{i,D_i-1}\} \quad (1)$$

In Equation (1), j denotes a column index, i denotes a row index, $R_i$ denotes a sequence indicating locations on which elements have value 1 on the base matrix B, $B_{i,j}$ denotes elements included in the base matrix B, and $r_{i,D_i-1}$ denotes elements included in the $R_i$. The $D_i$ denotes a degree of the ith row.

For a base matrix B including 10 columns and 4 rows, the base matrix B may be expressed as shown in Equation (2).

$$\begin{bmatrix} 1 & 0 & 1 & 0 & 1 & 0 & 1 & 0 & 0 & 0 \\ 0 & 1 & 0 & 1 & 0 & 1 & 0 & 1 & 0 & 1 \\ 0 & 1 & 1 & 0 & 1 & 0 & 0 & 1 & 1 & 0 \\ 1 & 0 & 0 & 0 & 0 & 1 & 1 & 0 & 0 & 1 \end{bmatrix} \quad (2)$$

Each of $R_0$ to $R_3$ in Equation (2) is expressed as shown in Equation (3).

$R_0 = \{0,2,4,6\}$ $R_1 = \{1,3,5,7,9\}$ $R_2 = \{1,2,4,7,8\}$ $R_3 = \{0,5,6,9\}$     (3)

The parent parity check matrix Q includes K×L columns and M×L rows, and is generated by substituting one of an L×L permutation matrix and an L×L zero matrix for each element $B_{i,j}$ included in the base matrix B. The L×L permutation matrix is expressed as shown in Equation (4), and the L×L zero matrix is expressed as shown in Equation (5).

$$Q_{i,j} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix}^P \quad (4)$$

In Equation (4), P denotes an exponent, a related permutation matrix is an identity matrix if P=0, and a related permutation matrix is a zero matrix if P=−1.

$$Q_{i,j} = \begin{bmatrix} 0 & 0 & 0 & \cdots & 0 \\ 0 & 0 & 0 & \cdots & 0 \\ \vdots & \vdots & \vdots & \ddots & \vdots \\ 0 & 0 & 0 & \cdots & 0 \\ 0 & 0 & 0 & \cdots & 0 \end{bmatrix} \quad (5)$$

For example, the parent parity check matrix Q may be expressed as shown in Equation (6).

$$\begin{bmatrix} 0 & -1 & 0 & -1 & 3 & -1 & 3 & -1 & -1 & -1 \\ -1 & 2 & -1 & 2 & -1 & 1 & -1 & 1 & -1 & 0 \\ -1 & 3 & 1 & -1 & 0 & -1 & -1 & 2 & 3 & -1 \\ 1 & -1 & -1 & -1 & -1 & 2 & 0 & -1 & -1 & 1 \end{bmatrix} \quad (6)$$

In Equation (6), each permutation matrix is expressed as shown in Equation (7).

$-1 \leq P_{i,j} < L$     (7)

In Equation (7), $P_{i,j}$ denotes an exponent of a permutation matrix arrayed on a location at which the ith row included in the base matrix B and the jth column included in the base matrix B crosses.

A location and an exponent of each of permutation matrixes included in the parent parity check matrix expressed in Equation (6) may be expressed as a sequence, as shown in Equation (8).

$$T_i = \{(j, \underline{P_{i,j}}) \mid 0 \leq j < K, \underline{P_{i,j}} > -1\} \quad (8)$$

$$= \{(t_{i,0}, e_{i,0}), (t_{i,1}, e_{i,1}), \ldots, (\underline{t_{i,Di-1}}, \underline{e_{i,Di-1}})\}$$

In Equation (8), $T_i$ denotes a sequence indicating locations at which permutation matrixes are arrayed on the parent parity check matrix, $t_{i,Di-1}$ denotes a location of a permutation matrix included in the ith row among permutation matrixes included in the parent parity check matrix Q, and $e_{i,Di-1}$ denotes an exponent of a permutation matrix arrayed on a related location, i.e., a location which $t_{i,Di-1}$ indicates.

Each of $T_0$ to $T_3$ is expressed as shown in Equation (9).

$T_0 = \{(0,0),(2,0),(4,3),(6,3)\}$ $T_1 = \{(1,2),(3,2),(5,1),(7,1),(9,0)\}$ $T_2 = \{(1,3),(2,1),(4,0),(7,2),(8,3)\}$ $T_3 = \{(0,1),(5,2),(6,0),(9,1)\}$     (9)

The parent parity check matrix generation unit 211 reads the base matrix B from an internal storage unit, or generates the base matrix B using a preset scheme.

As described above, the parent parity check matrix generated by the parent parity check matrix generation unit 211 only includes columns corresponding to an information symbol vector, i.e., an information part.

The conversion information generation unit 215 inputs control information, generates conversion information, and outputs the conversion information to the parity check matrix generation unit 213. The conversion information may include a scaling factor, a row separation factor, or a row merge factor, and a row separation pattern or a row merge pattern. If the conversion information includes the row separation factor, the row separation pattern is included in the conversion information.

If the conversion information includes the row merge factor, the row merge pattern is included in the conversion information. It will be understood by those of ordinary skill in the art that the row separation pattern and the merge pattern may be implemented in various formats.

A scaling factor S1 is used for determining a size of a parity check matrix to be generated by the parity check matrix generation unit 213. That is, the scaling factor S1 is used for changing a size of permutation matrixes and zero matrixes included in the parent parity check matrix Q. Here, S1 denotes a maximum integer satisfying k≤(K×L)/S1, where S1=$2^a$, and "a" denotes a maximum integer satisfying k≤(K×L)/S1.

If the size of the permutation matrixes and zero matrixes included in the parent parity check matrix Q is L×L, the size of the parity check matrix to be generated by the parity check matrix generation unit 213 is L'×L' according to the scaling factor S1. Here, L'=L/S1.

A row separation factor S2 is used for separating rows included in the parent parity check matrix, when the parity check matrix generation unit 213 generates the parity check matrix. Here, S2=ceil(m/((M×L)/S1)), where S2=$2^b$, and b denotes a maximum integer satisfying $2^b$≥ceil(m/((M×L)/S1)).

For example, each of the rows included in the parent parity check matrix is separated into 2 rows, if the row separation factor S2 is 2.

FIG. 3 illustrates a row separation process according to an embodiment of the present invention.

Referring to FIG. 3, for the parent parity check matrix expressed in Equation (6), when a row separation factor S2 is 2, the first row 311 included in the parent parity check matrix is separated into 2 rows 313. In FIG. 3, C0 to C9 are indexes of each row of elements included in the first row 311, and C'0 to C'9 are indexes of each row of elements included in the 2 rows 313.

A matrix generated by performing a row separation operation and a scaling operation on a base matrix is equal to a matrix generated by performing the row separation operation on a parent parity check matrix, which is generated by performing the scaling operation on the base matrix. Therefore, a row separation pattern may be expressed using a row separated-base matrix or a row separated-parent parity check matrix.

A criterion for separating one row into n rows is shown in Equation (10).

$$\begin{aligned}&1)\ T_0 = T'_0 \cup T'_1 \cup \ldots \cup T'_{n-1} \\ &2)\ T'_i \cap T'_j = \{\ \} \text{ for all } 0 \leq i \neq j < n\end{aligned} \quad (10)$$

When Equation (10) is satisfied, one row is separated into n rows. That is, one row is separated into n rows expressed as shown in Equation (11).

$$T_0 \rightarrow T'_0, T'_1, \ldots, T'_{n-1} \quad (11)$$

The row merge factor S3 is used for merging rows included in the parent parity check matrix, when the parity check matrix generation unit 213 generates the parity check matrix. Here, $S3=\text{ceil}(((M \times L)/S1)/m))$, $S3=2^c$, and c denotes a maximum integer satisfying $2^c \geq \text{ceil}(((M \times L)/S1)/m))$.

For example, the rows included in the parent parity check matrix are merged on two-row basis, if the row merge factor S3 is 2.

FIG. 4 illustrates a row merge process according to an embodiment of the present invention.

Referring to FIG. 4, for the parent parity check matrix in Equation (6), when a row merge factor S3 is 3, the first row and the second row 411 included in the parent parity check matrix are merged into one row 413. In FIG. 4, C0 to C9 are indexes of each row of elements included in the first row and the second row 411, and C'0 to C'9 are indexes of each row of elements included in one row 413.

A matrix generated by performing a row merge operation and a scaling operation on a base matrix is equal to a matrix generated by performing the row merge operation on a parent parity check matrix, which is generated by performing the scaling operation on the base matrix. Therefore, a row merge pattern may be expressed using a row merged-base matrix or a row merged-parent parity check matrix.

A criterion for merging n rows into one row is expressed as shown in Equation (12).

$$\begin{aligned}&T_i \cap T_j = \{\ \} \text{ for all } 0 \leq i \neq j < n \\ &T'_0 = T_0 \cup T_1 \cup \ldots \cup T_{n-1}\end{aligned} \quad (12)$$

When the criterion expressed in Equation (12) is satisfied, n rows are merged into one row. That is, n rows are merged into one row as shown in Equation (13).

$$T_0, T_1, \ldots, T_{n-1} \rightarrow T'_0 \quad (13)$$

If a row separation operation according to a row separation factor is performed, a row merge operation according to a row merge factor is not performed. If a row merge operation according to a row merge factor is performed, a row separation operation according to a row separation factor is not performed.

If a parity check matrix is generated according to a row merge factor or a row separation factor, a location and an exponent of each permutation matrix included in the parity check matrix are expressed as shown in Equation (14).

$$(t'_{i,j}, e'_{i,j}) = (t_{i,j}, f(e_{i,j}, L, S1)) \quad (14)$$

The parity check matrix generation unit 213 converts the parent parity check matrix output from the parent parity check matrix generation unit 211 into a parity check matrix using the conversion information output from the conversion information generation unit 215.

If a parity check matrix generated by the parity check matrix generation unit 213 is H, the parity check matrix H includes $H_I$ and $H_P$, $H_I$ is a matrix corresponding to an information word vector, and $H_P$ is a matrix corresponding to a parity vector. $H_I$ is a parent parity check matrix generated by the parent parity check matrix generation unit 211, and a quasi-cyclic matrix. $H_P$ is an encoding matrix, and includes M'×L' columns and M'×L' rows. Here, $H_P$ need not be a quasi-cyclic matrix, and may be one of a bit-wise dual diagonal (accumulator) matrix as shown in Equation (15), a block-wise dual diagonal matrix as shown in Equation (16), and a quasi-cyclic Block LDPC (BLDPC) used in an IEEE 802.16e communication system as shown in Equation (17).

$$\begin{bmatrix} 1 & 0 & 0 & \ldots & 0 & 0 \\ 1 & 1 & 0 & \ldots & 0 & 0 \\ \vdots & \vdots & \vdots & \ddots & \vdots & \vdots \\ 0 & 0 & 0 & \ldots & 1 & 1 \\ 0 & 0 & 0 & \ldots & 0 & 1 \end{bmatrix} \quad (15)$$

$$\begin{bmatrix} 0 & -1 & -1 & \ldots & -1 & -1 \\ 0 & 0 & -1 & \ldots & -1 & -1 \\ \vdots & \vdots & \vdots & \ddots & \vdots & \vdots \\ -1 & -1 & -1 & \ldots & 0 & 0 \\ -1 & -1 & -1 & \ldots & -1 & 0 \end{bmatrix} \quad \text{L'×L' matrix} \quad (16)$$

$$\begin{bmatrix} a & 0 & -1 & \ldots & -1 & -1 \\ -1 & 0 & 0 & \ldots & -1 & -1 \\ \vdots & \vdots & \vdots & \ddots & \vdots & \vdots \\ b & -1 & -1 & \ldots & -1 & -1 \\ \vdots & \vdots & \vdots & \ldots & \vdots & \vdots \\ -1 & -1 & -1 & -1 & 0 & 0 \\ a & -1 & -1 & -1 & -1 & 0 \end{bmatrix} \quad \text{L'×L' matrix} \quad (17)$$

If an information word vector includes k symbols and a parity vector includes m parity symbols, the parity check matrix generation unit 213 substitutes $l \times l (l=L/S1)$ permutation matrixes and $l \times l (l=L/S1)$ zero matrixes for permutation matrixes and zero matrixes included in a parent parity check matrix Q. The substituted permutation matrix is shown in Equation (18).

$$p_{i,j} = f(P_{i,j}, L, S1) \quad (18)$$

The parity check matrix generation unit 213 generates $H_I$ including M block rows by separating each block row included in a conversion parent parity check matrix including the substituted permutation and zero matrixes, based on a row separation factor S2, or merging block rows included in the conversion parent parity check matrix matrixes, based on a row merge factor S3.

The parity check matrix generation unit 213 generates a parity check matrix as shown in Equation (19) by concatenating $H_I$ and $H_P$.

$$H=[H_I|H_P] \tag{19}$$

In Equation (19), $H_P$ includes M'×1 rows and M'×1 columns.

A permutation matrix is expressed in Equation (20).

1) $f(P_{i,j},L,S1)=\text{floor}(P_{i,j}/S1)$

2) $f(P_{i,j},L,S1)=P_{i,j} \bmod(L/S1)$ \qquad (20)

Although FIG. 2 illustrates the parent parity check matrix generation unit 211 generating the parent parity check matrix, the conversion information generation unit 215 generating the conversion information, and the parity check matrix generation unit 213 generating the parity check matrix using the parent parity check matrix and the conversion information, alternatively, the parity check matrix generation unit 213 may prestore the parent parity check matrix and the conversion information, and in this case, the parent parity check matrix generation unit 211 and the conversion information generation unit 215 are not utilized.

Additionally, Although FIG. 2 illustrates the parent parity check matrix generation unit 211, the parity check matrix generation unit 213, and the conversion information generation unit 215 as separate units, these components may be incorporated into a single unit.

TABLE 1

| information word symbol number(k) | 10, 20, 40, 80 |
|---|---|
| code rate (k/n) | 10/12, 10/14, 10/16, 10/18 |

In Table 1, which shows design requirement criterion for an MMT system, the information word symbol number denotes a number of information word symbols that the MMT system should support. That is, the MMT system should support four types of information word symbol number, i.e., 10, 20, 40, and 80.

In Table 1, the code rate denotes the code rate that the MMT system should support. That is, the MMT system should support four types of code rate, i.e., 10/12, 10/14, 10/16, and 10/18.

The four types of code rate for each of the four types of information word symbol number should be supported, so 16 parity check matrixes will be used if the MMT system intends to design all of the quasi-cyclic LDPC codes satisfying the design requirement criterion described in Table 1.

The information word symbol number (k) 10, 20, 40, and 80, as described in Table 1, are in multiples one another, so a required parity symbol number for satisfying the code rate (k/n) 10/12, 10/14, 10/16, 10/18, as descried in Table 1, are also in multiples of one another if the information word symbol number is determined.

In accordance with an embodiment of the present invention, the design requirement criterion in Table 1 is satisfied by performing a scaling operation and a row separation operation on a parent parity check matrix including 16(=2× 8) rows and 80(=10×8) columns, which is generated by substituting an 8×8 permutation matrix for each element included in a base matrix including 2 rows and 10 columns.

For a base matrix expressed as in Equation (21), when the number of rows is 2 and the number of the columns is 10, a parent parity check matrix, which is generated by substituting an 8×8 permutation matrix for each element included in the base matrix in Equation (21), is expressed as shown in Equation (22).

$R_0=\{0,1,2,3,4\}$ $R_1=\{5,6,7,8,9\}$ \qquad (21)

$T_0=\{(0,0),(1,7),(2,4),(3,1),(4,6)\}$ $T_1=\{(5,3),(6,0),(7,1),(8,6),(9,7)\}$ \qquad (22)

A method for supporting various information word symbol numbers using a scaling scheme will be described with reference to a case in which a criterion 2) in Equation (20) is applied to the parent parity check matrix expressed in Equation (22).

information word symbol numbers 10, 20, and 40 may be supported by applying a permutation matrix substitution, in which a scaling factor S1=8, 4, and 2 is applied to the parent parity check matrix expressed in Equation (22), respectively.

Matrixes generated by applying a permutation matrix substitution, expressed as criterion 2) in Equation (20), in which a scaling factor S1=2 and 4 is applied to the parent parity check matrix expressed in Equation (22), respectively, are expressed as shown in Equations (23) to (24).

$T_0=\{(0,0),(1,3),(2,0),(3,1),(4,2)\}$ $T_1=\{(5,3),(6,0),(7,1),(8,2),(9,3)\}$ \qquad (23)

$T_0=\{(0,0),(1,1),(2,0),(3,1),(4,0)\}$ $T_1=\{(5,1),(6,0),(7,1),(8,0),(9,1)\}$ \qquad (24)

Parent parity check matrixes that support information word symbol numbers 40 and 20 are expressed in Equations (23) to (24), respectively. If the number of information word symbols is 10, L'=L/8=1. Therefore, a parent parity check matrix is equal to a base matrix as expressed in Equation (21).

If the number of information word symbols is 80, parity symbol numbers that satisfy the design requirement criterion in Table 1 are 16, 32, 48, and 64 for 10/12, 10/14, 10/16, and 10/18, respectively. In an LDPC code, the number of parity symbols is equal to the number of parity check equations. Therefore, a code rate is 80/(80+16)=10/12, if the parity check matrix in Equation (22) is used as a parent parity check matrix, and the code rates described in Table 1 are satisfied if each row included in the parity check matrix is separated into 2, 3, and 4 rows, respectively.

A row separation patter may be designed in various forms. However, in accordance with an embodiment of the present invention, a rule provided below is applied in order to provide a uniform degree of distribution for the columns in a parity check matrix, which is generated by applying a row separation scheme.

<Row Separation Rule>

The jth row among rows that are generated by separating $T_i=\{(t_{i,0},e_{i,0}), (t_{i,1},e_{i,1}), \ldots , (t_{j,Di-1},e_{j,Di-1})\}$ into n rows corresponds to the (n×i+j)th row, and $\underline{T}_{n \times i+j}=\{(t_{j,k}, e_{j,k})|0 \leq k<D_j, k \bmod n=(n-1-j)\}$, if all rows included in a parent parity check matrix are separated into n rows, respectively.

Matrixes generated by applying a row separation factor S2=2, 3, and 4 to the parent parity check matrix as shown in Equation (22), respectively, are expressed as shown in Equations (25) to (27).

$T'_0 = \{(1,1),(3,1)\}$ $T'_1 = \{(0,0),(2,0),(4,0)\}$ $T'_2 = \{(6,0),(8,0)\}$ $T'_3 = \{(5,1),(7,1),(9,1)\}$ (25)

wherein Equation (25), $T'_0$, $T'_1$ denote columns that are generated by separating $T_0$ as shown in Equation (21), and $T'_2$ and $T'_3$ denote columns that are generated by separating $T_1$ as shown in Equation (22).

$T'_0 = \{(2,4)\}$ $T'_1 = \{(1,7),(4,6)\}$ $T'_2 = \{(0,0),(3,1)\}$ $T'_3 = \{(7,1)\}$ $T'_4 = \{(6,0),(9,7)\}$ $T'_5 = \{(5,3),(8,6)\}$ (26)

wherein Equation (26), $T'_0$, $T'_1$, and $T'_2$ denote columns that are generated by separating $T_0$ as shown in Equation (21), and $T'_3$, $T'_4$, and $T'_5$ denote columns that are generated by separating $T_3$ as shown in Equation (22).

$T'_0 = \{(3,1)\}$ $T'_1 = \{(2,4)\}$ $T'_2 = \{(1,7)\}$ $T'_3 = \{(0,0),(4,6)\}$ $T'_4 = \{(8,6)\}$ $T'_5 = \{(7,1)\}$ $T'_6 = \{(6,0)\}$ $T'_7 = \{(5,3),(9,7)\}$ (27)

wherein Equation (27), $T'_0$, $T'_1$, $T'_2$, and $T'_3$ denote columns that are generated by separating $T_0$ as shown in Equation (21), and $T'_4$, $T'_5$, $T'_6$, and $T'_7$ denote columns that are generated by separating $T_1$ as shown in Equation (22).

TABLE 2

| information word symbol number (k) | 400, 800, 1600, 3200, 6400 |
| --- | --- |
| code rate (k/n) | 20/21, 20/22, 20/23, 20/24 |

In Table 2, which shows design requirement criterion for an MMT system, the information word symbol number denotes a number of information word symbols that the MMT system should support. That is, the MMT system should support five types of information word symbol numbers, i.e., 400, 800, 1600, 3200, and 6400.

In Table 2, the code rate denotes the code rate that the MMT system should support. That is, the MMT system should support five types of code rates, i.e., 20/21, 20/22, 20/23, and 20/24.

A base matrix including 20 rows and 400 columns, which is expressed using Equation (1), is expressed in Equation (28).

$R_0 = \{1, 2, 3, 5, 6, 7, 9, 12, 14, 15, 19, 20, 26, 34,$
35, 38, 45, 46, 48, 56, 57, 62, 63, 71, 75, 77,
78, 82, 83, 85, 88, 90, 92, 93, 97, 99, 104, 107,
110, 111, 116, 117, 120, 121, 125, 127, 128,
129, 131, 134, 150, 152, 156, 158, 159, 161,
163, 164, 165, 168, 171, 172, 175, 177, 180,
185, 193, 194, 195, 199, 200, 202, 204, 207,
212, 213, 214, 217, 223, 224, 226, 227, 228,
232, 236, 240, 241, 245, 250, 251, 255, 260,
267, 268, 272, 273, 275, 276, 278, 284, 288,
289, 291, 292, 297, 299, 302, 309, 310, 311,
312, 326, 330, 334, 335, 337, 338, 340, 342,
343, 347, 349, 350, 351, 357, 361, 364, 365,
367, 369, 373, 375, 376, 377, 379, 383, 384,
388, 389, 391$\}$ $R_1 = \{2, 5, 8, 10, 12, 13, 14, 17, 23, 24, 29, 30, 33,$
37, 45, 46, 47, 56, 60, 65, 73, 77, 78, 81, 89,
94, 99, 100, 102, 107, 111, 112, 117, 125, 127,
128, 133, 134, 136, 137, 138, 141, 143, 155,
157, 158, 160, 161, 163, 169, 170, 174, 176,
177, 178, 180, 182, 186, 187, 188, 189, 191,
192, 196, 198, 199, 200, 202, 204, 207, 210,
214, 217, 221, 224, 226, 228, 233, 236, 239,
241, 246, 249, 251, 256, 257, 259, 263, 264,
266, 267, 270, 271, 280, 282, 285, 286, 291,
292, 295, 302, 305, 306, 308, 309, 311, 312,
315, 316, 321, 322, 323, 324, 327, 328, 338,
342, 343, 346, 347, 349, 356, 361, 363, 367,
369, 372, 373, 374, 376, 380, 382, 387, 389,
390, 392, 393, 394, 395, 397$\}$ $R_2 = \{1, 2, 3, 5, 6, 12, 13, 15, 19, 20, 21, 22, 33, 36,$
38, 39, 40, 43, 44, 46, 47, 48, 51, 53, 57, 58,
59, 61, 70, 71, 73, 74, 79, 85, 86, 88, 89, 90,
92, 95, 99, 103, 104, 105, 111, 115, 128, 130,
133, 136, 139, 142, 145, 155, 156, 160, 168,
171, 176, 182, 183, 185, 186, 191, 193, 199,
204, 205, 207, 213, 217, 224, 226, 228, 230,
233, 234, 236, 238, 239, 240, 246, 247, 248,
249, 250, 251, 253, 254, 258, 262, 264, 268,
270, 271, 274, 277, 280, 286, 287, 293, 294,
296, 297, 299, 301, 302, 304, 306, 308, 309,
314, 315, 316, 317, 322, 325, 326, 327, 331,
333, 334, 335, 345, 348, 351, 358, 360, 362,
363, 371, 375, 376, 378, 379, 387, 389, 394,
396, 399$\}$ $R_3 = \{2, 3, 4, 7, 9, 14, 15, 18, 22, 29, 30, 32, 36, 40,$
50, 53, 54, 55, 60, 64, 68, 70, 71, 75, 77, 81,
85, 90, 91, 95, 96, 100, 101, 103, 104, 105,
107, 108, 109, 110, 111, 113, 116, 121, 123,
124, 131, 132, 133, 136, 137, 140, 144, 145,
149, 152, 155, 159, 162, 164, 166, 167, 168,
171, 174, 176, 180, 181, 182, 183, 184, 188,
189, 190, 197, 199, 203, 209, 213, 215, 223,
232, 234, 235, 240, 244, 247, 248, 253, 254,
255, 256, 257, 260, 265, 266, 274, 278, 280,
281, 286, 288, 291, 292, 294, 295, 297, 299,
301, 304, 306, 314, 321, 322, 325, 327, 334,
336, 338, 346, 348, 351, 352, 353, 355, 364,
366, 369, 370, 371, 373, 374, 376, 377, 382,
386, 387, 389, 396, 399$\}$ $R_4 = \{0, 1, 5, 16, 17, 18, 19, 21, 26, 28, 29, 31, 34,$
36, 37, 39, 40, 44, 50, 55, 56, 58, 67, 72, 73,
74, 76, 78, 80, 81, 84, 87, 89, 93, 96, 99, 107,
108, 110, 114, 117, 118, 119, 120, 123, 125,
128, 132, 138, 140, 143, 147, 152, 155, 164,
167, 171, 173, 174, 175, 180, 181, 182, 188,
191, 195, 199, 200, 204, 206, 207, 208, 211,
212, 213, 217, 218, 222, 223, 228, 230, 231,
241, 242, 249, 253, 254, 255, 256, 257, 259,
261, 262, 264, 265, 268, 269, 275, 277, 278,
280, 285, 286, 289, 293, 295, 297, 298, 300,
307, 311, 315, 316, 318, 320, 324, 326, 338,
339, 342, 346, 347, 348, 356, 357, 358, 359,
360, 361, 363, 364, 365, 368, 371, 375, 385,
388, 389, 393, 398$\}$ $R_5 = \{1, 6, 8, 12, 18, 19, 21, 24, 25, 31, 34, 35, 37,$
38, 40, 41, 43, 44, 45, 49, 53, 59, 61, 65, 72,
76, 83, 84, 86, 88, 101, 105, 108, 109, 113,
114, 115, 117, 119, 121, 122, 124, 129, 131,
132, 135, 136, 137, 139, 141, 142, 144, 148, 151, 154, 159, 166, 169, 175, 176, 183, 184, 186, 193, 194, 195, 196, 197, 205, 209, 210, 214, 217, 218, 219, 222, 223, 225, 227, 228, 229, 232, 235, 236, 241, 243, 245, 247, 248, 250, 262, 263, 266, 267, 272, 274, 275, 278, 281, 282, 287, 288, 291, 294, 298, 300, 303, 308, 309, 313, 317, 319, 325, 327, 329, 332, 333, 335, 336, 338, 350, 351, 353, 354, 355, 356, 359, 360, 362, 363, 366, 368, 373, 376, 378, 379, 383, 385, 388, 398}

$R_6$={4, 6, 7, 11, 13, 15, 16, 22, 27, 28, 31, 33, 34, 36, 38, 42, 43, 44, 54, 55, 57, 69, 70, 71, 73, 75, 76, 78, 80, 81, 84, 86, 87, 88, 93, 95, 101, 102, 103, 104, 107, 110, 111, 112, 114, 117, 119, 120, 122, 130, 131, 134, 135, 138, 139, 147, 149, 150, 153, 155, 165, 168, 170, 171, 173, 180, 185, 188, 193, 196, 198, 201, 203, 205, 207, 208, 211, 215, 216, 217, 220, 227, 229, 231, 233, 234, 237, 241, 242, 248, 258, 261, 262, 263, 264, 266, 268, 269, 273, 279, 283, 287, 288, 290, 292, 294, 295, 296, 300, 302, 308, 313, 317, 321, 325, 326, 332, 336, 341, 342, 343, 355, 356, 358, 365, 369, 370, 371, 377, 385, 387, 388, 390, 391, 392, 395, 396, 397, 398, 399}

$R_7$={0, 1, 3, 4, 10 15 17 18 20 22 25 27 31 33 36 38 41 45 48 52 55 59 62 63 64 66 69 74 77 80 82 84 87 99 103 107 108 110 118 121 122 125 129 131 132 137 138 139 142 145 146 147 148 151 153 154 157 165 168 173 175 179 183 184 185 186 187 189 194 196 203 204 205 206 209 215 219 222 224 225 226 229 231 232 234 237 238 242 243 245 247 248 250 251 253 255 256 259 262 263 267 268 269 270 271 276 281 285 286 289 290 292 293 297 306 308 309 314 317 318 320 322 324 328 336 339 340 341 346 347 348 360 367 368 372 375 378 382 390 396}

$R_8$={2, 3, 8, 11, 16, 24, 25, 26, 28, 31, 33, 34, 39, 44, 50, 51, 52, 54, 56, 57, 58, 60, 63, 64, 66, 67, 68, 69, 70, 72, 80, 83, 90, 95, 97, 98, 99, 100, 101, 103, 105, 108, 109, 118, 119, 126, 127, 130, 133, 138, 140, 145, 147, 149, 151, 152, 156, 158, 161, 162, 163, 165, 166, 169, 170, 177, 178, 179, 181, 186, 190, 193, 196, 201, 202, 203, 205, 207, 209, 211, 214, 227, 231, 233, 239, 241, 242, 243, 244, 245, 247, 251, 254, 257, 268, 276, 277, 282, 284, 285, 288, 292, 295, 304, 305, 307, 308, 310, 312, 314, 317, 318, 323, 324, 328, 329, 330, 335, 340, 344, 345, 346, 347, 350, 352, 354, 355, 357, 361, 365, 367, 370, 372, 376, 377, 380, 382, 386, 389, 392, 394}

$R_9$={1, 3, 4, 5, 9, 10, 20, 21, 25, 26, 32, 33, 37, 46, 53, 54, 58, 62, 68, 70, 72, 73, 74, 80, 81, 82, 84, 86, 89, 91, 92, 96, 97, 99, 102, 111, 115, 116, 118, 123, 132, 138, 139, 141, 143, 146, 149, 152, 154, 157, 158, 159, 162, 167, 170, 171, 172, 174, 175, 177, 178, 181, 184, 190, 195, 196, 198, 199, 200, 201, 202, 204, 207, 208, 216, 220, 226, 229, 230, 233, 235, 237, 246, 247, 248, 252, 255, 257, 258, 263, 264, 265, 267, 269, 270, 271, 272, 275, 279, 286, 293, 296, 298, 302, 307, 311, 313, 316, 319, 320, 330, 331, 332, 333, 335, 339, 340, 344, 345, 346, 350, 351, 362, 363, 366, 367, 368, 369, 373, 375, 377, 378, 380, 384, 387, 390, 392, 394, 395, 397}

$R_{10}$={0, 3, 4, 6, 8, 9, 10, 11, 13, 16, 17, 18, 30, 31, 34, 38, 42, 43, 45, 49, 50, 51, 52, 53, 58, 60, 61, 62, 67, 69, 74, 79, 87, 88, 91, 92, 93, 97, 98, 101, 104, 108, 111, 112, 115, 116, 122, 124, 126, 129, 130, 133, 135, 143, 144, 145, 150, 151, 156, 157, 158, 159, 161, 165, 170, 171, 173, 174, 182, 184, 191, 192, 198, 204, 206, 209, 216, 219, 220, 222, 226, 228, 232, 237, 240, 244, 245, 252, 253, 255, 257, 258, 259, 262, 267, 273, 278, 279, 290, 292, 296, 299, 301, 303, 310, 315, 319, 320, 323, 324, 326, 330, 331, 332, 333, 336, 337, 339, 340, 343, 344, 349, 352, 358, 366, 367, 372, 376, 377, 378, 379, 381, 383, 388, 389, 391, 393, 394, 397, 399}

$R_{11}$={4, 6, 10, 13, 15, 16, 18, 20, 23, 30, 32, 37, 39, 42, 45, 48, 49, 51, 52, 57, 59, 61, 66, 73, 75, 78, 82, 83, 87, 90, 92, 93, 95, 96, 97, 98, 106, 108, 109, 113, 115, 116, 119, 126, 130, 131, 135, 138, 142, 144, 146, 147, 148, 149, 150, 151, 153, 154, 159, 164, 166, 167, 168, 169, 170, 178, 180, 181, 183, 186, 192, 193, 197, 198, 202, 203, 210, 212, 213, 215, 217, 218, 219, 220, 221, 225, 226, 227, 229, 230, 231, 233, 235, 238, 239, 244, 246, 249, 250, 256, 262, 265, 275, 276, 279, 280, 283, 286, 291, 296, 300, 303, 309, 311, 312, 317, 318, 319, 323, 327, 329, 336, 345, 348, 354, 358, 359, 360, 364, 367, 371, 373, 374, 375, 388, 390, 391, 394, 397, 398}

$R_{12}$={1, 7, 8, 11, 14, 16, 22, 23, 24, 27, 28, 30, 44, 45, 46, 48, 50, 59, 62, 63, 64, 65, 66, 70, 76, 80, 82, 83, 84, 85, 86, 94, 97, 98, 100, 101, 102, 109, 112, 113, 114, 117, 120, 121, 123, 124, 127, 128, 134, 140, 141, 142, 152, 160, 162, 163, 165, 167, 172, 176, 177, 178, 179, 180, 181, 185, 187, 189, 190, 192, 198, 202, 206, 208, 218, 219, 221, 224, 225, 227, 233, 239, 240, 241, 242, 243, 249, 250, 251, 252, 254, 256, 259, 260, 263, 265, 270, 272, 273, 277, 278, 284, 287, 290, 293, 301, 307, 311, 312, 313, 316, 321, 322, 323, 324, 325, 330, 331, 334, 335, 336, 337, 341, 344, 347, 349, 350, 353, 355, 358, 359, 360, 369, 380, 383, 384, 391, 392, 393, 397}

$R_{13}$={5, 7, 9, 11, 12, 13, 15, 23, 24, 25, 27, 31, 33, 35, 36, 41, 42, 43, 47, 48, 49, 51, 52, 53, 58, 65, 69, 71, 81, 85, 86, 88, 94, 96, 97, 102, 104, 106, 113, 114, 115, 120, 122, 123, 125, 127, 129, 130, 140, 142, 144, 146, 147, 148, 152, 154, 156, 157, 160, 162, 165, 166, 173, 175, 176, 179, 183, 190, 192, 193, 195, 199, 205, 206, 208, 209, 210, 212, 213, 214, 216, 218, 221, 222, 223, 224, 229, 230, 231, 236, 243, 246, 249, 261, 266, 271, 273, 276, 281, 282, 283, 284, 289, 290, 293, 298, 300, 304, 305, 307, 312, 314, 315, 316, 318, 319, 320, 325, 329, 334, 338, 342, 347, 350, 351, 352, 353, 354, 361, 364, 365, 368, 371, 372, 380, 382, 384, 385, 386, 399}

$R_{14}$={0, 6, 12, 19, 20, 25, 26, 29, 30, 32, 34, 40, 41, 47, 49, 51, 52, 54, 55, 58, 60, 63, 64, 66, 69, 72, 75, 77, 78, 79, 81, 82, 87, 90, 91, 92, 94, 95, 100, 105, 106, 109, 110, 112, 115, 118, 120, 124, 125, 126, 132, 133, 135, 140, 141, 143, 145, 146, 153, 155, 161, 163, 167, 172, 175, 178, 183, 184, 186, 187, 194, 197, 201, 206, 208, 211, 216, 219, 223, 225, 235, 237, 238, 240, 246, 252, 259, 264, 273, 274, 275, 276, 277, 280, 282, 287, 289, 293, 294, 298, 300, 301, 310, 313, 315, 316, 318, 319, 320, 321, 322, 327, 328, 330, 331, 334, 337, 339, 340, 359, 362, 365, 368, 370, 371, 372, 374, 379, 381, 382, 384, 386, 387, 388, 391, 393, 395, 396, 398, 399}

$R_{15}$={2, 4, 8, 11, 13, 16, 21, 26, 27, 28, 29, 32, 36, 38, 39, 42, 51, 54, 56, 59, 61, 63, 65, 67, 68, 71, 72, 74, 79, 82, 84, 87, 88, 94, 102, 106, 112, 116, 118, 121, 124, 126, 127, 131, 132, 134, 135, 136, 139, 140, 142, 149, 150, 156, 157, 158, 159, 162, 163, 165, 166, 172, 173, 174, 179, 181, 184, 185, 189, 191, 194, 195, 197, 201, 203, 208, 209, 212, 214, 215, 218, 219, 221, 227, 230, 232, 234, 243, 244, 252, 253, 260, 261, 265, 271, 272, 273, 281, 282, 283, 285, 288, 289, 291, 294, 303, 306, 310, 317, 318, 319, 323, 329, 330, 333, 337, 338, $R_{16}$={7, 11, 17, 19, 22, 27, 29, 30, 35, 42, 47, 54, 55, 56, 63, 64, 66, 67, 71, 72, 73, 75, 76, 77, 79, 80, 85, 89, 90, 93, 94, 96, 98, 100, 106, 113, 116, 118, 122, 126, 128, 133, 136, 137, 141, 144, 147, 148, 150, 151, 153, 155, 157, 162, 163, 164, 167, 169, 176, 182, 185, 187, 189, 190, 191, 197, 203, 210, 211, 212, 216, 218, 220, 224, 225, 228, 232, 235, 236, 237, 238, 244, 245, 252, 256, 258, 260, 261, 265, 266, 269, 270, 275, 276, 277, 279, 280, 284, 285, 288, 290, 295, 297, 298, 299, 300, 301, 302, 303, 304, 305, 308, 311, 313, 315, 321, 325, 326, 328, 331, 332, 334, 335, 337, 341, 344, 355, 356, 357, 358, 362, 366, 373, 374, 381, 385, 386, 395, 397, 398}

$R_{17}$={0, 2, 7, 12, 14, 19, 21, 22, 23, 24, 27, 28, 32, 35, 37, 39, 40, 41, 43, 44, 46, 47, 53, 57, 62, 64, 65, 68, 77, 79, 83, 85, 86, 91, 92, 94, 95, 103, 104, 105, 106, 107, 109, 112, 113, 119, 120, 126, 135, 143, 144, 145, 146, 153, 154, 160, 164, 168, 169, 172, 177, 178, 179, 188, 190, 192, 194, 195, 196, 200, 201, 213, 215, 229, 230, 231, 235, 242, 243, 244, 246, 247, 249, 252, 253, 254, 258, 264, 266, 269, 271, 272, 274, 281, 283, 284, 287, 289, 298, 299, 304, 305, 306, 307, 309, 320, 321, 322, 327, 328, 329, 331, 333, 343, 345, 346, 351, 352, 353, 354, 357, 359, 362, 363, 364, 365, 368, 369, 374, 378, 381, 382, 383, 384, 385, 386, 390, 393, 396, 399}

$R_{18}$={0, 9, 10, 14, 17, 23, 24, 26, 28, 29, 35, 39, 41, 43, 47, 48, 49, 50, 60, 61, 62, 65, 66, 67, 68, 69, 70, 74, 75, 76, 79, 89, 91, 93, 98, 100, 103, 106, 114, 122, 123, 124, 125, 128, 129, 130, 134, 136, 137, 143, 146, 148, 150, 154, 160, 161, 164, 170, 173, 174, 177, 182, 187, 188, 191, 192, 200, 202, 210, 211, 215, 216, 220, 221, 222, 223, 225, 234, 238, 239, 254, 255, 257, 260, 261, 267, 268, 272, 274, 277, 278, 279, 281, 283, 285, 287, 290, 294, 296, 297, 303, 304, 305, 307, 310, 313, 314, 323, 326, 328, 329, 332, 337, 341, 342, 343, 344, 348, 349, 352, 353, 354, 356, 357, 360, 361, 363, 366, 370, 375, 378, 380, 381, 385, 386, 387, 392, 393, 396, 398}

$R_{19}$={0, 5, 8, 9, 10, 14, 17, 18, 20, 21, 23, 25, 32, 35, 37, 40, 41, 42, 46, 49, 50, 52, 55, 56, 57, 59, 60, 61, 62, 68, 76, 78, 83, 89, 91, 96, 98, 101, 102, 105, 110, 114, 117, 119, 121, 123, 127, 129, 134, 137, 139, 141, 148, 149, 151, 153, 156, 158, 160, 161, 166, 169, 172, 179, 187, 188, 189, 194, 197, 198, 200, 201, 205, 206, 210, 211, 212, 214, 220, 221, 222, 234, 236, 237, 238, 239, 240, 242, 245, 248, 250, 251, 258, 259, 260, 261, 263, 269, 270, 274, 279, 282, 283, 284, 291, 295, 296, 299, 301, 302, 303, 305, 306, 310, 312, 314, 324, 332, 333, 339, 340, 341, 345, 348, 349, 352, 354, 355, 357, 361, 364, 370, 372, 379, 380, 381, 383, 392, 394, 395} (28)

In Table 2, when the maximum information word symbol number is 6400 and the number of columns included in the base matrix as shown in Equation (28) is 400, a required minimum parity symbol number is 320. Accordingly, a parent parity check matrix Q includes 400×16 columns and 20×16 rows.

A parent parity check matrix Q, which is expressed using Equation (8), is shown in Equation (29).

$T_0$={(1,8), (2,8), (3,10), (5,12), (6,8), (7,12), (9,8), (12,4), (14,12), (15,0), (19,0), (20,9), (26,4), (34,8), (35,1), (38,0), (45,13), (46,0), (48,13), (56,9), (57,3), (62,1), (63,8), (71,12), (75,8), (77,3), (78,2), (82,13), (83,13), (85,9), (88,1), (90,15), (92,4), (93,12), (97,0), (99,15), (104,5), (107,14), (110,13), (111,15), (116,9), (117,7), (120,9), (121,8), (125,15), (127,14), (128,15), (129,9), (131,5), (134,12), (150,12), (152,13), (156,1), (158,9), (159,13), (161,7), (163,5), (164,4), (165,13), (168,11), (171,9), (172,12), (175,12), (177,13), (180,5), (185,9), (193,1), (194,8), (195,9), (199,3), (200,9), (202,9), (204,3), (207,13), (212,13), (213,1), (214,13), (217,3), (223,13), (224,14), (226,10), (227,5), (228,7), (232,5), (236,14), (240,7), (241,7), (245,9), (250,12), (251,5), (255,5), (260,5), (267,4), (268,4), (272,4), (273,4), (275,9), (276,6), (278,5), (284,8), (288,1), (289,6), (291,2), (292,4), (297,12), (299,4), (302,4), (309,5), (310,4), (311,3), (312,5), (326,0), (330,10), (334,9), (335,4), (337,1), (338,6), (340,14), (342,10), (343,1), (347,4), (349,9), (350,1), (351,4), (357,14), (361,8), (364,0), (365,12), (367,6), (369,2), (373,4), (375,12), (376,12), (377,0), (379,0), (383,0), (384,1), (388,4), (389,0), (391,3)}

$T_1$={(2,4), (5,0), (8,9), (10,8), (12,8), (13,4), (14,8), (17,1), (23,12), (24,13), (29,9), (30,12), (33,9), (37,4), (45,0), (46,12), (47,8), (56,4), (60,0), (65,13), (73,13), (77,13), (78,12), (81,13), (89, 12), (94,5), (99,5), (100,9), (102,9), (107,4), (111,5), (112,13), (117,4), (125,0), (127,12), (128,5), (133,12), (134,1), (136,1), (137,0), (138,12), (141,12), (143,4), (155,0), (157,12), (158,9), (160,0), (161,0), (163,8), (169,9), (170,12), (174,8), (176,4), (177,4), (178,8), (180,8), (182,8), (186,12), (187,8), (188,8), (189,8), (191,8), (192,1), (196,0), (198,8), (199,8), (200,0), (202,1), (204,4), (207,8), (210,1), (214,4), (217,2), (221,9), (224,0), (226,12), (228,9), (233,1), (236,8), (239,0), (241,0), (246,1), (249,1), (251,5), (256,8), (257,9), (259,9), (263,0), (264,1), (266,0), (267,1), (270,5), (271,9), (280,8), (282,0), (285,12), (286,1), (291,0), (292,8), (295,5), (302,12), (305,12), (306,9), (308,5), (309,4), (311,1), (312,13), (315,13), (316,1), (321,12), (322,5), (323,1), (324,5), (327,13), (328,5), (338,1), (342,12), (343,5), (346,13), (347,5), (349,0), (356,13), (361,1), (363,5), (367,5), (369,5), (372,5), (373,13), (374,4), (376,1), (380,4), (382,1), (387,5), (389,13), (390,5), (392,5), (393,1), (394,8), (395,9), (397,5)}

$T_2$={(1,2), (2,14), (3,3), (5,3), (6,10), (12,11), (13,3), (15,0), (19,13), (20,13), (21,6), (22,11), (33,10), (36,13), (38,6), (39,5), (40,12), (43,0), (44,3), (46,15), (47,3), (48,13), (51,7), (53,14), (57,15), (58,8), (59,6), (61,11), (70,7), (71,10), (73,10), (74,14), (79,1), (85,7), (86,14), (88,5), (89,5), (90,2), (92,10), (95,6), (99,14), (103,4), (104,6), (105,6), (111,10), (115,8), (128,3), (130,12), (133,4), (136,2), (139,6), (142,11), (145,14), (155,0), (156,14), (160,7), (168,5), (171,10), (176,12), (182,12), (183,8), (185,12), (186,9), (191,6), (193,15), (199,10), (204,0), (205,8), (207,5), (213,1), (217,4), (224,0), (226,0), (228,0), (230,4), (233,0), (234,12), (236,1), (238,8), (239,1), (240,3), (246,13), (247,12), (248,1), (249,8), (250,4), (251,1), (253,9), (254,0), (258,5), (262,3), (264,7), (268,6), (270,4), (271,1), (274,8), (277,5), (280,2), (286,11), (287,1), (293,3), (294,12), (296,7), (297,5), (299,7), (301,7), (302,11), (304,11), (306,3), (308,11), (309,15), (314,15), (315,8), (316,14), (317,10), (322,10), (325,11), (326,8), (327,15), (331,11), (333,1), (334,5), (335,9), (345,0), (348,13), (351,9), (358,9), (360,1), (362,15), (363,3), (371,3), (375,9), (376,7), (378,2), (379,1), (387,1), (389,11), (394,13), (396,15), (399,13)}

$T_3$={(2,4), (3,15), (4,7), (7,13), (9,8), (14,6), (15,5), (18,3), (22,4), (29,12), (30,7), (32,4), (36,14), (40,5), (50,5), (53,1), (54,11), (55,8), (60,8), (64,15), (68,12), (70,5), (71,9), (75,14), (77,2), (81,5), (85,10), (90,8), (91,11), (95,9), (96,11), (100,8), (101,5), (103,0), (104,4), (105,15), (107,13), (108,13), (109,13), (110,5), (111,9), (113,9), (116,0), (121,12), (123,12), (124,13), (131,9), (132,11), (133,1), (136,12), (137,11), (140,9), (144,12), (145,9), (149,0), (152,6), (155,7), (159,5), (162,0), (164,12), (166,6), (167,1), (168,9), (171,12), (174,5), (176,0), (180,5), (181,6), (182,0), (183,10), (184,11), (188,1), (189,1), (190,9), (197,6), (199,15), (203,6), (209,11), (213,15), (215,6), (223,3), (232,0), (234,6), (235,2), (240,10), (244,2), (247,6), (248,0), (253,6), (254,2), (255,2), (256,0), (257,10), (260,7), (265,2), (266,4), (274,0), (278,10), (280,4), (281,2), (286,2), (288,10), (291,2), (292,10), (294,1), (295,4), (297,0), (299,15), (301,2), (304,2), (306,3), (314,7), (321,1), (322,11), (325,10), (327,0), (334,11), (336,6), (338,8), (346,3), (348,3), (351,9), (352,8), (353,1), (355,11), (364,10), (366,10), (369,15), (370,14), (371,15), (373,13), (374,6), (376,15), (377,14), (382,5), (386,3), (387,2), (389,7), (396,8), (399,10)}

$T_4$={(0,0), (1,5), (5,9), (16,9), (17,1), (18,0), (19,0), (21,1), (26,0), (28,9), (29,8), (31,1), (34,7), (36,1), (37,5), (39,0), (40,15), (44,13), (50,9), (55,0), (56,0), (58,7), (67,15), (72,11), (73,1), (74,11), (76,5), (78,3), (80,3), (81,2), (84,0), (87,8), (89,5), (93,7), (96,2), (99,7), (107,14), (108,2), (110,0), (114,3), (117,1), (118,10), (119,10), (120,15), (123,11), (125,11), (128,10), (132,0), (138,10), (140,3), (143,2), (147,2), (152,14), (155,13), (164,13), (167,6), (171,2), (173,11), (174,8), (175,10), (180,7), (181,4), (182,14), (188,10), (191,2), (195,10), (199,9), (200,3), (204,14), (206,15), (207,4), (208,12), (211,6), (212,7), (213,7), (217,0), (218,15), (222,4), (223,2), (228,12), (230,9), (231,12), (241,6), (242,14), (249,15), (253,6), (254,1), (255,8), (256,1), (257,6), (259,11), (261,7), (262,12), (264,7), (265,15), (268,8), (269,12), (275,15), (277,11), (278,15), (280,11), (285,3), (286,13), (289,11), (293,13), (295,0), (297,3), (298,4), (300,12), (307,11), (311,1), (315,1), (316,6), (318,5), (320,4), (324,5), (326,9), (338,8), (339,13), (342,13), (346,5), (347,13), (348,7), (356,4), (357,2), (358,13), (359,2), (360,5), (361,0), (363,1), (364,8), (365,0), (368,13), (371,3), (375,8), (385,1), (388,3), (389,0), (393,5), (398,11)}

$T_5$={(1,14), (6,9), (8,11), (12,3), (18,10), (19,14), (21,9), (24,15), (25,10), (31,14), (34,11), (35,10), (37,8), (38,6), (40,7), (41,9), (43,3), (44,4), (45,14), (49,7), (53,7), (59,5), (61,13), (65,0), (72,11), (76,10), (83,15), (84,5), (86,11), (88,12), (101,5), (105,14), (108,5), (109,6), (113,6), (114,14), (115,13), (117,3), (119,0), (121,8), (122,7), (124,4), (129,1), (131,14), (132,1), (135,9), (136,8), (137,10), (139,3), (141,8), (142,15), (144,0), (148,12), (151,7), (154,11), (159,12), (166,1), (169,15), (175,3), (176,0), (183,13), (184,1), (186,3), (193,13), (194,3), (195,4), (196,3), (197,4), (205,4), (209,15), (210,0), (214,5), (217,10), (218,14), (219,4), (222,3), (223,0), (225,5), (227,9), (228,9), (229,9), (232,5), (235,5), (236,3), (241,1), (243,8), (245,0), (247,4), (248,5), (250,0), (262,8), (263,8), (266,5), (267,1), (272,1), (274,10), (275,1), (278,15), (281,0), (282,8), (287,15), (288,14), (291,14), (294,10), (298,1), (300,11), (303,10), (308,2), (309,10), (313,8), (317,0), (319,0), (325,2), (327,1), (329,2), (332,4), (333,2), (335,2), (336,0), (338,11), (350,10), (351,4), (353,3), (354,5), (355,5), (356,10), (359,6), (360,1), (362,15), (363,2), (366,2), (368,14), (373,6), (376,10), (378,12), (379,6), (383,1), (385,7), (388,14), (398,15)}

$T_6$={(4,8), (6,3), (7,10), (11,15), (13,11), (15,3), (16,11), (22,5), (27,3), (28,12), (31,12), (33,1), (34,13), (36,13), (38,13), (42,8), (43,12), (44,1), (54,14), (55,11), (57,12), (69,9), (70,1), (71,9), (73,14), (75,9), (76,8), (78,10), (80,8), (81,1), (84,9), (86,10), (87,13), (88,13), (93,0), (95,11), (101,0), (102,1), (103,1), (104,9), (107,1), (110,4), (111,1), (112,9), (114,9), (117,2), (119,1), (120,1), (122,8), (130,1), (131,1), (134,4), (135,10), (138,9), (139,15), (147,0), (149,3), (150,11), (153,2), (155,10), (165,13), (168,7), (170,11), (171,3), (173,8), (180,11), (185,3), (188,0), (193,10), (196,3), (198,1), (201,10), (203,11), (205,7), (207,14), (208,13), (211,4), (215,2), (216,7), (217,8), (220,3), (227,14), (229,5), (231,5), (233,14), (234,0), (237,6), (241,6), (242,6), (248,0), (258,6), (261,3), (262,14), (263,5), (264,2), (266,1), (268,12), (269,6), (273,14), (279,2), (283,14), (287,15), (288,0), (290,6), (292,2), (294,1), (295,10), (296,4), (300,4), (302,11), (308,12), (313,10), (317,6), (321,14), (325,1), (326,0), (332,10), (336,4), (341,10), (342,7), (343,7), (355,13), (356,1), (358,11), (365,7), (369,9), (370,3), (371,3), (377,2), (385,2), (387,4), (388,2), (390,7), (391,8), (392,5), (395,2), (396,1), (397,5), (398,7), (399,3)}

$T_7$={(0,15), (1,1), (3,6), (4,8), (10,9), (15,15), (17,10), (18,14), (20,9), (22,8), (25,14), (27,14), (31,4), (33,10), (36,3), (38,14), (41,10), (45,11), (48,0), (52,14), (55,10), (59,3), (62,12), (63,14), (64,3), (66,14), (69,0), (74,6), (77,5), (80,2), (82,4), (84,0), (87,6), (99,8), (103,2), (107,13), (108,10), (110,1), (118,12), (121,2), (122,7), (125,3), (129,6), (131,7), (132,7), (137,10), (138,6), (139,1), (142,15), (145,7), (146,3), (147,5), (148,11), (151,2), (153,9), (154,10), (157,0), (165,3), (168,0), (173,11), (175,15), (179,9), (183,8), (184,3), (185,1), (186,2), (187,2), (189,6), (194,9), (196,4), (203,11), (204,3), (205,11), (206,5), (209,1), (215,6), (219,1), (222,1), (224,0), (225,1), (226,1), (229,3), (231,7), (232,13), (234,0), (237,2), (238,2), (242,10), (243,11), (245,5), (247,1), (248,9), (250,2), (251,3), (253,0), (255,9), (256,4), (259,1), (262,9), (263,0), (267,3), (268,1), (269,0), (270,9), (271,8), (276,9), (281,9), (285,9), (286,10), (289,11), (290,8), (292,5), (293,10), (297,1), (306,0), (308,1), (309,1), (314,0), (317,3), (318,12), (320,13), (322,12), (324,12), (328,9), (336,12), (339,13), (340,7), (341,0), (346,15), (347,15), (348,11), (360,10), (367,0), (368,5), (372,11), (375,3), (378,6), (382,4), (390,6), (396,11)}

$T_8$={(2,8), (3,13), (8,11), (11,9), (16,14), (24,3), (25,1), (26,4), (28,12), (31,4), (33,5), (34,2), (39,4), (44,0), (50,3), (51,8), (52,14), (54,8), (56,7), (57,2), (58,8), (60,1), (63,12), (64,2), (66,3), (67,1), (68,12), (69,5), (70,7), (72,7), (80,9), (83,12), (90,9), (95,13), (97,3), (98,4), (99,12), (100,8), (101,2), (103,8), (105,2), (108,8), (109,5), (118,4), (119,5), (126,11), (127,5), (130,2), (133,0), (138,9), (140,4), (145,0), (147,1), (149,6), (151,6), (152,14), (156,1), (158,14), (161,4), (162,2), (163,1), (166,1), (169,1), (170,10), (177,2), (178,8), (179,0), (181,2), (186,4), (190,0), (193,3), (196,14), (201,2), (202,1), (203,0), (205,0), (207,11), (209,2), (211,2), (214,3), (227,3), (231,9), (233,9), (239,10), (241,2), (242,6), (243,8), (244,14), (245,13), (247,9), (251,0), (254,8), (257,0), (268,7), (276,10), (277,8), (282,10), (284,0), (285,2), (288,7), (292,4), (295,0), (304,12), (305,14), (307,13), (308,10), (310,7), (312,6), (314,12), (317,14), (318,13), (323,11), (324,11), (328,6), (329,10), (330,11), (335,11), (340,13), (344,14), (345,5), (346,7), (347,6), (350,13), (352,7), (354,3), (355,4), (357,3), (361,14), (365,5), (367,3), (370,12), (372,9), (376,4), (377,7), (380,12), (382,6), (386,2), (389,9), (392,0), (394,7)}

$T_9$={(1,2), (3,11), (4,1), (5,15), (9,7), (10,0), (20,2), (21,2), (25,8), (26,1), (32,6), (33,10), (37,4), (46,2), (53,7), (54,8), (58,3), (62,5), (68,0), (70,0), (72,0), (73,9), (74,3), (80,10), (81,2), (82,10), (84,13), (86,6), (89,0), (91,4), (92,5), (96,10), (97,5), (99,2), (102,13), (111,1), (115,5), (116,5), (118,4), (123,10), (132,6), (138,8), (139,2), (141,7), (143,7), (146,14), (49,2), (152,4), (154,4), (157,3), (158,1), (159,13), (162,0), (167,0), (170,6), (171,4), (172,4), (174,1), (175,1), (177,9), (178,14), (181,4), (184,12), (190,9), (195,8), (196,0), (198,12), (199,0), (200,0), (201,0), (202,12), (204,14), (207,3), (208,5), (216,15), (220,8), (226,0), (229,15), (230,12), (233,6), (235,8), (237,8), (246,15), (247,1), (248,7), (252,10), (255,12), (257,7), (258,3), (263,2), (264,14), (265,11), (267,2), (269,0), (270,8), (271,11), (272,8), (275,10), (279,6), (286,2), (293,0), (296,10), (298,14), (302,2), (307,7), (311,3), (313,15), (316,8), (319,14), (320,2), (330,10), (331,13), (332,8), (333,2), (335,6), (339,9), (340,2), (344,6), (345,10), (346,6), (350,10), (351,10), (362,14), (363,4), (366,14), (367,4), (368,1), (369,2), (373,0), (375,1), (377,3), (378,11), (380,0), (384,11), (387,4), (390,10), (392,3), (394,1), (395,0), (397,11)}

$T_{10}$={(0,10), (3,2), (4,6), (6,11), (8,0), (9,10), (10,0), (11,4), (13,12), (16,14), (17,0), (18,2), (30,10), (31,6), (34,8), (38,2), (42,7), (43,0), (45,2), (49,0), (50,8), (51,12), (52,6), (53,6), (58,10), (60,2), (61,8), (62,6), (67,0), (69,8), (74,2), (79,2), (87,4), (88,0), (91,6), (92,8), (93,2), (97,0), (98,10), (101,14), (104,2), (108,10), (111,10), (112,2), (115,2), (116,10), (22,2), (124,14), (126,8), (129,8), (130,0), (133,10), (135,2), (143,0), (144,8), (145,8), (150,8), (151,10), (156,10), (157,0), (158,10), (159,10), (161,0), (165,8), (170,2), (171,8), (173,4), (174,2), (182,14), (184,2), (191,14), (192,14), (198,4), (204,0), (206,15), (209,2), (216,12), (219,6), (220,6), (222,2), (226,6), (228,2), (232,8), (237,2), (240,14), (244,12), (245,0), (252,14), (253,10), (255,8), (257,10), (258,14), (259,4), (262,8), (267,2), (273,14), (278,6), (279,8), (290,10), (292,2), (296,6), (299,10), (301,2), (303,14), (310,6), (315,0), (319,6), (320,6), (323,8), (324,2), (326,6), (330,4), (331,4), (332,0), (333,8), (336,8), (337,10), (339,0), (340,0), (343,4), (344,4), (349,0), (352,8), (358,8), (366,8), (367,14), (372,0), (376,4), (377,14), (378,12), (379,4), (381,10), (383,12), (388,0), (389,8), (391,8), (393,6), (394,0), (397,12), (399,4), (400,0)}

$T_{11}$={(4,2), (6,8), (10,10), (13,10), (15,10), (16,2), (18,10), (20,10), (23,6), (30,0), (32,10), (37,2), (39,14), (42,14), (45,0), (48,12), (49,2), (51,7), (52,6), (57,11), (59,11), (61,1), (66,0), (73,3), (75,14), (78,11), (82,3), (83,2), (87,13), (90,10), (92,11), (93,11), (95,1), (96,15), (97,3), (98,5), (106,7), (108,0), (109,3), (113,4), (115,7), (116,1), (119,1), (126,7), (130,14), (131,3), (135,5), (138,1), (142,7), (144,5), (146,9), (147,11), (148,11), (149,1), (150,3), (151,3), (153,3), (154,3), (159,1), (164,9), (166,11), (167,3), (168,3), (169,7), (170,9), (178,3), (180,1), (181,5), (183,1), (186,5), (192,3), (193,3), (197,3), (198,5), (202,13), (203,13), (210,9), (212,9), (213,3), (215,1), (217,1), (218,15), (219,5), (220,3), (221,1), (225,1), (226,3), (227,6), (229,12), (230,8), (231,2), (233,2), (235,10), (238,2), (239,1), (244,6), (246,5), (249,11), (250,9), (256,1), (262,7), (265,2), (275,2), (276,8), (279,14), (280,0), (283,8), (286,1), (291,0), (296,2), (300,2), (303,2), (309,0), (311,0), (312,0), (317,0), (318,12), (319,0), (323,0), (327,0), (329,0), (336,0), (345,8), (348,8), (354,8), (358,8), (359,12), (360,8), (364,0), (367,10), (371,4), (373,0), (374,0), (375,8), (388,1), (390,10), (391,10), (394,2), (397,0), (398,10)}

$T_{12}$={(1,3), (7,3), (8,1), (11,13), (14,2), (16,1), (22,11), (23,0), (24,15), (27,8), (28,9), (30,11), (44,9), (45,7), (46,3), (48,7), (50,3), (59,1), (62,3), (63,3), (64,3), (65,7), (66,7), (70,2), (76,1), (80,3), (82,5), (83,7), (84,9), (85,11), (86,5), (94,11), (97,5), (98,9), (100,15), (101,1), (102,3), (109,0), (112,9), (113,9), (114,7), (117,5), (120,1), (121,1), (123,1), (124,3), (27,11), (128,1), (134,3), (140,9), (141,9), (142,5), (152,1), (160,5), (162,3), (163,9), (165,1), (167,11), (172,5), (176,1), (177,0), (178,1), (179,6), (180,2), (181,1), (185,0), (187,7), (189,0), (190,2), (192,15), (198,6), (202,8), (206,2), (208,10), (218,0), (219,2), (221,4), (224,3), (225,0), (227,6), (233,6), (239,3), (240,2), (241,0), (242,0), (243,6), (249,4), (250,4), (251,8), (252,8), (254,8), (256,0), (259,1), (260,1), (263,4), (265,0), (270,1), (272,0), (273,4), (277,2), (278,2), (284,4), (287,2), (290,2), (293,6), (301,10), (307,10), (311,2), (312,6), (313,12), (316,10), (321,10), (322,12), (323,12), (324,0), (325,0), (330,8), (331,2), (334,10), (335,10), (336,8), (337,10), (341,14), (344,10), (347,10), (349,6), (350,4), (353,8), (355,0), (358,2), (359,12), (360,1), (369,2), (380,4), (383,14), (384,11), (391,3), (392,2), (393,13), (397,3)}

$T_{13}$={(5,3), (7,0), (9,1), (11,11), (12,3), (13,1), (15,1), (23,3), (24,3), (25,3), (27,1), (31,9), (33,9), (35,9), (36,9), (41,11), (42,3), (43,3), (47,1), (48,7), (49,11), (51,13), (52,1), (53,3), (58,5), (65,15), (69,13), (71,1), (81,3), (85,9), (86,9), (88,7), (94,11), (96,3), (97,2), (102,7), (104,15), (106,7), (113,10), (114,2), (115,3), (120,2), (122,1), (123,3), (125,5), (127,1), (129,1), (130,4), (140,3), (142,11), (144,1), (146,3), (147,5), (148,15), (152,3), (154,0), (156,2), (157,9), (160,10), (162,6), (165,12), (166,14), (173,8), (175,8), (176,2), (179,11), (183,6), (190,9), (192,10), (193,4), (195,7), (199,0), (205,2), (206,1), (208,6), (209,0), (210,10), (212,2), (213,8), (214,0), (216,10), (218,1), (221,10), (222,0), (223,8), (224,10), (229,10), (230,0), (231,2), (236,2), (243,9), (246,0), (249,13), (261,10), (266,4), (271,0), (273,6), (276,10), (281,6), (282,0), (283,0), (284,8), (289,12), (290,0), (293,2), (298,10), (300,0), (304,8), (305,8), (307,4), (312,0), (314,4), (315,0), (316,2), (318,10), (319,12), (320,8), (325,12), (329,0), (334,1), (338,3), (342,4), (347,9), (350,1), (351,2), (352,2), (353,0), (354,11), (361,9), (364,13), (365,11), (368,9), (371,3), (372,0), (380,3), (382,4), (384,0), (385,1), (386,1), (399,4)}

$T_{14}$={(0,8), (6,0), (12,0), (19,2), (20,0), (25,8), (26,10), (29,0), (30,2), (32,0), (34,0), (40,8), (41,0), (47,0), (49,0), (51,2), (52,2), (54,8), (55,0), (58,2), (60,0), (63,0), (64,0), (66,3), (69,1), (72,8), (75,9), (77,0), (78,0), (79,5), (81,9), (82,12), (87,4), (90,1), (91,15), (92,11), (94,1), (95,0), (100,11), (105,10), (106,10), (109,11), (110,2), (112,15), (115,1), (118,9), (120,3), (124,13), (125,0), (126,15), (132,3), (133,11), (135,3), (140,11), (143,9), (145,9), (146,11), (153,7), (155,1), (161,11), (163,7), (167,8), (172,1), (175,15), (178,1), (183,0), (184,8), (186,1), (187,11), (194,3), (197,11), (201,3), (206,3), (208,13), (211,3), (216,3), (219,1), (223,3), (225,11), (235,9), (237,9), (238,3), (240,3), (246,11), (252,9), (259,1), (264,3), (273,2), (274,9), (275,9), (276,5), (277,11), (280,9), (282,9), (287,1), (289,7), (293,9), (294,0), (298,2), (300,3), (301,1), (310,1), (313,0), (315,10), (316,12), (318,0), (319,12), (320,8), (321,10), (322,1), (327,1), (328,2), (330,0), (331,0), (334,2), (337,4), (339,0), (340,2), (359,1), (362,8), (365,5), (368,8), (370,10), (371,1), (372,2), (374,2), (379,1), (381,8), (382,8), (384,4), (386,4), (387,0), (388,4), (391,3), (393,0), (395,2), (396,2), (398,10), (399,0)}

$T_{15}$={(2,2), (4,10), (8,8), (11,0), (13,0), (16,0), (21,8), (26,2), (27,10), (28,2), (29,0), (32,3), (36,0), (38,2), (39,11), (42,1), (51,2), (54,10), (56,0), (59,0), (61,0), (63,1), (65,3), (67,11), (68,0), (71,3), (72,3), (74,10), (79,1), (82,0), (84,8), (87,1), (88,3), (94,8), (102,1), (106,9), (112,11), (116,8), (118,0), (121,11), (124,3), (126,9), (127,1), (131,9), (132,0), (134,1), (135,1), (136,1), (139,1), (140,1), (142,1), (149,1), (150,1), (156,1), (157,1), (158,3), (159,1), (162,11), (163,1), (165,9), (166,2), (172,0), (173,1), (174,3), (179,1), (181,1), (184,1), (185,1), (189,1), (191,3), (194,9), (195,9), (197,0), (201,1), (203,3), (208,1), (209,8), (212,8), (214,3), (215,11), (218,11), (219,8), (221,1), (227,11), (230,3), (232,3), (234,3), (243,9), (244,11), (252,2), (253,1), (260,0), (261,11), (265,9), (271,11), (272,1), (273,1), (281,10), (282,2), (283,9), (285,8), (288,10), (289,8), (291,11), (294,2), (303,3), (306,10), (310,2), (317,2), (318,11), (319,9), (323,3), (329,1), (330,1), (333,2), (337,8), (338,2), (339,2), (341,10), (342,0), (343,2), (344,0), (345,0), (349,10), (350,0), (353,8), (356,0), (359,0), (362,3), (366,8), (370,0), (374,10), (377,0), (379,10), (381,8), (383,8), (384,0), (390,2), (391,8), (395,0)}

$T_{16}$={(7,4), (11,5), (17,3), (19,6), (22,5), (27,6), (29,6), (30,7), (35,14), (42,6), (47,14), (54,4), (55,4), (56,2), (63,1), (64,6), (66,0), (67,2), (71,13), (72,0), (73,0), (75,12), (76,10), (77,4), (79,0), (80,0), (85,7), (89,6), (90,4), (93,6), (94,3), (96,5), (98,4), (100,0), (106,2), (113,14), (116,4), (118,2), (122,2), (126,12), (128,6), (133,6), (136,10), (137,14), (141,2), (144,14), (147,4), (148,2), (150,0), (151,0), (153,14), (155,2), (157,2), (162,2), (163,7), (164,2), (167,1), (169,3), (176,1), (182,12), (185,4), (187,3), (189,0), (190,1), (191,11), (197,1), (203,5), (210,12), (211,0), (212,0), (216,0), (218,3), (220,11), (224,4), (225,7), (228,10), (232,3), (235,8), (236,0), (237,1), (238,9), (244,7), (245,1), (252,0), (256,1), (258,3), (260,7), (261,1), (265,7), (266,1), (269,5), (270,1), (275,3), (276,2), (277,5), (279,0), (280,7), (284,7), (285,9), (288,1), (290,1), (295,7), (297,9), (298,1), (299,3), (300,3), (301,0), (302,1), (303,1), (304,3), (305,1), (308,1), (311,0), (313,1), (315,1), (321,5), (325,2), (326,5), (328,5), (331,10), (332,13), (334,1), (335,7), (337,5), (341,5), (344,4), (355,4), (356,5), (357,5), (358,4), (362,6), (366,5), (373,4), (374,4), (381,1), (385,1), (386,13), (395,4), (397,5), (398,6)}

$T_{17}$={(0,1), (2,5), (7,2), (12,1), (14,5), (19,1), (21,5), (22,5), (23,7), (24,3), (27,2), (28,9), (32,1), (35,13), (37,1), (39,1), (40,1), (41,0), (43,1), (44,10), (46,1), (47,0), (53,5), (57,1), (62,11), (64,5), (65,5), (68,5), (77,7), (79,1), (83,2), (85,1), (86,4), (91,1), (92,3), (94,4), (95,4), (103,3), (104,0), (105,4), (106,8), (107,5), (109,7), (112,7), (113,2), (119,5), (120,7), (126,1), (135,1), (143,2), (144,4), (145,12), (146,13), (153,5), (154,5), (160,4), (164,6), (168,0), (169,2), (172,0), (177,13), (178,4), (179,7), (188,0), (190,4), (192,8), (194,8), (195,4), (196,0), (200,0), (201,5), (213,11), (215,4), (229,1), (230,4), (231,0), (235,0), (242,4), (243,0), (244,4), (246,6), (247,4), (249,4), (252,4), (253,4), (254,4), (258,0), (264,0), (266,4), (269,7), (271,0), (272,0), (274,4), (281,2), (283,0), (284,0), (287,6), (289,2), (298,7), (299,10), (304,1), (305,3), (306,4), (307,7), (309,6), (320,14), (321,1), (322,7), (327,7), (328,6), (329,2), (331,10), (333,6), (343,0), (345,3), (346,0), (351,1), (352,11), (353,5), (354,2), (357,2), (359,1), (362,0), (363,3), (364,7), (365,6), (368,5), (369,5), (374,0), (378,5), (381,2), (382,7), (383,3), (384,12), (385,6), (386,0), (390,3), (393,3), (396,1), (399,1)}

$T_{18}$={(0,2), (9,3), (10,6), (14,2), (17,6), (23,7), (24,7), (26,2), (28,5), (29,12), (35,5), (39,4), (41,5), (43,3), (47,7), (48,3), (49,4), (50,0), (60,2), (61,2), (62,4), (65,0), (66,5), (67,14), (68,2), (69,4), (70,4), (74,4), (75,6), (76,2), (79,2), (89,6), (91,4), (93,6), (98,7), (100,4), (103,4), (106,1), (114,0), (122,4), (123,6), (124,14), (125,14), (128,0), (129,4), (130,4), (134,6), (136,4), (137,4), (143,5), (146,5), (148,4), (150,5), (154,0), (160,4), (161,4), (164,0), (170,4), (173,0), (174,1), (177,4), (182,5), (187,1), (188,6), (191,0), (192,1), (200,7), (202,0), (210,3), (211,9), (215,1), (216,1), (220,0), (221,1), (222,5), (223,3), (225,0), (234,5), (238,0), (239,5), (254,0), (255,5), (257,1), (260,13), (261,7), (267,7), (268,1), (272,5), (274,3), (277,3), (278,5), (279,1), (281,1), (283,6), (285,3), (287,0), (290,1), (294,1), (296,1), (297,1), (303,1), (304,0), (305,5), (307,5), (310,0), (313,2), (314,1), (323,3), (326,1), (328,2), (329,0), (332,1), (337,0), (341,0), (342,3), (343,3), (344,1), (348,1), (349,1), (352,1), (353,2), (354,1), (356,9), (357,0), (360,1), (361,13), (363,1), (366,0), (370,5), (375,0), (378,5), (380,1), (381,4), (385,0), (386,5), (387,4), (392,6), (393,7), (396,5), (398,5)}

$T_{19}$={(0,4), (5,12), (8,4), (9,8), (10,12), (14,8), (17,0), (18,10), (20,4), (21,9), (23,13), (25,5), (32,9), (35,12), (37,0), (40,12), (41,8), (42,0), (46,1), (49,1), (50,13), (52,12), (55,9), (56,0), (57,6), (59,14), (60,4), (61,10), (67,0), (68,0), (76,4), (78,6), (83,0), (89,6), (91,8), (96,0), (98,0), (101,8), (102,6), (105,1), (110,2), (114,5), (117,15), (119,1), (121,10), (123,5), (127,15), (129,0), (134,7), (137,9), (139,10), (141,1), (148,13), (149,4), (151,9), (153,4), (156,10), (158,11), (160,1), (161,11), (166,1), (169,12), (172,2), (179,11), (187,6), (188,9), (189,2), (194,5), (197,0), (198,1), (200,7), (201,13), (205,2), (206,13), (210,9), (211,1), (212,3), (214,11), (220,1), (221,2), (222,1), (234,1), (236,7), (237,8), (238,1), (239,3), (240,1), (242,7), (245,13), (248,13), (250,5), (251,7), (258,5), (259,3), (260,7), (261,14), (263,13), (269,5), (270,9), (274,0), (279,5), (282,6), (283,4), (284,0), (291,5), (295,3), (296,11), (299,5), (301,6), (302,2), (303,5), (305,4), (306,5), (310,9), (312,4), (314,13), (324,5), (332,12), (333,6), (339,7), (340,13), (341,14), (345,13), (348,12), (349,0), (352,12), (354,0), (355,1), (357,8), (361,0), (364,13), (370,13), (372,14), (379,12), (380,4), (381,11), (383,5), (392,10), (394,10), (395,8)}  (29)

As described in Table 1, the MMT system may support the number of information word symbols 3200, 1600, 800, and 400 by performing a scaling factor $S1=2, 4, 8$, and 16 on the parent parity check matrix as shown in Equation (29).

If each row included in the parent parity check matrix as shown in Equation (29) is separated into 2, 3, and 4 rows, respectively, the design requirement criterion described in Table 2 may be satisfied.

Matrixes that are generated by applying the row separation rule ($n=2, 3$, and 4) described with reference to Table 1 to the parent parity check matrix as shown in Equation (29) are as shown in Equation (30) to Equation (32).

Therefore, code rates that the matrixes expressed as Equation (30) to Equation (32), i.e., the separated parent parity check matrixes, support are 20/22, 20/23, and 20/24, respectively.

$T'_0$={(2,8), (5,12), (7,12), (12,4), (15,0), (20,9), (34,8), (38,0), (46,0), (56,9), (62,1), (71,12), (77,3), (82,13), (85,9), (90,15), (93,12), (99,15), (107,14), (111,15), (117,7), (121,8), (127,14), (129,9), (134,12), (152,13), (158,9), (161,7), (164,4), (168,11), (172,12), (177,13), (185,9), (194,8), (199,3), (202,9), (207,13), (213,1), (217,3), (224,14), (227,5), (232,5), (240,7), (245,9), (251,5), (260,5), (268,4), (273,4), (276,6), (284,8), (289,6), (292,4), (299,4), (309,5), (311,3), (326,0), (334,9), (337,1), (340,14), (343,1), (349,9), (351,4), (361,8), (365,12), (369,2), (375,12), (377,0), (383,0), (388,4), (391,3)}

T′₁={(1,8), (3,10), (6,8), (9,8), (14,12), (19,0), (26,4), (35,1), (45,13), (48,13), (57,3), (63,8), (75,8), (78,2), (83,13), (88,1), (92,4), (97,0), (104,5), (110,13), (116,9), (120,9), (125,15), (128,15), (131,5), (150,12), (156,1), (159,13), (163,5), (165,13), (171,9), (175,12), (180,5), (193,1), (195,9), (200,9), (204,3), (212,13), (214,13), (223,13), (226,10), (228,7), (236,14), (241,7), (250,12), (255,5), (267,4), (272,4), (275,9), (278,5), (288,1), (291,2), (297,12), (302,4), (310,4), (312,5), (330,10), (335,4), (338,6), (342,10), (347,4), (350,1), (357,14), (364,0), (367,6), (373,4), (376,12), (379,0), (384,1), (389,0)}

T′₂={(5,0), (10,8), (13,4), (17,1), (24,13), (30,12), (37,4), (46,12), (56,4), (65,13), (77,13), (81,13), (94,5), (100,9), (107,4), (112,13), (125,0), (128,5), (134,1), (137,0), (141,12), (155,0), (158,9), (161,0), (169,9), (174,8), (177,4), (180,8), (186,12), (188,8), (191,8), (196,0), (199,8), (202,1), (207,8), (214,4), (221,9), (226,12), (233,1), (239,0), (246,1), (251,5), (257,9), (263,0), (266,0), (270,5), (280,8), (285,12), (291,0), (295,5), (305,12), (308,5), (311,1), (315,13), (321,12), (323,1), (327,13), (338,1), (343,5), (347,5), (356,13), (363,5), (369,5), (373,13), (376,1), (382,1), (389,13), (392,5), (394,8), (397,5)}

T′₃={(2,4), (8,9), (12,8), (14,8), (23,12), (29,9), (33,9), (45,0), (47,8), (60,0), (73,13), (78,12), (89,12), (99,5), (102,9), (111,5), (117,4), (127,12), (133,12), (136,1), (138,12), (143,4), (157,12), (160,0), (163,8), (170,12), (176,4), (178,8), (182,8), (187,8), (189,8), (192,1), (198,8), (200,0), (204,4), (210,1), (217,2), (224,0), (228,9), (236,8), (241,0), (249,1), (256,8), (259,9), (264,1), (267,1), (271,9), (282,0), (286,1), (292,8), (302,12), (306,9), (309,4), (312,13), (316,1), (322,5), (324,5), (328,5), (342,12), (346,13), (349,0), (361,1), (367,5), (372,5), (374,4), (380,4), (387,5), (390,5), (393,1), (395,9)}

T′₄={(2,14), (5,3), (12,11), (15,0), (20,13), (22,11), (36,13), (39,5), (43,0), (46,15), (48,13), (53,14), (58,8), (61,11), (71,10), (74,14), (85,7), (88,5), (90,2), (95,6), (103,4), (105,6), (115,8), (130,12), (136,2), (142,11), (155,0), (160,7), (171,10), (182,12), (185,12), (191,6), (199,10), (205,8), (213,1), (224,0), (228,0), (233,0), (236,1), (239,1), (246,13), (248,1), (250,4), (253,9), (258,5), (264,7), (270,4), (274,8), (280,2), (287,1), (294,12), (297,5), (301,7), (304,11), (308,11), (314,15), (316,14), (322,10), (326,8), (331,11), (334,5), (345,0), (351,9), (360,1), (363,3), (375,9), (378,2), (387,1), (394,13), (399,13)}

T′₅={(1,2), (3,3), (6,10), (13,3), (19,13), (21,6), (33,10), (38,6), (40,12), (44,3), (47,3), (51,7), (57,15), (59,6), (70,7), (73,10), (79,1), (86,14), (89,5), (92,10), (99,14), (104,6), (111,10), (128,3), (133,4), (139,6), (145,14), (156,14), (168,5), (176,12), (183,8), (186,9), (193,15), (204,0), (207,5), (217,2), (226,0), (230,4), (234,12), (238,8), (240,3), (247,12), (249,8), (251,1), (254,0), (262,3), (268,6), (271,1), (277,5), (286,11), (293,3), (296,7), (299,7), (302,11), (306,3), (309,15), (315,8), (317,10), (325,11), (327,15), (333,1), (335,9), (348,13), (358,9), (362,15), (371,3), (376,7), (379,1), (389,11), (396,15)}

T′₆={(3,15), (7,13), (14,6), (18,3), (29,12), (32,4), (40,5), (53,1), (55,8), (64,15), (70,5), (75,14), (81,5), (90,8), (95,9), (100,8), (103,0), (105,15), (108,13), (110,5), (113,9), (121,12), (124,13), (132,11), (136,12), (140,9), (145,9), (152,6), (159,5), (164,12), (167,1), (171,12), (176,0), (181,6), (183,10), (188,1), (190,9), (199,15), (209,11), (215,6), (232,0), (235,2), (244,2), (248,0), (254,2), (256,0), (260,7), (266,4), (278,0), (281,2), (288,10), (292,10), (295,4), (299,15), (304,2), (314,7), (322,11), (327,0), (336,6), (346,3), (351,9), (353,1), (364,10), (369,15), (371,15), (374,6), (377,14), (386,3), (389,7), (399,10)}

T′₇={(2,4), (4,7), (9,8), (15,5), (22,4), (30,7), (36,14), (50,5), (54,11), (60,8), (68,12), (71,9), (77,2), (85,10), (91,11), (96,11), (101,5), (104,4), (107,13), (109,13), (111,9), (116,0), (123,12), (131,9), (133,1), (137,11), (144,12), (149,0), (155,7), (162,0), (166,6), (168,9), (174,5), (180,5), (182,0), (184,11), (189,1), (197,6), (203,6), (213,15), (223,3), (234,6), (240,10), (247,6), (253,6), (255,2), (257,10), (265,2), (274,0), (280,4), (286,2), (291,2), (294,1), (297,0), (301,2), (306,3), (321,1), (325,10), (334,11), (338,8), (348,3), (352,8), (355,11), (366,10), (370,14), (373,13), (376,15), (382,5), (387,2), (396,8)}

T′₈={(1,5), (16,9), (18,0), (21,1), (28,9), (31,1), (36,1), (39,0), (44,13), (55,0), (58,7), (72,11), (74,11), (78,3), (81,2), (87,8), (93,7), (99,7), (108,2), (114,3), (118,10), (120,15), (125,11), (132,0), (140,3), (147,2), (155,13), (167,6), (173,11), (175,10), (181,4), (188,10), (195,10), (200,3), (206,15), (208,12), (212,7), (217,0), (222,4), (228,12), (231,12), (242,14), (253,6), (255,8), (257,6), (261,7), (264,7), (268,8), (275,15), (278,15), (285,3), (289,11), (295,0), (298,4), (307,11), (315,1), (318,5), (324,5), (338,8), (342,13), (347,13), (356,4), (358,13), (360,5), (363,1), (365,0), (371,3), (385,1), (389,0), (398,11)}

T′₉={(0,0), (5,9), (17,1), (19,0), (26,0), (29,8), (34,7), (37,5), (40,15), (50,9), (56,0), (67,15), (73,1), (76,5), (80,3), (84,0), (89,5), (96,2), (107,14), (110,0), (117,1), (119,10), (123,11), (128,10), (138,10), (143,2), (152,14), (164,13), (171,2), (174,8), (180,7), (182,14), (191,2), (199,9), (204,14), (207,0), (211,6), (213,7), (218,15), (223,2), (230,9), (241,6), (249,15), (254,1), (256,1), (259,11), (262,12), (265,15), (269,12), (277,11), (280,11), (286,13), (293,13), (297,3), (300,12), (311,1), (316,6), (320,4), (326,9), (339,13), (346,5), (348,7), (357,2), (359,2), (361,0), (364,8), (368,13), (375,8), (388,3), (393,5)}

T′₁₀={(6,9), (12,3), (19,14), (24,15), (31,14), (35,10), (38,6), (41,9), (44,4), (49,7), (59,5), (65,0), (76,10), (84,5), (88,12), (105,14), (109,6), (114,14), (117,3), (121,8), (124,4), (131,14), (135,9), (137,10), (141,8), (144,0), (151,7), (159,12), (169,15), (176,0), (184,1), (193,13), (195,4), (197,4), (209,15), (214,5), (218,14), (222,3), (225,5), (228,9), (232,5), (236,3), (243,8), (247,4), (250,0), (263,8), (267,1), (274,10), (278,15), (282,8), (288,14), (294,10), (300,11), (308,2), (313,8), (319,0), (327,1), (332,4), (335,2), (338,11), (351,4), (354,5), (356,10), (360,1), (363,2), (368,14), (376,10), (379,6), (385,7), (398,15)}

T′₁₁={(1,14), (8,11), (18,10), (21,9), (25,10), (34,11), (37,8), (40,7), (43,3), (45,14), (53,7), (61,13), (72,11), (83,15), (86,11), (101,5), (108,5), (113,6), (115,13), (119,0), (122,7), (129,1), (132,1), (136,8), (139,3), (142,15), (148,12), (154,11), (166,1), (175,3), (183,13), (186,3), (194,3), (196,3), (205,4), (210,0), (217,10), (219,4), (223,0), (227,9), (229,9), (235,5), (241,1), (245,0), (248,5), (262,8), (266,5), (272,1), (275,1), (281,0), (287,5), (291,14), (298,1), (303,10), (309,10), (317,0), (325,2), (329,2), (333,2), (336,0), (350,10), (353,3), (355,5), (359,6), (362,15), (366,2), (373,6), (378,12), (383,1), (388,14)}

T′₁₂={(6,3), (11,15), (15,3), (22,5), (28,12), (33,1), (36,13), (42,8), (44,1), (55,11), (69,9), (71,9), (75,9), (78,10), (81,1), (86,10), (88,13), (95,11), (102,1), (104,9), (110,4), (112,9), (117,2), (120,1), (130,1), (134,4), (138,9), (147,0), (150,11), (155,10), (168,7), (171,3), (180,11), (188,0), (196,3), (201,10), (205,7), (208,13), (215,2), (217,8), (227,14), (231,5), (234,0), (241,6), (248,0), (261,3), (263,5), (266,1), (269,6), (279,2), (287,15), (290,6), (294,1), (296,4), (302,11), (313,10), (321,14), (326,0), (336,4), (342,7), (355,13), (358,11), (369,9), (371,3), (385,2), (388,2), (391,8), (395,2), (397,5), (399,3)}

$T'_{13}$={(4,8), (7,10), (13,11), (16,11), (27,3), (31,12), (34,13), (38,13), (43,12), (54,14), (57,12), (70,1), (73,14), (76,8), (80,8), (84,9), (87,13), (93,0), (101,0), (103,1), (107,1), (111,1), (114,9), (119,1), (122,8), (131,1), (135,10), (139,15), (149,3), (153,2), (165,13), (170,11), (173,8), (185,3), (193,10), (198,1), (203,11), (207,14), (211,4), (216,7), (220,3), (229,5), (233,14), (237,6), (242,6), (258,6), (262,14), (264,2), (268,12), (273,14), (283,14), (288,0), (292,2), (295,10), (300,4), (308,12), (317,6), (325,1), (332,10), (341,10), (343,7), (356,1), (365,7), (370,3), (377,2), (387,4), (390,7), (392,5), (396,1), (398,7)}

$T'_{14}$={(1,1), (4,8), (15,15), (18,14), (22,8), (27,14), (33,10), (38,14), (45,11), (52,14), (59,3), (63,14), (66,14), (74,6), (80,2), (84,0), (99,8), (107,13), (110,1), (121,2), (125,3), (131,7), (137,10), (139,1), (145,7), (147,5), (151,2), (154,10), (165,3), (173,11), (179,9), (184,3), (186,2), (189,6), (196,4), (204,3), (206,5), (215,6), (222,1), (225,1), (229,3), (232,13), (237,2), (242,10), (245,5), (248,9), (251,3), (255,9), (259,1), (263,0), (268,1), (270,9), (276,9), (285,9), (289,11), (292,5), (297,1), (308,1), (314,0), (318,12), (322,12), (328,9), (339,13), (341,0), (347,15), (360,10), (368,5), (375,3), (382,4), (396,11)}

$T'_{15}$={(0,15), (3,6), (10,9), (17,10), (20,9), (25,14), (31,4), (36,3), (41,10), (48,0), (55,10), (62,12), (64,3), (69,0), (77,5), (82,4), (87,6), (103,2), (108,10), (118,12), (122,7), (129,6), (132,7), (138,6), (142,15), (146,3), (148,11), (153,9), (157,0), (168,0), (175,15), (183,8), (185,1), (187,2), (194,9), (203,11), (205,11), (209,1), (219,1), (224,0), (226,1), (231,7), (234,0), (238,2), (243,11), (247,1), (250,2), (253,0), (256,4), (262,9), (267,3), (269,0), (271,8), (281,9), (286,10), (290,8), (293,10), (306,0), (309,1), (317,3), (320,13), (324,12), (336,12), (340,7), (346,15), (348,11), (367,0), (372,11), (378,6), (390,6)}

$T'_{16}$={(3,13), (11,9), (24,3), (26,4), (31,4), (34,2), (44,0), (51,8), (54,8), (57,2), (60,1), (64,2), (67,1), (69,5), (72,7), (83,12), (95,13), (98,4), (100,8), (103,8), (108,8), (113,4), (126,11), (130,2), (138,9), (145,0), (149,6), (152,14), (158,14), (162,2), (166,1), (170,10), (178,8), (181,2), (190,0), (196,14), (202,1), (205,0), (209,2), (214,3), (231,9), (239,10), (242,6), (244,14), (247,9), (254,8), (268,7), (277,8), (284,10), (288,7), (295,0), (305,14), (308,10), (312,6), (317,14), (323,11), (328,6), (330,11), (340,13), (345,5), (347,6), (352,7), (355,4), (361,14), (367,3), (372,9), (377,7), (382,6), (389,9), (394,7)}

$T'_{17}$={(2,8), (8,11), (16,14), (25,1), (28,12), (33,5), (39,4), (50,3), (52,14), (56,7), (58,8), (63,12), (66,3), (68,12), (70,7), (80,9), (90,9), (97,3), (99,12), (101,2), (105,2), (109,5), (119,5), (127,5), (133,0), (140,4), (147,1), (151,6), (156,1), (161,4), (163,1), (169,1), (177,2), (179,0), (186,4), (193,3), (201,2), (203,0), (207,11), (211,2), (227,3), (233,9), (241,2), (243,8), (245,13), (251,0), (257,0), (276,10), (282,10), (285,3), (292,4), (304,12), (307,13), (310,7), (314,12), (318,13), (324,11), (329,10), (335,11), (344,14), (346,7), (350,13), (354,3), (357,3), (365,5), (370,12), (376,4), (380,12), (386,2), (392,0)}

$T'_{18}$={(3,11), (5,15), (10,0), (21,2), (26,1), (33,10), (46,2), (54,8), (62,5), (70,0), (73,9), (80,10), (82,10), (86,6), (91,4), (96,10), (99,2), (111,1), (116,5), (123,10), (138,8), (141,7), (146,14), (152,4), (157,3), (159,13), (167,0), (171,4), (174,1), (177,9), (181,4), (190,9), (196,0), (199,0), (201,0), (204,14), (208,5), (220,8), (229,15), (233,6), (237,8), (247,1), (252,10), (257,7), (263,2), (265,11), (269,0), (271,11), (275,10), (286,2), (296,10), (302,2), (311,3), (316,8), (320,2), (331,13), (333,2), (339,9), (344,6), (346,6), (351,10), (363,4), (367,4), (369,2), (375,1), (378,11), (384,11), (390,10), (394,1), (397,11)}

$T'_{19}$={(1,2), (4,1), (9,7), (20,2), (25,8), (32,6), (37,4), (53,7), (58,3), (68,0), (72,0), (74,3), (81,2), (84,13), (89,0), (92,5), (97,5), (102,13), (115,5), (118,4), (132,6), (139,2), (143,7), (149,2), (154,4), (158,1), (162,0), (170,6), (172,4), (175,1), (178,14), (184,12), (195,8), (198,12), (200,0), (202,12), (207,3), (216,15), (226,0), (230,12), (235,8), (246,15), (248,7), (255,12), (258,3), (264,14), (267,2), (270,8), (272,8), (279,6), (293,0), (298,14), (307,7), (313,15), (319,14), (330,10), (332,8), (335,6), (340,2), (345,10), (350,10), (362,14), (366,14), (368,1), (373,0), (377,3), (380,0), (387,4), (392,3), (395,0)}

$T'_{20}$={(3,2), (6,11), (9,10), (11,4), (16,14), (18,2), (31,6), (38,2), (43,0), (49,0), (51,12), (53,6), (60,2), (62,6), (69,8), (79,2), (88,0), (92,8), (97,0), (101,14), (108,10), (112,2), (116,10), (124,14), (129,8), (133,10), (143,0), (145,8), (151,10), (157,0), (159,10), (165,8), (171,8), (174,2), (184,2), (192,14), (204,0), (209,2), (219,6), (222,2), (228,2), (237,2), (244,12), (252,14), (255,8), (258,14), (262,8), (273,14), (279,8), (292,2), (299,10), (303,14), (315,0), (320,6), (324,2), (330,4), (332,0), (336,8), (339,0), (343,4), (349,0), (358,8), (367,14), (376,4), (378,12), (381,10), (388,0), (391,8), (394,0), (399,4)}

$T'_{21}$={(0,10), (4,6), (8,0), (10,0), (13,12), (17,0), (30,10), (34,8), (42,7), (45,2), (50,8), (52,6), (58,10), (61,8), (67,0), (74,2), (87,4), (91,6), (93,2), (98,10), (104,2), (111,10), (115,2), (122,2), (126,8), (130,0), (135,2), (144,8), (150,8), (156,10), (158,10), (161,0), (170,2), (173,4), (182,14), (191,14), (198,4), (206,15), (216,12), (220,6), (226,6), (232,8), (240,14), (245,0), (253,0), (257,10), (259,4), (267,2), (278,6), (290,10), (296,6), (301,2), (310,6), (319,6), (323,8), (326,6), (331,4), (333,8), (337,10), (340,0), (344,4), (352,8), (366,8), (372,0), (377,14), (379,4), (383,12), (389,8), (393,6), (397,12)}

$T'_{22}$={(6,8), (13,10), (16,2), (20,10), (30,0), (37,2), (42,14), (48,12), (51,7), (57,11), (61,1), (73,3), (78,11), (83,2), (90,10), (93,11), (96,15), (98,5), (108,0), (113,4), (116,1), (126,7), (131,3), (138,1), (144,5), (147,11), (149,1), (151,3), (154,3), (164,9), (167,3), (169,7), (178,3), (181,5), (186,5), (193,3), (198,5), (203,13), (212,9), (215,1), (218,15), (220,3), (225,1), (227,6), (230,8), (233,2), (238,2), (244,6), (249,11), (256,1), (265,2), (276,8), (280,0), (286,1), (296,2), (303,2), (311,0), (317,0), (319,0), (327,0), (336,0), (348,8), (358,8), (360,8), (367,10), (373,0), (375,8), (390,10), (394,2), (398,10)}

$T'_{23}$={(4,2), (10,10), (15,10), (18,10), (23,6), (32,10), (39,14), (45,0), (49,2), (52,6), (59,11), (66,0), (75,14), (82,3), (87,13), (92,11), (95,1), (97,3), (106,7), (109,3), (115,7), (119,1), (130,14), (135,5), (142,7), (146,9), (148,0), (150,3), (153,3), (159,1), (166,11), (168,3), (170,9), (180,1), (183,1), (192,3), (197,3), (202,3), (210,9), (213,3), (217,1), (219,5), (221,1), (226,3), (229,12), (231,2), (235,10), (239,1), (246,5), (250,9), (262,7), (275,2), (279,14), (283,8), (291,0), (300,2), (309,0), (312,0), (318,12), (323,0), (329,0), (345,8), (354,8), (359,12), (364,0), (371,4), (374,0), (388,1), (391,10), (397,0)}

$T'_{24}$={(7,3), (11,13), (16,1), (23,0), (27,8), (30,11), (45,7), (48,7), (59,1), (63,3), (65,7), (70,2), (80,3), (83,7), (85,11), (94,11), (98,9), (101,1), (109,0), (113,9), (117,5), (121,1), (124,3), (128,1), (140,9), (142,5), (160,5), (163,9), (167,11), (176,1), (178,1), (180,2), (185,0), (189,0), (192,15), (202,8), (208,10), (219,2), (224,3), (227,6), (239,3), (241,0), (243,6), (250,4), (252,8), (256,0), (260,1), (265,0), (272,0), (277,2), (284,4), (290,2), (301,10), (311,2), (313,12), (321,10), (323,12), (325,0), (331,2), (335,10), (337,10), (344,10), (349,6), (353,8), (358,2), (360,1), (380,4), (384,11), (392,2), (397,3)}

$T'_{25}$={(1,3), (8,1), (14,2), (22,11), (24,15), (28,9), (44,9), (46,3), (50,3), (62,3), (64,3), (66,7), (76,1), (82,5), (84,9), (86,5), (97,5), (100,15), (102,3), (112,9), (114,7), (120,1), (123,1), (127,11), (134,3), (141,9), (152,1), (162,3), (165,1), (172,5), (177,0), (179,6), (181,1), (187,7), (190,2), (198,5), (206,2), (218,0), (221,4), (225,0), (233,6), (240,2), (242,0), (249,4), (251,8), (254,8), (259,1), (263,4), (270,1), (273,4), (278,2), (287,2), (293,6), (307,10), (312,6), (316,10), (322,12), (324,0), (330,8), (334,10), (336,8), (341,14), (347,10), (350,4), (355,0), (359,12), (369,2), (383,14), (391,3), (393,13)}

$T'_{26}$={(7,0), (11,11), (13,1), (23,3), (25,3), (31,9), (35,9), (41,11), (43,3), (48,7), (51,13), (53,3), (65,15), (71,1), (85,9), (88,7), (96,3), (102,7), (106,7), (114,2), (120,2), (123,3), (127,1), (130,4), (142,11), (146,3), (148,15), (154,0), (157,9), (162,6), (166,14), (175,8), (179,11), (190,9), (193,4), (199,0), (206,1), (209,0), (212,2), (214,0), (218,1), (222,0), (224,10), (230,0), (236,2), (246,0), (261,10), (271,0), (276,10), (282,0), (284,8), (290,0), (298,10), (304,8), (307,4), (314,4), (316,2), (319,12), (325,12), (334,1), (342,4), (350,1), (352,2), (354,11), (364,13), (368,9), (372,0), (382,4), (385,1), (399,4)}

$T'_{27}$={(5,3), (9,1), (12,3), (15,1), (24,3), (27,1), (33,9), (36,9), (42,3), (47,1), (49,11), (52,1), (58,5), (69,13), (81,3), (86,9), (94,11), (97,2), (104,15), (113,10), (115,3), (122,1), (125,5), (129,1), (140,3), (144,1), (147,5), (152,3), (156,2), (160,10), (165,12), (173,8), (176,2), (183,6), (192,10), (195,7), (205,2), (208,6), (210,10), (213,8), (216,10), (221,10), (223,8), (229,10), (231,2), (243,9), (249,13), (266,4), (273,6), (281,6), (283,0), (289,12), (293,2), (300,0), (305,8), (312,0), (315,0), (318,10), (320,8), (329,0), (338,3), (347,9), (351,2), (353,0), (361,9), (365,11), (371,3), (380,3), (384,0), (386,1)}

$T'_{28}$={(6,0), (19,2), (25,8), (29,0), (32,0), (40,8), (47,0), (51,2), (54,8), (58,2), (63,0), (66,3), (72,8), (77,0), (79,5), (82,12), (90,1), (92,11), (95,0), (105,10), (109,11), (112,15), (118,9), (124,13), (126,15), (133,11), (140,11), (143,9), (146,11), (155,1), (163,7), (172,1), (178,1), (184,8), (187,11), (197,11), (206,3), (211,3), (219,1), (225,11), (237,9), (240,3), (252,9), (264,3), (274,9), (276,5), (280,9), (287,1), (293,9), (298,2), (301,1), (313,0), (316,12), (319,12), (321,10), (327,1), (330,0), (334,2), (339,0), (359,1), (365,5), (370,10), (372,2), (379,1), (382,8), (386,4), (388,4), (393,0), (396,2), (399,0)}

$T'_{29}$={(0,8), (12,0), (20,0), (26,10), (30,2), (34,0), (41,0), (49,0), (52,2), (55,0), (60,0), (64,0), (69,1), (75,9), (78,0), (81,9), (87,4), (91,15), (94,1), (100,11), (106,10), (110,2), (115,1), (120,3), (125,0), (132,3), (135,3), (141,2), (145,9), (153,7), (161,11), (167,8), (175,15), (183,0), (186,1), (194,3), (201,3), (208,13), (216,3), (223,3), (235,9), (238,3), (246,11), (259,1), (273,2), (275,9), (277,11), (282,9), (289,5), (294,0), (300,3), (310,1), (315,10), (318,0), (320,8), (322,1), (328,2), (331,0), (337,4), (340,2), (362,8), (368,8), (371,1), (374,2), (381,8), (384,4), (387,0), (391,3), (395,2), (398,10)}

$T'_{30}$={(4,10), (11,0), (16,0), (26,2), (28,2), (32,3), (38,2), (42,1), (54,10), (59,0), (63,1), (67,11), (71,3), (74,10), (82,0), (87,1), (94,8), (106,9), (116,8), (121,11), (126,9), (131,9), (134,1), (136,1), (140,1), (149,1), (156,1), (158,3), (162,11), (165,9), (172,0), (174,3), (181,1), (185,1), (191,3), (195,9), (201,1), (208,1), (212,8), (215,11), (219,8), (227,11), (232,3), (243,9), (252,2), (260,0), (265,9), (272,1), (281,10), (283,9), (288,10), (291,11), (303,3), (310,2), (318,11), (323,3), (330,1), (337,8), (339,2), (342,0), (344,0), (349,10), (353,8), (359,0), (366,8), (374,10), (379,10), (383,8), (390,2), (395,0)}

$T'_{31}$={(2,2), (8,8), (13,0), (21,8), (27,10), (29,0), (36,0), (39,11), (51,2), (56,0), (61,0), (65,3), (68,0), (72,3), (79,1), (84,8), (88,3), (102,1), (112,11), (118,0), (124,3), (127,1), (132,0), (135,1), (139,1), (142,1), (150,1), (157,1), (159,1), (163,1), (166,2), (173,1), (179,1), (184,1), (189,1), (194,9), (197,0), (203,3), (209,8), (214,3), (218,11), (221,1), (230,3), (234,3), (244,11), (253,1), (261,11), (271,11), (273,1), (282,2), (285,8), (289,8), (294,2), (306,10), (317,2), (319,9), (329,1), (333,2), (338,2), (341,10), (343,2), (345,0), (350,0), (356,0), (362,3), (370,0), (377,0), (381,8), (384,0), (391,8)}

$T'_{32}$={(11,5), (19,6), (27,6), (30,7), (42,6), (54,4), (56,2), (64,6), (67,2), (72,0), (75,12), (77,4), (80,0), (89,6), (93,6), (96,5), (100,0), (113,14), (118,2), (126,12), (133,6), (137,14), (144,14), (148,2), (151,0), (155,2), (162,2), (164,2), (169,3), (182,12), (187,3), (190,1), (197,1), (210,12), (212,0), (218,3), (224,4), (228,10), (235,8), (237,1), (244,7), (252,0), (258,3), (261,1), (266,1), (270,1), (276,2), (279,0), (284,7), (288,1), (295,7), (298,1), (300,3), (302,1), (304,3), (308,1), (313,1), (321,5), (326,5), (331,10), (334,1), (337,5), (344,4), (356,5), (358,4), (366,5), (374,4), (385,1), (395,4), (398,6)}

$T'_{33}$={(7,4), (17,3), (22,5), (29,6), (35,14), (47,14), (55,4), (63,1), (66,0), (71,13), (73,0), (76,10), (79,0), (85,7), (90,4), (94,3), (98,4), (106,2), (116,4), (122,2), (128,6), (136,10), (141,2), (147,4), (150,0), (153,14), (157,2), (163,7), (167,1), (176,1), (185,4), (189,0), (191,11), (203,5), (211,0), (216,0), (220,11), (225,7), (232,3), (236,0), (238,9), (245,1), (256,1), (260,7), (265,7), (269,5), (275,3), (277,5), (280,7), (285,9), (290,1), (297,9), (299,3), (301,0), (303,1), (305,1), (311,0), (315,1), (325,2), (328,5), (332,13), (335,7), (341,5), (355,4), (357,5), (362,6), (373,4), (381,1), (386,13), (397,5)}

$T'_{34}$={(2,5), (12,1), (19,1), (22,5), (24,3), (28,9), (35,13), (39,1), (41,0), (44,10), (47,0), (57,1), (64,5), (68,5), (79,1), (85,1), (91,1), (94,4), (103,3), (105,4), (107,5), (112,7), (119,5), (126,1), (143,2), (145,12), (153,5), (160,4), (168,0), (172,0), (178,4), (188,0), (192,8), (195,4), (200,0), (213,11), (229,1), (231,0), (242,4), (244,4), (247,4), (252,4), (254,4), (264,0), (269,7), (272,0), (281,2), (284,0), (289,2), (299,10), (305,3), (307,7), (320,14), (322,7), (328,6), (331,10), (343,0), (346,0), (352,11), (354,2), (359,1), (363,3), (365,6), (369,5), (378,5), (382,7), (384,12), (386,0), (393,3), (399,1)}

$T'_{35}$={(0,1), (7,2), (14,5), (21,5), (23,7), (27,2), (32,1), (37,1), (40,1), (43,1), (46,1), (53,5), (62,11), (65,5), (77,7), (83,7), (86,7), (92,3), (95,4), (104,0), (106,8), (109,7), (113,2), (120,5), (135,1), (144,4), (146,13), (154,5), (164,6), (169,2), (177,13), (179,7), (190,4), (194,8), (196,0), (201,5), (215,4), (230,4), (235,0), (243,0), (246,

6), (249,4), (253,4), (258,0), (266,4), (271,0), (274,4), (283,0), (287,6), (298,7), (304,1), (306,4), (309,6), (321,1), (327,7), (329,2), (333,6), (345,3), (351,1), (353,5), (357,2), (362,0), (364,7), (368,5), (374,0), (381,2), (383,3), (385,6), (390,3), (396,1)}

$T'_{36}$={(9,3), (14,2), (23,7), (26,2), (29,12), (39,4), (43,3), (48,3), (50,0), (61,2), (65,0), (67,14), (69,4), (74,4), (76,2), (89,6), (93,6), (100,4), (106,1), (122,4), (124,14), (128,0), (130,4), (136,4), (143,5), (148,4), (154,0), (161,4), (170,4), (174,1), (182,5), (188,6), (192,1), (202,0), (211,9), (216,1), (221,1), (223,3), (234,5), (239,5), (255,5), (260,13), (267,7), (272,5), (277,3), (279,1), (283,6), (287,0), (294,1), (297,1), (304,0), (307,5), (313,2), (323,3), (328,2), (332,1), (341,0), (343,3), (348,1), (352,1), (354,1), (357,0), (361,13), (366,0), (375,0), (380,1), (385,0), (387,4), (393,7), (398,5)}

$T'_{37}$={(0,2), (10,6), (17,6), (24,7), (28,5), (35,5), (41,5), (47,7), (49,4), (60,2), (62,4), (66,5), (68,2), (70,4), (75,6), (79,2), (91,4), (98,7), (103,4), (114,0), (123,6), (125,14), (129,4), (134,6), (137,4), (146,5), (150,5), (160,4), (164,0), (173,0), (177,4), (187,1), (191,0), (200,7), (210,3), (215,1), (220,0), (222,5), (225,0), (238,0), (254,0), (257,1), (261,7), (268,1), (274,3), (278,5), (281,1), (285,3), (290,1), (296,1), (303,1), (305,5), (310,0), (314,1), (326,1), (329,0), (337,0), (342,3), (344,1), (349,1), (353,2), (356,9), (360,1), (363,1), (370,5), (378,5), (381,4), (386,5), (392,6), (396,5)}

$T'_{38}$={(5,12), (9,8), (14,8), (18,10), (21,9), (25,5), (35,12), (40,12), (42,0), (49,1), (52,12), (56,0), (59,14), (61,10), (68,0), (78,6), (89,6), (96,0), (101,8), (105,1), (114,5), (119,1), (123,5), (129,0), (137,9), (141,1), (149,4), (153,4), (158,11), (161,11), (169,12), (179,11), (188,9), (194,5), (198,1), (201,13), (206,13), (211,1), (214,11), (221,2), (234,1), (237,8), (239,3), (242,7), (248,13), (251,7), (259,3), (261,14), (269,5), (274,0), (282,6), (284,0), (295,3), (299,5), (302,12), (305,4), (310,9), (314,13), (332,12), (339,7), (341,14), (348,12), (352,12), (355,1), (361,0), (370,13), (379,12), (381,11), (392,10), (395,8)}

$T'_{39}$={(0,4), (8,4), (10,12), (17,0), (20,4), (23,13), (32,9), (37,0), (41,8), (46,1), (50,13), (55,9), (57,6), (60,4), (67,0), (76,4), (83,0), (91,8), (98,0), (102,6), (110,2), (117,15), (121,10), (127,15), (134,7), (139,10), (148,13), (151,9), (156,10), (160,1), (166,1), (172,2), (187,6), (189,2), (197,0), (200,7), (205,2), (210,9), (212,3), (220,1), (222,1), (236,7), (238,1), (240,1), (245,13), (250,5), (258,5), (260,7), (263,13), (270,9), (279,5), (283,4), (291,5), (296,11), (301,6), (303,5), (306,5), (312,4), (324,5), (333,6), (340,13), (345,13), (349,0), (354,0), (357,8), (364,13), (372,14), (380,4), (383,5), (394,10)}

$T'_{0}$={(3,10), (7,12), (14,12), (20,9), (35,1), (46,0), (57,3), (71,12), (78,2), (85,9), (92,4), (99,15), (110,13), (117,7), (125,15), (129,9), (150,12), (158,9), (163,5), (168,11), (175,12), (185,9), (195,9), (202,9), (212,13), (217,3), (226,10), (232,5), (241,7), (251,5), (267,4), (273,4), (278,5), (289,6), (297,12), (309,5), (312,5), (334,9), (338,6), (343,1), (350,1), (361,8), (367,6), (375,12), (379,0), (388,4)}

$T'_{1}$={(2,8), (6,8), (12,4), (19,0), (34,8), (45,13), (56,9), (63,8), (77,3), (83,13), (90,15), (97,0), (107,14), (116,9), (121,8), (128,15), (134,12), (156,1), (161,7), (165,13), (172,12), (180,5), (194,8), (200,9), (207,13), (214,13), (224,14), (228,7), (240,7), (250,12), (260,5), (272,4), (276,6), (288,1), (292,4), (302,4), (311,3), (330,10), (337,1), (342,10), (349,9), (357,14), (365,12), (373,4), (377,0), (384,1), (391,3)}

$T'_{2}$={(1,8), (5,12), (9,8), (15,0), (26,4), (38,0), (48,13), (62,1), (75,8), (82,13), (88,1), (93,12), (104,5), (111,15), (120,9), (127,14), (131,5), (152,13), (159,13), (164,4), (171,9), (177,13), (193,1), (199,3), (204,3), (213,1), (223,13), (227,5), (236,14), (245,9), (255,5), (268,4), (275,9), (284,8), (291,2), (299,4), (310,4), (326,0), (335,4), (340,14), (347,4), (351,4), (364,0), (369,2), (376,12), (383,0), (389,0)}

$T'_{3}$={(8,9), (13,4), (23,12), (30,12), (45,0), (56,4), (73,13), (81,13), (99,5), (107,4), (117,4), (128,5), (136,1), (141,12), (157,12), (161,0), (170,12), (177,4), (182,8), (188,8), (192,1), (199,8), (204,4), (214,4), (224,0), (233,1), (241,0), (251,5), (259,9), (266,0), (271,9), (285,12), (292,8), (305,12), (309,4), (315,13), (322,5), (327,13), (342,12), (347,5), (361,1), (369,5), (374,4), (382,1), (390,5), (394,8)}

$T'_{4}$={(5,0), (12,8), (17,1), (29,9), (37,4), (47,8), (65,13), (78,12), (94,5), (102,9), (112,13), (127,12), (134,1), (138,12), (155,0), (160,0), (169,9), (176,4), (180,8), (187,8), (191,8), (198,8), (202,1), (210,1), (221,9), (228,9), (239,0), (249,1), (257,9), (264,1), (270,5), (282,0), (291,0), (302,12), (308,5), (312,13), (321,12), (324,5), (338,1), (346,13), (356,13), (367,5), (373,13), (380,4), (389,13), (393,1), (397,5)}

$T'_{5}$={(2,4), (10,8), (14,8), (24,13), (33,9), (46,12), (60,0), (77,13), (89,12), (100,9), (111,5), (125,0), (133,12), (137,0), (143,4), (158,9), (163,8), (174,8), (178,8), (186,12), (189,8), (196,0), (200,0), (207,8), (217,2), (226,12), (236,8), (246,1), (256,8), (263,0), (267,1), (280,8), (286,1), (295,5), (306,9), (311,1), (316,1), (323,1), (328,5), (343,5), (349,0), (363,5), (372,5), (376,1), (387,5), (392,5), (395,9)}

$T'_{6}$={(3,3), (12,11), (19,13), (22,11), (38,6), (43,0), (47,3), (53,14), (59,6), (71,10), (79,1), (88,5), (92,10), (103,4), (111,10), (130,12), (139,6), (155,0), (168,5), (182,12), (186,9), (199,10), (207,5), (224,0), (230,4), (236,1), (240,3), (248,1), (251,1), (258,5), (268,6), (274,8), (286,11), (294,12), (299,7), (304,11), (309,15), (316,14), (325,11), (331,11), (335,9), (351,9), (362,15), (375,9), (379,1), (394,13)}

$T'_{7}$={(2,14), (6,10), (15,0), (21,6), (36,13), (40,12), (46,15), (51,7), (58,8), (70,7), (74,14), (86,14), (90,2), (99,14), (105,6), (128,3), (136,2), (145,14), (160,7), (176,12), (185,12), (193,15), (205,8), (217,4), (228,0), (234,12), (239,1), (247,12), (250,4), (254,0), (264,7), (271,1), (280,2), (293,3), (297,5), (302,11), (308,11), (315,8), (322,10), (327,15), (334,5), (348,13), (360,1), (371,3), (378,2), (389,11), (399,13)}

$T'_{8}$={(1,2), (5,3), (13,3), (20,13), (33,10), (39,5), (44,3), (48,13), (57,15), (61,11), (73,10), (85,7), (89,5), (95,6), (104,6), (115,8), (133,4), (142,11), (156,14), (171,10), (183,8), (191,6), (204,0), (213,1), (226,0), (233,0), (238,8), (246,13), (249,8), (253,9), (262,3), (270,4), (277,5), (287,1), (296,7), (301,7), (306,3), (314,15), (317,10), (326,8), (333,1), (345,0), (358,9), (363,3), (376,7), (387,1), (396,15)}

$T'_{9}$={(4,7), (14,6), (22,4), (32,4), (50,5), (55,8), (68,12), (75,14), (85,10), (95,9), (101,5), (105,15), (109,13), (113,9), (123,12), (132,11), (137,11), (145,9), (155,7), (164,12), (168,9), (176,0), (182,0), (188,1), (197,6), (209,11), (223,3), (235,2), (247,6), (254,2), (257,10), (266,4), (280,4), (288,10), (294,1), (299,15), (306,3), (322,11), (334,11), (346,3), (352,8), (364,10), (370,14), (374,6), (382,5), (389,7)}

T'₁₀={(3,15), (9,8), (18,3), (30,7), (40,5), (54,11), (64,15), (71,9), (81,5), (91,11), (100,8), (104,4), (108,13), (111,9), (121,12), (131,9), (136,12), (144,12), (152,6), (162,0), (167,1), (174,5), (181,6), (184,11), (190,9), (203,6), (215,6), (234,6), (244,2), (253,6), (256,0), (265,2), (278,0), (286,2), (292,10), (297,0), (304,2), (321,1), (327,0), (338,8), (351,9), (355,11), (369,15), (373,13), (377,14), (387,2), (399,10)}

T'₁₁={(2,4), (7,13), (15,5), (29,12), (36,14), (53,1), (60,8), (70,5), (77,2), (90,8), (96,11), (103,0), (107,13), (110,5), (116,0), (124,13), (133,1), (140,9), (149,0), (159,5), (166,6), (171,12), (180,5), (183,10), (189,1), (199,15), (213,15), (232,0), (240,10), (248,0), (255,2), (260,7), (274,0), (281,2), (291,2), (295,4), (301,2), (314,7), (325,10), (336,6), (348,3), (353,1), (366,10), (371,15), (376,15), (386,3), (396,8)}

T'₁₂={(5,9), (18,0), (26,0), (31,1), (37,5), (44,13), (56,0), (72,11), (76,5), (81,2), (89,5), (99,7), (110,0), (118,10), (123,11), (132,0), (143,2), (155,13), (171,2), (175,10), (182,14), (195,10), (204,14), (208,12), (213,7), (222,4), (230,9), (242,14), (254,1), (257,6), (262,12), (268,8), (277,11), (285,3), (293,13), (298,4), (311,1), (318,5), (326,9), (342,13), (348,7), (358,13), (361,0), (365,0), (375,8), (389,0)}

T'₁₃={(1,5), (17,1), (21,1), (29,8), (36,1), (40,15), (55,0), (67,15), (74,11), (80,3), (87,8), (96,2), (108,2), (117,1), (120,15), (128,10), (140,3), (152,14), (167,6), (174,8), (181,4), (191,2), (200,3), (207,0), (212,7), (218,15), (228,12), (241,6), (253,6), (256,1), (261,7), (265,15), (275,15), (280,11), (289,11), (297,3), (307,11), (316,6), (324,5), (339,13), (347,13), (357,2), (360,5), (364,8), (371,3), (3883), (398,11)}

T'₁₄={(0,0), (16,9), (19,0), (28,9), (34,7), (39,0), (50,9), (58,7), (73,1), (78,3), (84,0), (93,7), (107,14), (114,3), (119,10), (125,1), (138,10), (147,2), (164,13), (173,11), (180,7), (188,10), (199,9), (206,15), (211,6), (217,0), (223,2), (231,12), (249,15), (255,8), (259,11), (264,7), (269,12), (278,15), (286,13), (295,0), (300,12), (315,1), (320,4), (338,8), (346,5), (356,4), (359,2), (363,1), (368,13), (385,1), (393,5)}

T'₁₅={(8,11), (19,14), (25,10), (35,10), (40,7), (44,4), (53,7), (65,0), (83,15), (88,12), (108,5), (114,14), (119,0), (124,4), (132,1), (137,10), (142,15), (151,7), (166,1), (176,0), (186,3), (195,4), (205,4), (214,5), (219,4), (225,5), (229,9), (236,3), (245,0), (250,0), (266,5), (274,10), (281,0), (288,14), (298,1), (308,2), (317,0), (327,1), (333,2), (338,11), (353,3), (356,10), (362,15), (368,14), (378,12), (385,7)}

T'₁₆={(6,9), (18,10), (24,15), (34,11), (38,6), (43,3), (49,7), (61,13), (76,10), (86,11), (105,14), (113,6), (117,3), (122,7), (131,14), (136,8), (141,8), (148,12), (159,12), (175,3), (184,1), (194,3), (197,4), (210,0), (218,14), (223,0), (228,9), (235,5), (243,8), (248,5), (263,8), (272,1), (278,15), (287,15), (294,10), (303,10), (313,8), (325,2), (332,4), (336,0), (351,4), (355,5), (360,1), (366,2), (376,10), (383,1), (398,15)}

T'₁₇={(1,14), (12,3), (21,9), (31,14), (37,8), (41,9), (45,14), (59,5), (72,11), (84,5), (101,5), (109,6), (115,13), (121,8), (129,1), (135,9), (139,3), (144,0), (154,11), (169,15), (183,13), (193,13), (196,3), (209,15), (217,10), (222,3), (227,9), (232,5), (241,1), (247,4), (262,8), (267,1), (275,1), (282,8), (291,14), (300,11), (309,10), (319,0), (329,2), (335,2), (350,10), (354,5), (359,6), (363,2), (373,6), (379,6), (388,14)}

T'₁₈={(7,10), (15,3), (27,3), (33,1), (38,13), (44,1), (57,12), (71,9), (76,8), (81,1), (87,13), (95,11), (103,1), (110,4), (114,9), (120,1), (131,1), (138,9), (149,3), (155,10), (170,11), (180,11), (193,10), (201,10), (207,14), (215,2), (220,3), (231,5), (237,6), (248,0), (262,14), (266,1), (273,14), (287,15), (292,2), (296,4), (308,12), (321,14), (332,10), (342,7), (356,1), (369,9), (377,2), (388,2), (392,5), (397,5)}

T'₁₉={(6,3), (13,11), (22,5), (31,12), (36,13), (43,12), (55,11), (70,1), (75,9), (80,8), (86,10), (93,0), (102,1), (107,1), (112,9), (119,1), (130,1), (135,10), (147,0), (153,2), (168,7), (173,8), (188,0), (198,1), (205,7), (211,4), (217,8), (229,5), (234,0), (242,6), (261,3), (264,2), (269,6), (283,14), (290,6), (295,10), (302,11), (317,6), (326,0), (341,10), (355,13), (365,7), (371,3), (387,4), (391,8), (396,1), (399,3)}

T'₂₀={(4,8), (11,15), (16,11), (28,12), (34,13), (42,8), (54,14), (69,9), (73,14), (78,10), (84,9), (88,13), (101,0), (104,9), (111,1), (117,2), (122,8), (134,4), (139,15), (150,11), (165,13), (171,3), (185,3), (196,3), (203,11), (208,13), (216,7), (227,14), (233,14), (241,6), (258,6), (263,5), (268,12), (279,2), (288,0), (294,1), (300,4), (313,10), (325,1), (336,4), (343,7), (358,11), (370,3), (385,2), (390,7), (395,2), (398,7)}

T'₂₁={(3,6), (15,15), (20,9), (27,14), (36,3), (45,11), (55,10), (63,14), (69,0), (80,2), (87,6), (107,13), (118,12), (125,3), (132,7), (139,1), (146,3), (151,2), (157,0), (173,11), (183,8), (186,2), (194,9), (204,3), (209,1), (222,1), (226,1), (232,13), (238,2), (245,3), (250,2), (255,9), (262,9), (268,1), (271,8), (285,9), (290,8), (297,1), (309,1), (318,12), (324,12), (339,13), (346,15), (360,10), (372,11), (382,4)}

T'₂₂={(1,1), (10,9), (18,14), (25,14), (33,10), (41,10), (52,14), (62,12), (66,14), (77,5), (84,0), (103,2), (110,1), (122,7), (131,6), (138,6), (147,8), (148,11), (154,10), (168,0), (179,9), (185,1), (189,6), (203,11), (206,5), (219,1), (225,1), (231,7), (237,2), (243,11), (248,9), (253,0), (259,1), (267,3), (270,9), (281,9), (289,11), (293,10), (308,1), (317,3), (322,12), (336,12), (341,0), (348,11), (368,5), (378,6), (396,11)}

T'₂₃={(0,15), (4,8), (17,10), (22,8), (31,4), (38,14), (48,0), (59,3), (64,3), (74,6), (82,4), (99,8), (108,10), (121,2), (129,6), (137,10), (142,15), (147,5), (153,9), (165,3), (175,15), (184,3), (187,2), (196,4), (205,11), (215,6), (224,0), (229,3), (234,0), (242,10), (247,1), (251,3), (256,4), (263,0), (269,0), (276,9), (286,10), (292,5), (306,0), (314,0), (320,13), (328,9), (340,7), (347,15), (367,0), (375,3), (390,6)}

T'₂₄={(8,11), (24,3), (28,12), (34,2), (50,3), (54,8), (58,8), (64,2), (68,12), (72,7), (90,9), (98,4), (101,2), (108,8), (119,5), (130,2), (140,4), (149,6), (156,1), (162,12), (169,1), (178,8), (186,4), (196,14), (203,0), (209,2), (227,3), (239,10), (243,8), (247,9), (257,0), (277,8), (285,3), (295,0), (307,13), (312,6), (318,13), (328,6), (335,11), (345,5), (350,13), (355,4), (365,5), (372,9), (380,12), (389,9)}

T'₂₅={(3,13), (16,14), (26,4), (33,5), (44,0), (52,14), (57,2), (63,12), (67,1), (70,7), (83,12), (97,3), (100,8), (105,2), (118,4), (127,5), (138,9), (147,1), (152,14), (161,4), (166,1), (177,2), (181,2), (193,3), (202,1), (207,11), (214,3), (233,9), (242,6), (245,13), (254,8), (276,10), (284,10), (292,4), (305,14), (310,7), (317,14), (324,11), (330,11), (344,14), (347,6), (354,3), (361,14), (370,12), (377,7), (386,2), (394,7)}

$T'_{26}$={(2,8), (11,9), (25,1), (31,4), (39,4), (51,8), (56,7), (60,1), (66,3), (69,5), (80,9), (95,13), (99,12), (103,8), (109,5), (126,11), (133,0), (145,0), (151,6), (158,14), (163,1), (170,10), (179,0), (190,0), (201,2), (205,0), (211,2), (231,9), (241,2), (244,14), (251,0), (268,7), (282,10), (288,7), (304,12), (308,10), (314,12), (323,11), (329,10), (340,13), (346,7), (352,7), (357,3), (367,3), (376,4), (382,6), (392,0)}

$T'_{27}$={(4,1), (10,0), (25,8), (33,10), (53,7), (62,5), (72,0), (80,10), (84,13), (91,4), (97,5), (111,1), (118,4), (138,8), (143,7), (152,4), (158,1), (167,0), (172,4), (177,9), (184,12), (196,0), (200,0), (204,14), (216,15), (229,15), (235,8), (247,1), (255,12), (263,2), (267,2), (271,11), (279,6), (296,10), (307,7), (316,8), (330,10), (333,2), (340,2), (346,6), (362,14), (367,4), (373,0), (378,11), (387,4), (394,1)}

$T'_{28}$={(3,11), (9,7), (21,2), (32,6), (46,2), (58,3), (70,0), (74,3), (82,10), (89,0), (96,10), (102,13), (116,5), (132,6), (141,7), (149,2), (157,3), (162,0), (171,4), (175,1), (181,4), (195,8), (199,0), (202,12), (208,5), (226,0), (233,6), (246,15), (252,10), (258,3), (265,11), (270,8), (275,10), (293,0), (302,2), (313,15), (320,2), (332,8), (339,9), (345,10), (351,10), (366,14), (369,2), (377,3), (384,11), (392,3), (397,11)}

$T'_{29}$={(1,2), (5,15), (20,2), (26,1), (37,4), (54,8), (68,0), (73,9), (81,2), (86,6), (92,5), (99,2), (115,5), (123,10), (139,2), (146,14), (154,4), (159,13), (170,6), (174,1), (178,14), (190,9), (198,12), (201,0), (207,3), (220,8), (230,12), (237,8), (248,7), (257,7), (264,14), (269,0), (272,8), (286,2), (298,14), (311,3), (319,14), (331,13), (335,6), (344,6), (350,10), (363,4), (368,1), (375,1), (380,0), (390,10), (395,0)}

$T'_{30}$={(4,6), (9,10), (13,12), (18,2), (34,8), (43,0), (50,8), (53,6), (61,8), (69,8), (87,4), (92,8), (98,10), (108,10), (115,2), (124,14), (130,0), (143,0), (150,8), (157,0), (161,0), (171,8), (182,14), (192,14), (206,15), (219,6), (226,6), (237,2), (245,0), (255,8), (259,4), (273,14), (290,10), (299,10), (310,6), (320,6), (326,6), (332,0), (337,10), (343,4), (352,8), (367,14), (377,14), (381,10), (389,8), (394,0)}

$T'_{31}$={(3,2), (8,0), (11,4), (17,0), (31,6), (42,7), (49,0), (52,6), (60,2), (67,0), (79,2), (91,6), (97,0), (104,2), (112,2), (122,2), (129,8), (135,2), (145,8), (156,10), (159,10), (170,2), (174,2), (191,14), (204,0), (216,12), (222,2), (232,8), (244,12), (253,10), (258,14), (267,2), (279,8), (296,6), (303,14), (319,6), (324,2), (331,4), (336,8), (340,0), (349,0), (366,8), (376,4), (379,4), (388,0), (393,6), (399,4)}

$T'_{32}$={(0,10), (6,11), (10,0), (16,14), (30,10), (38,2), (45,2), (51,12), (58,10), (62,6), (74,2), (88,0), (93,2), (101,14), (111,10), (116,10), (126,8), (133,10), (144,8), (151,10), (158,10), (165,8), (173,4), (184,2), (198,4), (209,2), (220,6), (228,2), (240,14), (252,14), (257,10), (262,8), (278,6), (292,2), (301,2), (315,0), (323,8), (330,4), (333,8), (339,0), (344,4), (358,8), (372,0), (378,12), (383,12), (391,8), (397,12)}

$T'_{33}$={(10,10), (16,2), (23,6), (37,2), (45,0), (51,7), (59,11), (73,3), (82,3), (90,10), (95,1), (98,5), (109,3), (116,1), (130,14), (138,1), (146,9), (149,1), (153,3), (164,9), (178,3), (183,1), (193,3), (202,3), (212,9), (217,1), (220,3), (226,3), (230,8), (235,10), (244,6), (250,9), (265,2), (279,14), (286,1), (300,2), (311,0), (318,12), (327,0), (345,8), (358,8), (364,0), (373,0), (388,1), (394,2)}

$T'_{34}$={(6,8), (15,10), (20,10), (32,10), (42,14), (49,2), (57,11), (66,0), (78,11), (87,13), (93,11), (97,3), (108,0), (115,7), (126,7), (135,5), (144,5), (148,0), (151,3), (159,1), (167,3), (170,9), (181,5), (192,3), (198,5), (210,9), (215,1), (219,5), (225,1), (229,12), (233,2), (239,1), (249,11), (262,7), (276,8), (283,8), (296,2), (309,0), (317,0), (323,0), (336,0), (354,8), (360,8), (371,4), (375,8), (391,10), (398,10)}

$T'_{35}$={(4,2), (13,10), (18,10), (30,0), (39,14), (48,12), (52,6), (61,1), (75,14), (83,2), (92,11), (96,15), (106,7), (113,4), (119,1), (131,3), (142,7), (147,11), (150,3), (154,3), (166,11), (169,7), (180,1), (186,5), (197,3), (203,13), (213,3), (218,15), (221,1), (227,6), (231,2), (238,2), (246,5), (256,1), (275,2), (280,0), (291,0), (303,2), (312,0), (319,0), (329,0), (348,8), (359,12), (367,10), (374,0), (390,10), (397,0)}

$T'_{36}$={(8,1), (16,1), (24,15), (30,11), (46,3), (59,1), (64,3), (70,2), (85,11), (97,5), (101,1), (112,9), (117,5), (123,1), (128,1), (141,9), (160,5), (165,1), (176,1), (179,6), (185,0), (190,2), (202,8), (218,0), (224,3), (233,6), (241,0), (249,4), (252,8), (259,1), (265,0), (273,4), (284,4), (293,6), (311,2), (316,0), (323,12), (330,8), (335,10), (341,14), (349,6), (355,0), (360,1), (383,14), (392,2)}

$T'_{37}$={(7,3), (14,2), (23,0), (28,9), (45,7), (50,3), (63,3), (66,7), (80,3), (84,9), (94,11), (100,15), (109,0), (114,7), (121,1), (127,11), (140,9), (152,1), (163,9), (172,5), (178,1), (181,1), (189,0), (198,6), (208,10), (221,4), (227,6), (240,2), (243,6), (251,8), (256,0), (263,4), (272,0), (278,2), (290,2), (307,10), (313,12), (322,12), (325,0), (334,10), (337,10), (347,10), (353,8), (359,12), (380,4), (391,3), (397,3)}

$T'_{38}$={(1,3), (11,13), (22,11), (27,8), (44,9), (48,7), (62,3), (65,7), (76,1), (83,7), (86,5), (98,9), (102,3), (113,9), (120,1), (124,3), (134,3), (142,5), (162,3), (167,11), (177,0), (180,2), (187,7), (192,15), (206,2), (219,2), (225,0), (239,3), (242,0), (250,4), (254,8), (260,1), (270,1), (277,2), (287,2), (301,10), (312,6), (321,10), (324,0), (331,2), (336,8), (344,10), (350,4), (358,2), (369,2), (384,11), (393,13)}

$T'_{39}$={(9,1), (13,1), (24,3), (31,9), (36,9), (43,3), (49,11), (53,3), (69,13), (85,9), (94,11), (102,7), (113,10), (120,2), (125,5), (130,4), (144,1), (148,15), (156,2), (162,6), (173,8), (179,11), (192,10), (199,0), (208,6), (212,2), (216,10), (222,0), (229,10), (236,2), (249,13), (271,0), (281,6), (284,8), (293,2), (304,8), (312,0), (316,2), (320,8), (334,1), (347,9), (352,2), (361,9), (368,9), (380,3), (385,1)}

$T'_{40}$={(7,0), (12,3), (23,3), (27,1), (35,9), (42,3), (48,7), (52,1), (65,15), (81,3), (88,7), (97,2), (106,7), (115,3), (123,3), (129,1), (142,11), (147,5), (154,0), (160,10), (166,14), (176,2), (190,9), (195,7), (206,1), (210,10), (214,0), (221,10), (224,10), (231,2), (246,0), (266,4), (276,10), (283,0), (290,0), (300,0), (307,4), (315,0), (319,12), (329,0), (342,4), (351,2), (354,11), (365,11), (372,0), (384,0), (399,4)}

$T'_{41}$={(5,3), (11,11), (15,1), (25,3), (33,9), (41,11), (47,1), (51,13), (58,5), (71,1), (86,9), (96,3), (104,15), (114,2), (122,1), (127,1), (140,3), (146,3), (152,3), (157,9), (165,12), (175,8), (183,6), (193,4), (205,2), (209,15), (213,8), (218,1), (223,8), (230,0), (243,9), (261,10), (273,6), (282,0), (289,12), (298,10), (305,8), (314,4), (318,10), (325,12), (338,3), (350,1), (353,0), (364,13), (371,3), (382,4), (386,1)}

T'$_{42}$={(12,0), (25,8), (30,2), (40,8), (49,0), (54,8), (60,0), (66,3), (75,9), (79,5), (87,4), (92,11), (100,11), (109,11), (115,1), (124,13), (132,3), (140,11), (145,9), (155,1), (167,8), (178,1), (186,1), (197,11), (208,13), (219,1), (235,9), (240,3), (259,1), (274,9), (277,11), (287,1), (294,0), (301,1), (315,10), (319,12), (322,1), (330,0), (337,4), (359,1), (368,8), (372,2), (381,8), (386,4), (391,3), (396,2)}

T'$_{43}$={(6,0), (20,0), (29,0), (34,0), (47,0), (52,2), (58,2), (64,0), (72,8), (78,0), (82,12), (91,15), (95,0), (106,10), (112,15), (120,3), (126,15), (135,3), (143,9), (153,7), (163,7), (175,15), (184,8), (194,3), (206,3), (216,3), (225,11), (238,3), (252,9), (273,2), (276,5), (282,9), (293,9), (300,3), (313,0), (318,0), (321,10), (328,2), (334,2), (340,2), (365,5), (371,1), (379,1), (384,4), (388,4), (395,2), (399,0)}

T'$_{44}$={(0,8), (19,2), (26,10), (32,0), (41,0), (51,2), (55,0), (63,0), (69,1), (77,0), (81,9), (90,1), (94,1), (105,10), (110,2), (118,9), (125,0), (133,11), (141,2), (146,11), (161,11), (172,1), (183,0), (187,11), (201,3), (211,3), (223,3), (237,9), (246,11), (264,3), (275,9), (280,9), (289,5), (298,2), (310,1), (316,12), (320,8), (327,1), (331,0), (339,0), (362,8), (370,10), (374,2), (382,8), (387,0), (393,0), (398,10)}

T'$_{45}$={(8,8), (16,0), (27,10), (32,3), (39,11), (54,10), (61,0), (67,11), (72,3), (82,0), (88,3), (106,9), (118,0), (126,9), (132,0), (136,1), (142,1), (156,1), (159,1), (165,9), (173,1), (181,1), (189,1), (195,9), (203,3), (212,8), (218,11), (227,11), (234,3), (252,2), (261,11), (272,1), (282,2), (288,10), (294,2), (310,2), (319,9), (330,1), (338,2), (342,0), (345,0), (353,8), (362,3), (374,10), (381,8), (390,2)}

T'$_{46}$={(4,10), (13,0), (26,2), (29,0), (38,2), (51,2), (59,0), (65,3), (71,3), (79,1), (87,1), (102,1), (116,8), (124,3), (131,9), (135,1), (140,1), (150,1), (158,3), (163,1), (172,0), (179,1), (185,1), (194,9), (201,1), (209,8), (215,11), (221,1), (232,3), (244,11), (260,0), (271,11), (281,10), (285,8), (291,11), (306,10), (318,11), (329,1), (337,8), (341,10), (344,0), (350,0), (359,0), (370,0), (379,10), (384,0), (395,0)}

T'$_{47}$={(2,2), (11,0), (21,8), (28,2), (36,0), (42,1), (56,0), (63,1), (68,0), (74,10), (84,8), (94,8), (112,11), (121,11), (127,1), (134,1), (139,1), (149,1), (157,1), (162,1), (166,2), (174,3), (184,1), (191,3), (197,0), (208,1), (214,3), (219,8), (230,3), (243,9), (253,1), (265,9), (273,1), (283,9), (289,8), (303,3), (317,2), (323,3), (333,2), (339,2), (343,2), (349,10), (356,0), (366,8), (377,0), (383,8), (391,8)}

T'$_{48}$={(17,3), (27,6), (35,14), (54,4), (63,1), (67,2), (73,0), (77,4), (85,7), (93,6), (98,4), (113,14), (122,2), (133,6), (141,2), (148,2), (153,14), (162,2), (167,1), (182,12), (189,1), (197,1), (211,0), (218,3), (225,7), (235,8), (238,9), (252,0), (260,7), (266,1), (275,3), (279,0), (285,9), (295,7), (299,3), (302,1), (305,1), (313,1), (325,2), (331,10), (335,7), (344,4), (357,5), (366,5), (381,1), (395,4)}

T'$_{49}$={(11,5), (22,5), (30,7), (47,14), (56,2), (66,0), (72,0), (76,10), (80,0), (90,4), (96,5), (106,2), (118,2), (128,6), (137,14), (147,4), (151,0), (157,2), (164,2), (176,1), (187,3), (191,11), (210,12), (216,0), (224,4), (232,3), (237,1), (245,1), (258,3), (265,7), (270,1), (277,5), (284,7), (290,1), (298,1), (301,0), (304,3), (311,0), (321,5), (328,5), (334,1), (341,5), (356,5), (362,6), (374,4), (386,13), (398,6)}

T'$_{50}$={(7,4), (19,6), (29,6), (42,6), (55,4), (64,6), (71,13), (75,12), (79,0), (89,6), (94,3), (100,0), (116,4), (126,12), (136,10), (144,14), (150,0), (155,2), (163,7), (169,3), (185,4), (190,1), (203,5), (212,0), (220,11), (228,10), (236,0), (244,7), (256,1), (261,1), (269,5), (276,2), (280,7), (288,1), (297,9), (300,3), (303,1), (308,1), (315,1), (326,5), (332,13), (337,5), (355,4), (358,4), (373,4), (385,1), (397,5)}

T'$_{51}$={(7,2), (19,1), (23,7), (28,9), (37,1), (41,0), (46,1), (57,1), (65,5), (79,1), (86,4), (94,4), (104,0), (107,5), (113,2), (126,1), (144,4), (153,5), (164,6), (172,0), (179,7), (192,8), (196,0), (213,11), (230,4), (242,4), (246,6), (252,4), (258,0), (269,7), (274,4), (284,0), (298,7), (305,3), (309,6), (322,7), (329,2), (343,0), (351,1), (354,2), (362,0), (365,6), (374,0), (382,7), (385,6), (393,3)}

T'$_{52}$={(2,5), (14,5), (22,5), (27,2), (35,13), (40,1), (44,10), (53,5), (64,5), (77,7), (85,1), (92,3), (103,3), (106,8), (112,7), (120,7), (143,2), (146,13), (160,4), (169,2), (178,4), (190,4), (195,4), (201,5), (229,1), (235,0), (244,4), (249,4), (254,4), (266,4), (272,0), (283,0), (289,2), (304,1), (307,7), (321,1), (328,6), (333,6), (346,0), (353,5), (359,1), (364,7), (369,5), (381,2), (384,12), (390,3), (399,1)}

T'$_{53}$={(0,1), (12,1), (21,5), (24,3), (32,1), (39,1), (43,1), (47,0), (62,11), (68,5), (83,2), (91,1), (95,4), (105,4), (109,7), (119,5), (135,1), (145,12), (154,5), (168,1), (177,13), (188,0), (194,8), (200,0), (215,4), (231,0), (243,0), (247,4), (253,4), (264,0), (271,0), (281,2), (287,6), (299,10), (306,4), (320,14), (327,7), (331,10), (345,3), (352,11), (357,2), (363,3), (368,5), (378,5), (383,3), (386,0), (396,1)}

T'$_{54}$={(10,6), (23,7), (28,5), (39,4), (47,7), (50,0), (62,4), (67,14), (70,4), (76,2), (91,4), (100,4), (114,0), (124,14), (129,4), (136,4), (146,5), (154,0), (164,0), (174,1), (187,1), (192,1), (210,3), (216,1), (222,5), (234,5), (254,0), (260,13), (268,1), (277,3), (281,1), (287,0), (296,1), (304,0), (310,0), (323,3), (329,0), (341,0), (344,1), (352,1), (356,9), (361,13), (370,5), (380,1), (386,5), (393,7)}

T'$_{55}$={(9,3), (17,6), (26,2), (35,5), (43,3), (49,4), (61,2), (66,5), (69,4), (75,6), (89,6), (98,7), (106,1), (123,6), (128,0), (134,6), (143,5), (150,5), (161,4), (173,0), (182,5), (191,0), (202,0), (215,1), (221,1), (225,0), (239,5), (257,1), (267,7), (274,3), (279,1), (285,3), (294,1), (303,1), (307,5), (314,1), (328,2), (337,0), (343,3), (349,1), (354,1), (360,1), (366,0), (378,5), (385,0), (392,6), (398,5)}

T'$_{56}$={(0,2), (14,2), (24,7), (29,12), (41,5), (48,3), (60,2), (65,0), (68,2), (74,4), (79,2), (93,6), (103,4), (122,4), (125,14), (130,4), (137,4), (148,4), (160,4), (170,4), (177,4), (188,6), (200,7), (211,9), (220,0), (223,3), (238,0), (255,5), (261,7), (272,5), (278,5), (283,6), (290,1), (297,1), (305,5), (313,2), (326,1), (332,1), (342,3), (348,1), (353,5), (357,0), (363,1), (375,0), (381,4), (387,4), (396,5)}

T'$_{57}$={(8,4), (14,8), (20,4), (25,5), (37,0), (42,0), (50,13), (56,0), (60,4), (68,0), (83,0), (96,0), (102,6), (114,5), (121,10), (129,0), (139,10), (149,4), (156,10), (161,11), (172,2), (188,9), (197,0), (201,13), (210,9), (214,11), (222,1), (237,8), (240,1), (248,13), (258,5), (261,14), (270,9), (282,6), (291,5), (299,5), (303,5), (310,9), (324,5), (339,7), (345,13), (352,12), (357,8), (370,13), (380,4), (392,10)}

T'$_{58}$={(5,12), (10,12), (18,10), (23,13), (35,12), (41,8), (49,1), (55,9), (59,14), (67,0), (78,6), (91,8), (101,8), (110,2), (119,1), (127,15), (137,9), (148,13), (153,4), (160,1), (169,12), (187,6), (194,5), (200,7), (206,13), (212,3), (221,2), (236,7), (239,3), (245,13), (251,7), (260,7), (269,5), (279,5), (284,0), (296,11), (302,2), (306,5), (314,13), (333,6), (341,14), (349,0), (355,1), (364,13), (379,12), (383,5), (395,8)}

T'$_{59}$={(0,4), (9,8), (17,0), (21,9), (32,9), (40,12), (46,1), (52,12), (57,6), (61,10), (76,4), (89,6), (98,0), (105,1), (117,15), (123,5), (134,7), (141,1), (151,9), (158,11), (166,1), (179,11), (189,2), (198,1), (205,2), (211,1), (220,1), (234,1), (238,1), (242,7), (250,5), (259,3), (263,13), (274,0), (283,4), (295,3), (301,6), (305,4), (312,4), (332,12), (340,13), (348,12), (354,0), (361,0), (372,14), (381,11), (394,10)}

T'$_{0}$={(5,12), (12,4), (20,9), (38,0), (56,9), (71,12), (82,13), (90,15), (99,15), (111,15), (121,8), (129,9), (152,13), (161,7), (168,11), (177,13), (194,8), (202,9), (213,1), (224,14), (232,5), (245,9), (260,5), (273,4), (284,8), (292,4), (309,5), (326,0), (337,1), (343,1), (351,4), (365,12), (375,12), (383,0), (391,3)}

T'$_{1}$={(3,10), (9,8), (19,0), (35,1), (48,13), (63,8), (78,2), (88,1), (97,0), (110,13), (120,9), (128,15), (150,12), (159,13), (165,13), (175,12), (193,1), (200,9), (212,13), (223,13), (228,7), (241,7), (255,5), (272,4), (278,5), (291,2), (302,4), (312,5), (335,4), (342,10), (350,1), (364,0), (373,4), (379,0), (389,0)}

T'$_{2}$={(2,8), (7,12), (15,0), (34,8), (46,0), (62,1), (77,3), (85,9), (93,12), (107,14), (117,7), (127,14), (134,12), (158,9), (164,4), (172,12), (185,9), (199,3), (207,13), (217,3), (227,5), (240,7), (251,5), (268,4), (276,6), (289,6), (299,4), (311,3), (334,9), (340,14), (349,9), (361,8), (369,2), (377,0), (388,4)}

T'$_{3}$={(1,8), (6,8), (14,12), (26,4), (45,13), (57,3), (75,8), (83,13), (92,4), (104,5), (116,9), (125,15), (131,5), (156,1), (163,5), (171,9), (180,5), (195,9), (204,3), (214,13), (226,10), (236,14), (250,12), (267,4), (275,9), (288,1), (297,12), (310,4), (330,10), (338,6), (347,4), (357,14), (367,6), (376,12), (384,1)}

T'$_{4}$={(10,8), (17,1), (30,12), (46,12), (65,13), (81,13), (100,9), (112,13), (128,5), (137,0), (155,0), (161,0), (174,8), (180,8), (188,8), (196,0), (202,1), (214,4), (226,12), (239,0), (251,5), (263,0), (270,5), (285,12), (295,5), (308,5), (315,13), (323,1), (338,1), (347,5), (363,5), (373,13), (382,1), (392,5), (397,5)}

T'$_{5}$={(8,9), (14,8), (29,9), (45,0), (60,0), (78,12), (99,5), (111,5), (127,12), (136,1), (143,4), (160,0), (170,12), (178,8), (187,8), (192,1), (200,0), (210,1), (224,0), (236,8), (249,1), (259,9), (267,1), (282,0), (292,8), (306,9), (312,13), (322,5), (328,5), (346,13), (361,1), (372,5), (380,4), (390,5), (395,9)}

T'$_{6}$={(5,0), (13,4), (24,13), (37,4), (56,4), (77,13), (94,5), (107,4), (125,0), (134,1), (141,12), (158,9), (169,9), (177,4), (186,12), (191,8), (199,8), (207,8), (221,9), (233,1), (246,1), (257,9), (266,0), (280,8), (291,0), (305,12), (311,1), (321,12), (327,13), (343,5), (356,13), (369,5), (376,1), (389,13), (394,8)}

T'$_{7}$={(2,4), (12,8), (23,12), (33,9), (47,8), (73,13), (89,12), (102,9), (117,4), (133,12), (138,12), (157,12), (163,8), (176,4), (182,8), (189,8), (198,8), (204,4), (217,2), (228,9), (241,0), (256,8), (264,1), (271,9), (286,1), (302,12), (309,4), (316,1), (324,5), (342,12), (349,0), (367,5), (374,4), (387,5), (393,1)}

T'$_{8}$={(5,3), (15,0), (22,11), (39,5), (46,15), (53,14), (61,11), (74,14), (88,5), (95,6), (105,6), (130,12), (142,11), (160,7), (182,12), (191,6), (205,8), (224,0), (233,0), (239,1), (248,1), (253,9), (264,7), (274,8), (287,1), (297,5), (304,11), (314,15), (322,10), (331,11), (345,0), (360,1), (375,9), (387,1), (399,13)}

T'$_{9}$={(3,3), (13,3), (21,6), (38,6), (44,3), (51,7), (59,6), (73,10), (86,14), (92,10), (104,6), (128,3), (139,6), (156,14), (176,12), (186,9), (204,0), (217,4), (230,4), (238,8), (247,12), (251,1), (262,3), (271,1), (286,11), (296,7), (302,11), (309,15), (317,10), (327,15), (335,9), (358,9), (371,3), (379,1), (396,15)}

T'$_{10}$={(2,14), (12,11), (20,13), (36,13), (43,0), (48,13), (58,8), (71,10), (85,7), (90,2), (103,4), (115,8), (136,2), (155,0), (171,10), (185,12), (199,10), (213,1), (228,0), (236,1), (246,13), (250,4), (258,5), (270,4), (280,2), (294,12), (301,7), (308,11), (316,14), (326,8), (334,5), (351,9), (363,3), (378,2), (394,13)}

T'$_{11}$={(1,2), (6,10), (19,13), (33,10), (40,12), (47,3), (57,15), (70,7), (79,1), (89,5), (99,14), (111,10), (133,4), (145,14), (168,5), (183,8), (193,15), (207,5), (226,0), (234,12), (240,3), (249,8), (254,0), (268,6), (277,5), (293,3), (299,7), (306,3), (315,8), (325,11), (333,1), (348,13), (362,15), (376,7), (389,11)}

T'$_{12}$={(7,13), (18,3), (32,4), (53,1), (64,15), (75,14), (90,8), (100,8), (105,15), (110,5), (121,12), (132,11), (140,9), (152,6), (164,12), (171,12), (181,6), (188,1), (199,15), (215,6), (235,2), (248,0), (256,0), (266,4), (281,2), (292,10), (299,15), (314,7), (327,0), (346,3), (353,1), (369,15), (374,6), (386,3), (399,10)}

T'$_{13}$={(4,7), (15,5), (30,7), (50,5), (60,8), (71,9), (85,10), (96,11), (104,4), (109,13), (116,0), (131,9), (137,11), (149,0), (162,0), (168,9), (180,5), (184,11), (197,6), (213,15), (234,6), (247,6), (255,2), (265,2), (280,4), (291,2), (297,0), (306,3), (325,10), (338,8), (352,8), (366,10), (373,13), (382,5), (396,8)}

T'$_{14}$={(3,15), (14,6), (29,12), (40,5), (55,8), (70,5), (81,5), (95,9), (103,0), (108,13), (113,9), (124,13), (136,12), (145,9), (159,5), (167,1), (176,0), (183,10), (190,9), (209,11), (232,0), (244,2), (254,2), (260,7), (278,0), (288,10), (295,4), (304,2), (322,11), (336,6), (351,9), (364,10), (371,15), (377,14), (389,7)}

T'$_{15}$={(2,4), (9,8), (22,4), (36,14), (54,11), (68,12), (77,2), (91,11), (101,5), (107,13), (111,9), (123,12), (133,1), (144,12), (155,7), (166,6), (174,5), (182,0), (189,1), (203,6), (223,3), (240,10), (253,6), (257,10), (274,0), (286,2), (294,1), (301,2), (321,1), (334,11), (348,3), (355,11), (370,14), (376,15), (387,2)}

T'$_{16}$={(16,9), (21,1), (31,1), (39,0), (55,0), (72,11), (78,3), (87,8), (99,7), (114,3), (120,15), (132,0), (147,2), (167,6), (175,10), (188,10), (200,3), (208,12), (217,0), (228,12), (242,14), (255,8), (261,7), (268,8), (278,15), (289,11), (298,4), (315,1), (324,5), (342,13), (356,4), (360,5), (365,0), (385,1), (398,11)}

T'$_{17}$={(5,9), (19,0), (29,8), (37,5), (50,9), (67,15), (76,5), (84,0), (96,2), (110,0), (119,10), (128,10), (143,2), (164,13), (174,8), (182,14), (199,9), (207,0), (213,7), (223,2), (241,6), (254,1), (259,11), (265,15), (277,11), (286,13), (297,3), (311,1), (320,4), (339,13), (348,7), (359,2), (364,8), (375,8), (393,5)}

T'$_{18}$={(1,5), (18,0), (28,9), (36,1), (44,13), (58,7), (74,11), (81,2), (93,7), (108,2), (118,10), (125,11), (140,3), (155,13), (173,11), (181,4), (195,10), (206,15), (212,7), (222,4), (231,12), (253,6), (257,6), (264,7), (275,15), (285,3), (295,0), (307,11), (318,5), (338,8), (347,13), (358,13), (363,1), (371,3), (389,0)}

T'$_{19}$={(0,0), (17,1), (26,0), (34,7), (40,15), (56,0), (73,1), (80,3), (89,5), (107,14), (117,1), (123,11), (138,10), (152,14), (171,2), (180,7), (191,2), (204,14), (211,6), (218,15), (230,9), (249,15), (256,1), (262,12), (269,12), (280,11), (293,13), (300,12), (316,6), (326,9), (346,5), (357,2), (361,0), (368,13), (388,3)}

T'$_{20}$={(12,3), (24,15), (35,10), (41,9), (49,7), (65,0), (84,5), (105,14), (114,14), (121,8), (131,14), (137,10), (144,0), (159,12), (176,0), (193,13), (197,4), (214,5), (222,3), (228,9), (236,3), (247,4), (263,8), (274,10), (282,8), (294,10), (308,2), (319,0), (332,4), (338,11), (354,5), (360,1), (368,14), (379,6), (398,15)}

T'$_{21}$={(8,11), (21,9), (34,11), (40,7), (45,14), (61,13), (83,15), (101,5), (113,6), (119,0), (129,1), (136,8), (142,15), (154,11), (175,3), (186,3), (196,3), (210,0), (219,4), (227,9), (235,5), (245,2), (262,8), (272,1), (281,0), (291,14), (303,10), (317,0), (329,2), (336,0), (353,3), (359,6), (366,2), (378,12), (388,14)}

T'$_{22}$={(6,9), (19,14), (31,14), (38,6), (44,4), (59,5), (76,10), (88,12), (109,6), (117,3), (124,4), (135,9), (141,8), (151,7), (169,15), (184,1), (195,4), (209,15), (218,14), (225,5), (232,5), (243,8), (250,0), (267,1), (278,15), (288,14), (300,11), (313,8), (327,1), (335,2), (351,4), (356,10), (363,2), (376,10), (385,7)}

T'$_{23}$={(1,14), (18,10), (25,10), (37,8), (43,3), (53,7), (72,11), (86,11), (108,5), (115,13), (122,7), (132,1), (139,3), (148,12), (166,1), (183,13), (194,3), (205,4), (217,10), (223,0), (229,9), (241,1), (248,5), (266,5), (275,1), (287,15), (298,1), (309,10), (325,2), (333,2), (350,10), (355,5), (362,15), (373,6), (383,1)}

T'$_{24}$={(11,15), (22,5), (33,1), (42,8), (55,11), (71,9), (78,10), (86,10), (95,11), (104,9), (112,9), (120,1), (134,4), (147,0), (155,10), (171,3), (188,0), (201,10), (208,13), (217,8), (231,5), (241,6), (261,3), (266,1), (279,2), (290,6), (296,4), (313,10), (326,0), (342,7), (358,11), (371,3), (388,2), (395,2), (399,3)}

T'$_{25}$={(7,10), (16,11), (31,12), (38,13), (54,14), (70,1), (76,8), (84,9), (93,0), (103,1), (111,1), (119,1), (131,1), (139,15), (153,2), (170,11), (185,3), (198,1), (207,14), (216,7), (229,5), (237,6), (258,6), (264,2), (273,14), (288,0), (295,10), (308,12), (325,1), (341,10), (356,1), (370,3), (387,4), (392,5), (398,7)}

T'$_{26}$={(6,3), (15,3), (28,12), (36,13), (44,1), (69,9), (75,9), (81,1), (88,13), (102,1), (110,4), (117,2), (130,1), (138,9), (150,11), (168,7), (180,11), (196,3), (205,7), (215,2), (227,14), (234,0), (248,0), (263,5), (269,6), (287,15), (294,1), (302,11), (321,14), (336,4), (355,13), (369,9), (385,2), (391,8), (397,5)}

T'$_{27}$={(4,8), (13,11), (27,3), (34,13), (43,12), (57,12), (73,14), (80,8), (87,13), (101,0), (107,1), (114,9), (122,8), (135,10), (149,3), (165,13), (173,8), (193,10), (203,11), (211,4), (220,3), (233,14), (242,6), (262,14), (268,12), (283,14), (292,2), (300,4), (317,6), (332,10), (343,7), (365,7), (377,2), (390,7), (396,1)}

T'$_{28}$={(4,8), (18,14), (27,14), (38,14), (52,14), (63,14), (74,6), (84,0), (107,13), (121,2), (131,7), (139,1), (147,5), (154,10), (173,11), (184,3), (189,6), (204,3), (215,6), (225,1), (232,13), (242,10), (248,9), (255,9), (263,0), (270,9), (285,9), (292,5), (308,1), (318,12), (328,9), (341,0), (360,10), (375,3), (396,11)}

T'$_{29}$={(3,6), (17,10), (25,14), (36,3), (48,0), (62,12), (69,0), (82,4), (103,2), (118,12), (129,6), (138,6), (146,3), (153,9), (168,0), (183,8), (187,2), (203,11), (209,1), (224,9), (231,7), (238,2), (247,1), (253,0), (262,9), (269,0), (281,9), (290,8), (306,0), (317,3), (324,12), (340,7), (348,11), (372,11), (390,6)}

T'$_{30}$={(1,1), (15,15), (22,8), (33,10), (45,11), (59,3), (66,14), (80,2), (99,8), (110,1), (125,3), (137,10), (145,7), (151,2), (165,3), (179,9), (186,2), (196,4), (206,5), (222,1), (229,3), (237,2), (245,5), (251,3), (259,1), (268,1), (276,9), (289,11), (297,1), (314,0), (322,12), (339,13), (347,15), (368,5), (382,4)}

T'$_{31}$={(0,15), (10,9), (20,9), (31,4), (41,10), (55,10), (64,3), (77,5), (87,6), (108,10), (122,7), (132,7), (142,15), (148,11), (157,0), (175,15), (185,1), (194,9), (205,11), (219,1), (226,1), (234,0), (243,11), (250,2), (256,4), (267,3), (271,8), (286,10), (293,10), (309,1), (320,13), (336,12), (346,15), (367,0), (378,6)}

T'$_{32}$={(11,9), (26,4), (34,2), (51,8), (57,2), (64,2), (69,5), (83,12), (98,4), (103,8), (118,4), (130,2), (145,0), (152,14), (162,2), (170,10), (181,2), (196,14), (205,0), (214,3), (239,10), (244,14), (254,8), (277,8), (288,7), (305,14), (312,6), (323,11), (330,11), (345,5), (352,7), (361,14), (372,9), (382,6), (394,7)}

T'$_{33}$={(8,11), (25,1), (33,5), (50,3), (56,7), (63,12), (68,12), (80,9), (97,3), (101,2), (109,5), (127,5), (140,4), (151,6), (161,4), (169,1), (179,0), (193,3), (203,0), (211,2), (233,9), (243,8), (251,0), (276,10), (285,3), (304,12), (310,7), (318,13), (329,10), (344,14), (350,13), (357,3), (370,12), (380,12), (392,0)}

T'$_{34}$={(3,13), (24,3), (31,4), (44,0), (54,8), (60,1), (67,1), (72,7), (95,13), (100,8), (108,8), (126,11), (138,9), (149,6), (158,14), (166,1), (178,8), (190,0), (202,1), (209,2), (231,9), (242,6), (247,9), (268,7), (284,10), (295,0), (308,10), (317,14), (328,6), (340,13), (347,6), (355,4), (367,3), (377,7), (389,9)}

T'$_{35}$={(2,8), (16,14), (28,12), (39,4), (52,14), (58,8), (66,3), (70,7), (90,9), (99,12), (105,2), (119,5), (133,0), (147,1), (156,15), (163,1), (177,2), (186,4), (201,2), (207,11), (227,3), (241,2), (245,13), (257,0), (282,10), (292,4), (307,13), (314,12), (324,11), (335,11), (346,7), (354,3), (365,5), (376,4), (386,2)}

T'$_{36}$={(5,15), (21,2), (33,10), (54,8), (70,0), (80,10), (86,6), (96,10), (111,1), (123,10), (141,7), (152,4), (159,13), (171,4), (177,9), (190,9), (199,0), (204,14), (220,8), (233,6), (247,1), (257,7), (265,11), (271,11), (286,2), (302,2), (316,8), (331,13), (339,9), (346,6), (363,4), (369,2), (378,11), (390,10), (397,11)}

T'$_{37}$={(4,1), (20,2), (32,6), (53,7), (68,0), (74,3), (84,13), (92,5), (102,13), (118,4), (139,2), (149,2), (158,1), (170,6), (175,1), (184,12), (198,12), (202,12), (216,15), (230,12), (246,15), (255,12), (264,14), (270,8), (279,6), (298,14), (313,15), (330,10), (335,6), (345,10), (362,14), (368,1), (377,3), (387,4), (395,0)}

T'$_{38}$={(3,11), (10,0), (26,1), (46,2), (62,5), (73,9), (82,10), (91,4), (99,2), (116,5), (138,8), (146,14), (157,3), (167,0), (174,1), (181,4), (196,0), (201,0), (208,5), (229,15), (237,8), (252,10), (263,2), (269,0), (275,10), (296,10), (311,3), (320,2), (333,2), (344,6), (351,10), (367,4), (375,1), (384,11), (394,1)}

T'$_{39}$={(1,2), (9,7), (25,8), (37,4), (58,3), (72,0), (81,2), (89,0), (97,5), (115,5), (132,6), (143,7), (154,4), (162,0), (172,4), (178,14), (195,8), (200,0), (207,3), (226,0), (235,8), (248,7), (258,3), (267,2), (272,8), (293,0), (307,7), (319,14), (332,8), (340,2), (350,10), (366,14), (373,0), (380,0), (392,3)}

T'$_{40}$={(6,11), (11,4), (18,2), (38,2), (49,0), (53,6), (62,6), (79,2), (92,8), (101,14), (112,2), (124,14), (133,10), (145,8), (157,0), (165,8), (174,2), (192,14), (209,2), (222,2), (237,2), (252,14), (258,14), (273,14), (292,2), (303,14), (320,6), (330,4), (336,8), (343,4), (358,8), (376,4), (381,10), (391,8), (399,4)}

T'$_{41}$={(4,6), (10,0), (17,0), (34,8), (45,2), (52,6), (61,8), (74,2), (91,6), (98,10), (111,10), (122,2), (130,0), (144,8), (156,0), (161,0), (173,4), (191,14), (206,15), (220,6), (232,8), (245,0), (257,10), (267,2), (290,10), (301,2), (319,6), (326,6), (333,8), (340,0), (352,8), (372,0), (379,4), (389,8), (397,12)}

T'$_{42}$={(3,2), (9,10), (16,14), (31,6), (43,0), (51,12), (60,2), (69,8), (88,0), (97,0), (108,10), (116,10), (129,8), (143,0), (151,10), (159,10), (171,8), (184,2), (204,0), (219,6), (228,2), (244,12), (255,8), (262,8), (279,8), (299,10), (315,0), (324,2), (332,0), (339,0), (349,0), (367,14), (378,12), (388,0), (394,0)}

T'$_{43}$={(0,10), (8,0), (13,12), (30,10), (42,7), (50,8), (58,10), (67,0), (87,4), (93,2), (104,2), (115,2), (126,8), (135,2), (150,8), (158,10), (170,2), (182,14), (198,4), (216,12), (226,6), (240,14), (253,10), (259,4), (278,6), (296,6), (310,6), (323,8), (331,4), (337,10), (344,4), (366,8), (377,14), (383,12), (393,6)}

T'$_{44}$={(13,10), (20,10), (37,2), (48,12), (57,11), (73,3), (83,2), (93,11), (98,5), (113,4), (126,7), (138,1), (147,11), (151,3), (164,9), (169,7), (181,5), (193,3), (203,13), (215,1), (220,3), (227,6), (233,2), (244,6), (256,1), (276,8), (286,1), (303,2), (317,0), (327,0), (348,8), (360,8), (373,0), (390,10), (398,10)}

T'$_{45}$={(10,10), (18,10), (32,10), (45,0), (52,6), (66,0), (82,3), (92,11), (97,3), (109,3), (119,1), (135,5), (146,9), (150,3), (159,1), (168,3), (180,1), (192,3), (202,3), (213,3), (219,5), (226,3), (231,2), (239,1), (250,9), (275,2), (283,8), (300,2), (312,0), (323,0), (345,8), (359,12), (371,4), (388,1), (397,0)}

T'$_{46}$={(6,8), (16,2), (30,0), (42,14), (51,7), (61,1), (78,11), (90,10), (96,15), (108,0), (116,1), (131,3), (144,5), (149,1), (154,3), (167,3), (178,3), (186,5), (198,5), (212,9), (218,15), (225,1), (230,8), (238,2), (249,11), (265,2), (280,0), (296,2), (311,0), (319,0), (336,0), (358,8), (367,10), (375,8), (394,2)}

T'$_{47}$={(4,2), (15,10), (23,6), (39,14), (49,2), (59,11), (75,14), (87,13), (95,1), (106,7), (115,7), (130,14), (142,7), (148,0), (153,3), (166,11), (170,9), (183,1), (197,3), (210,9), (217,1), (221,1), (229,12), (235,10), (246,5), (262,7), (279,14), (291,0), (309,0), (318,12), (329,0), (354,8), (364,0), (374,0), (391,10)}

T'$_{48}$={(11,13), (23,0), (30,11), (48,7), (63,3), (70,2), (83,7), (94,11), (101,1), (113,9), (121,1), (128,1), (142,5), (163,9), (176,1), (180,2), (189,0), (202,8), (219,2), (227,6), (241,0), (250,4), (256,0), (265,0), (277,2), (290,2), (311,2), (321,10), (325,0), (335,10), (344,10), (353,8), (360,1), (384,11), (397,3)}

T'$_{49}$={(8,1), (22,11), (28,9), (46,3), (62,3), (66,7), (82,5), (86,5), (100,15), (112,9), (120,1), (127,11), (141,9), (162,3), (172,5), (179,6), (187,7), (198,6), (218,0), (225,0), (240,2), (249,4), (254,8), (263,4), (273,4), (287,2), (307,10), (316,10), (324,0), (334,10), (341,14), (350,4), (359,12), (383,14), (393,13)}

T'$_{50}$={(7,3), (16,1), (27,8), (45,7), (59,1), (65,7), (80,3), (85,11), (98,9), (109,0), (117,5), (124,3), (140,9), (160,5), (167,11), (178,1), (185,0), (192,15), (208,10), (224,3), (239,3), (243,6), (252,8), (260,1), (272,0), (284,4), (301,10), (313,12), (323,12), (331,2), (337,10), (349,6), (358,2), (380,4), (392,2)}

T'$_{51}$={(1,3), (14,2), (24,15), (44,9), (50,3), (64,3), (76,1), (84,9), (97,5), (102,3), (114,7), (123,1), (134,3), (152,1), (165,1), (177,0), (181,1), (190,2), (206,2), (221,4), (233,6), (242,0), (251,8), (259,1), (270,1), (278,2), (293,6), (312,6), (322,12), (330,8), (336,8), (347,10), (355,0), (369,2), (391,3)}

T'$_{52}$={(11,11), (23,3), (31,9), (41,11), (48,7), (53,3), (71,1), (88,7), (102,7), (114,2), (123,3), (130,4), (146,3), (154,0), (162,6), (175,8), (190,9), (199,0), (209,0), (214,0), (222,0), (230,0), (246,0), (271,0), (282,0), (290,0), (304,8), (314,4), (319,12), (334,1), (350,1), (354,11), (368,9), (382,4), (399,4)}

T'$_{53}$={(9,1), (15,1), (27,1), (36,9), (47,1), (52,1), (69,13), (86,9), (97,2), (113,10), (122,1), (129,1), (144,1), (152,3), (160,10), (173,8), (183,6), (195,7), (208,6), (213,8), (221,10), (229,10), (243,9), (266,4), (281,6), (289,12), (300,0), (312,0), (318,10), (329,0), (347,9), (353,0), (365,11), (380,3), (386,1)}

T'$_{54}$={(7,0), (13,1), (25,3), (35,9), (43,3), (51,13), (65,15), (85,9), (96,3), (106,7), (120,2), (127,1), (142,11), (148,15), (157,9), (166,14), (179,11), (193,4), (206,1), (212,2), (218,1), (224,10), (236,2), (261,10), (276,10), (284,8), (298,10), (307,4), (316,2), (325,12), (342,4), (352,2), (364,13), (372,0), (385,1)}

T'$_{55}$={(5,3), (12,3), (24,3), (33,9), (42,3), (49,11), (58,5), (81,3), (94,11), (104,15), (115,3), (125,5), (140,3), (147,5), (156,2), (165,12), (176,2), (192,10), (205,2), (210,10), (216,10), (223,8), (231,2), (249,13), (273,6), (283,0), (293,2), (305,8), (315,0), (320,8), (338,3), (351,2), (361,9), (371,3), (384,0)}

T'$_{56}$={(19,2), (29,0), (40,8), (51,2), (58,2), (66,3), (77,0), (82,12), (92,11), (105,10), (112,15), (124,13), (133,11), (143,9), (155,1), (172,1), (184,8), (197,11), (211,3), (225,11), (240,3), (264,3), (276,5), (287,1), (298,2), (313,0), (319,12), (327,1), (334,2), (359,1), (370,10), (379,1), (386,4), (393,0), (399,0)}

T'$_{57}$={(12,0), (26,10), (34,0), (49,0), (55,0), (64,0), (75,9), (81,9), (91,15), (100,11), (110,2), (120,3), (132,3), (141,2), (153,7), (167,8), (183,0), (194,3), (208,13), (223,3), (238,3), (259,1), (275,9), (282,9), (294,0), (310,1), (318,0), (322,1), (331,0), (340,2), (368,8), (374,2), (384,4), (391,3), (398,10)}

T'$_{58}$={(6,0), (25,8), (32,0), (47,0), (54,8), (63,0), (72,8), (79,5), (90,1), (95,0), (109,11), (118,9), (126,15), (140,11), (146,11), (163,7), (178,1), (187,11), (206,3), (219,1), (237,9), (252,9), (274,9), (280,9), (293,9), (301,1), (316,12), (321,10), (330,0), (339,0), (365,5), (372,2), (382,8), (388,4), (396,2)}

T'$_{59}$={(0,8), (20,0), (30,2), (41,0), (52,2), (60,0), (69,1), (78,0), (87,4), (94,1), (106,10), (115,1), (125,0), (135,3), (145,9), (161,11), (175,15), (186,1), (201,3), (216,3), (235,9), (246,11), (273,2), (277,11), (289,5), (300,3), (315,10), (320,8), (328,2), (337,4), (362,8), (371,1), (381,8), (387,0), (395,2)}

T'$_{60}$={(11,0), (26,2), (32,3), (42,1), (59,0), (67,11), (74,10), (87,1), (106,9), (121,11), (131,9), (136,1), (149,1), (158,3), (165,9), (174,3), (185,1), (195,9), (208,1), (215,11), (227,11), (243,9), (260,0), (272,1), (283,9), (291,11), (310,2), (323,3), (337,8), (342,0), (349,10), (359,0), (374,10), (383,8), (395,0)}

T'$_{61}$={(8,8), (21,8), (29,0), (39,11), (56,0), (65,3), (72,3), (84,8), (102,1), (118,0), (127,1), (135,1), (142,1), (157,1), (163,1), (173,1), (184,1), (194,9), (203,3), (214,3), (221,1), (234,3), (253,1), (271,11), (282,2), (289,8), (306,10), (319,9), (333,2), (341,10), (345,0), (356,0), (370,0), (381,8), (391,8)}

T'$_{62}$={(4,10), (16,0), (28,2), (38,2), (54,10), (63,1), (71,3), (82,0), (94,8), (116,8), (126,9), (134,1), (140,1), (156,1), (162,11), (172,0), (181,1), (191,3), (201,1), (212,8), (219,8), (232,3), (252,2), (265,9), (281,10), (288,10), (303,3), (318,11), (330,1), (339,2), (344,0), (353,8), (366,8), (379,10), (390,2)}

T'$_{63}$={(2,2), (13,0), (27,10), (36,0), (51,2), (61,0), (68,0), (79,1), (88,3), (112,11), (124,3), (132,0), (139,1), (150,1), (159,1), (166,2), (179,1), (189,1), (197,0), (209,8), (218,11), (230,3), (244,11), (261,11), (273,1), (285,8), (294,2), (317,2), (329,1), (338,2), (343,2), (350,0), (362,3), (377,0), (384,0)}

T'$_{64}$={(19,6), (30,7), (54,4), (64,6), (72,0), (77,4), (89,6), (96,5), (113,14), (126,12), (137,14), (148,2), (155,2), (164,2), (182,12), (190,1), (210,12), (218,3), (228,10), (237,1), (252,0), (261,1), (270,1), (279,0), (288,1), (298,1), (302,1), (308,1), (321,5), (331,10), (337,5), (356,5), (366,5), (385,1), (398,6)}

T'$_{65}$={(17,3), (29,6), (47,14), (63,1), (71,13), (76,10), (85,7), (94,3), (106,2), (122,2), (136,10), (147,4), (153,14), (163,7), (176,1), (189,0), (203,5), (216,0), (225,7), (236,0), (245,1), (260,7), (269,5), (277,5), (285,9), (297,9), (301,0), (305,1), (315,1), (328,5), (335,7), (355,4), (355,4), (362,6), (381,1), (397,5)}

T'$_{66}$={(11,5), (27,6), (42,6), (56,2), (67,2), (75,12), (80,0), (93,6), (100,0), (118,2), (133,6), (144,14), (151,0), (162,6), (169,3), (187,3), (197,1), (212,0), (224,4), (235,8), (244,7), (258,3), (266,1), (276,2), (284,7), (295,7), (300,3), (304,3), (313,1), (326,5), (334,1), (344,4), (358,4), (374,4), (395,4)}

T'$_{67}$={(7,4), (22,5), (35,14), (55,4), (66,0), (73,0), (79,0), (90,4), (98,4), (116,4), (128,6), (141,2), (150,0), (157,2), (167,1), (185,4), (191,11), (211,0), (220,11), (232,3), (238,9), (256,1), (265,7), (275,3), (280,7), (290,1), (299,3), (303,1), (311,0), (325,2), (332,13), (341,5), (357,5), (373,4), (386,13)}

T'$_{68}$={(12,1), (22,5), (28,9), (39,1), (44,10), (57,1), (68,5), (85,1), (94,4), (105,4), (112,7), (126,1), (145,12), (160,4), (172,0), (188,0), (195,4), (213,11), (231,0), (244,4), (252,4), (264,0), (272,0), (284,0), (299,10), (307,7), (322,7), (331,10), (346,0), (354,2), (363,3), (369,5), (382,7), (386,0), (399,1)}

T'$_{69}$={(7,2), (21,5), (27,2), (37,1), (43,1), (53,5), (65,5), (83,2), (92,3), (104,0), (109,7), (120,7), (144,4), (154,5), (169,2), (179,7), (194,8), (201,5), (230,4), (243,0), (249,4), (258,0), (271,0), (283,0), (298,7), (306,4), (321,1), (329,2), (345,3), (353,5), (362,0), (368,5), (381,2), (385,6), (396,1)}

T'$_{70}$={(2,5), (19,1), (24,3), (35,13), (41,0), (47,0), (64,5), (79,1), (91,1), (103,3), (107,5), (119,5), (143,2), (153,5), (168,0), (178,4), (192,8), (200,0), (229,1), (242,4), (247,4), (254,4), (269,7), (281,2), (289,2), (305,3), (320,14), (328,6), (343,0), (352,11), (359,1), (365,6), (378,5), (384,12), (393,3)}

T'$_{71}$={(0,1), (14,5), (23,7), (32,1), (40,1), (46,1), (62,11), (77,7), (86,4), (95,4), (106,8), (113,2), (135,1), (146,13), (164,6), (177,13), (190,4), (196,0), (215,4), (235,0), (246,6), (253,4), (266,4), (274,4), (287,6), (304,1), (309,6), (327,7), (333,6), (351,1), (357,2), (364,7), (374,0), (383,3), (390,3)}

T'$_{72}$={(14,2), (26,2), (39,4), (48,3), (61,2), (67,14), (74,4), (89,6), (100,4), (122,4), (128,0), (136,4), (148,4), (161,4), (174,1), (188,6), (202,0), (216,1), (223,3), (239,5), (260,13), (272,5), (279,1), (287,0), (297,1), (307,5), (323,3), (332,1), (343,3), (352,1), (357,0), (366,0), (380,1), (387,4), (398,5)}

T'$_{73}$={(10,6), (24,7), (35,5), (47,7), (60,2), (66,5), (70,4), (79,2), (98,7), (114,0), (125,14), (134,6), (146,5), (160,4), (173,0), (187,1), (200,7), (215,1), (222,5), (238,0), (257,1), (268,1), (278,5), (285,3), (296,1), (305,5), (314,1), (329,0), (342,3), (349,1), (356,9), (363,1), (378,5), (386,5), (396,5)}

T'$_{74}$={(9,3), (23,7), (29,12), (43,3), (50,0), (65,0), (69,4), (76,2), (93,6), (106,1), (124,14), (130,4), (143,5), (154,0), (170,4), (182,5), (192,1), (211,9), (221,1), (234,5), (255,5), (267,7), (277,3), (283,6), (294,1), (304,0), (313,2), (328,2), (341,0), (348,1), (354,1), (361,13), (375,0), (385,0), (393,7)}

T'$_{75}$={(0,2), (17,6), (28,5), (41,5), (49,4), (62,4), (68,2), (75,6), (91,4), (103,4), (123,6), (129,4), (137,4), (150,5), (164,0), (177,4), (191,0), (210,3), (220,0), (225,0), (254,0), (261,7), (274,3), (281,1), (290,1), (303,1), (310,0), (326,1), (337,0), (344,1), (353,2), (360,1), (370,5), (381,4), (392,6)}

T'$_{76}$={(9,8), (18,10), (25,5), (40,12), (49,1), (56,0), (61,10), (78,6), (96,0), (105,1), (119,1), (129,0), (141,1), (153,4), (161,11), (179,11), (194,5), (201,13), (211,1), (221,2), (237,8), (242,7), (251,7), (261,14), (274,0), (284,0), (299,5), (305,4), (314,13), (339,7), (348,12), (355,1), (370,13), (381,11), (395,8)}

T'$_{77}$={(8,4), (17,0), (23,13), (37,0), (46,1), (55,9), (60,4), (76,4), (91,8), (102,6), (117,15), (127,15), (139,10), (151,9), (160,1), (172,2), (189,2), (200,7), (210,9), (220,1), (236,7), (240,1), (250,5), (260,7), (270,9), (283,4), (296,11), (303,5), (312,4), (333,6), (345,13), (354,0), (364,13), (380,4), (394,10)}

T'₇₈={(5,12), (14,8), (21,9), (35,12), (42,0), (52,12), (59,14), (68,0), (89,6), (101,8), (114,5), (123,5), (137,9), (149,4), (158,11), (169,12), (188,9), (198,1), (206,13), (214,11), (234,1), (239,3), (248,13), (259,3), (269,5), (282,6), (295,3), (302,2), (310,9), (332,12), (341,14), (352,12), (361,0), (379,12), (392,10)}

T'₇₉={(0,4), (10,12), (20,4), (32,9), (41,8), (50,13), (57,6), (67,0), (83,0), (98,0), (110,2), (121,10), (134,7), (148,13), (156,10), (166,1), (187,6), (197,0), (205,2), (212,3), (222,1), (238,1), (245, 13), (258,5), (263,13), (279,5), (291,5), (301,6), (306,5), (324,5), (340,13), (349,0), (357,8), (372,14), (383,5)}     (32)

Figure 5:
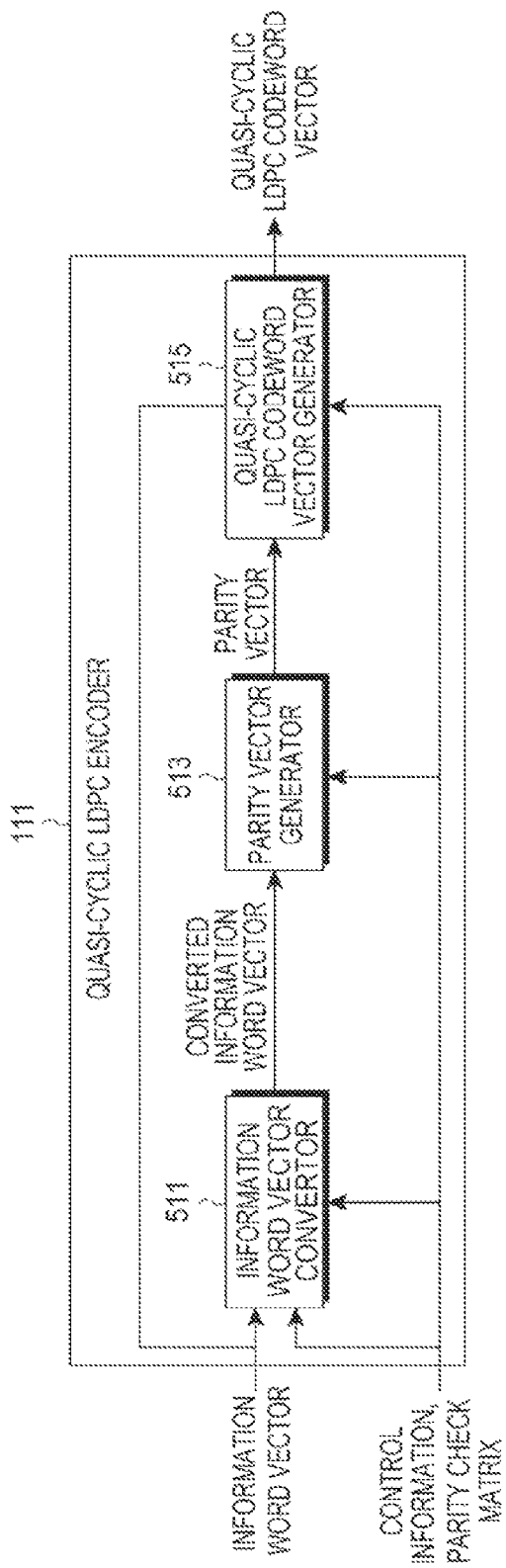
FIG. 5 is a block diagram illustrating a quasi-cyclic LDPC encoder according to an embodiment of the present invention.

FIG. 5 is a block diagram illustrating a quasi-cyclic LDPC encoder according to an embodiment of the present invention.

Referring to FIG. 5, a quasi-cyclic LDPC encoder 111 includes an information word vector convertor 511, a parity vector generator 513, and a quasi-cyclic LDPC codeword vector generator 515.

Upon inputting an information word vector, the information word vector convertor 511 generates a converted information word vector by performing a conversion operation on the information word vector, based on control information and a parity check matrix, and outputs the converted information word vector to the parity vector generator 513. For example, the conversion operation may be a padding operation in which zeros are inserted into the information word vector, based on the control information and the parity check matrix.

The parity vector generator 513 converts the information word vector output from the information word vector convertor 511 into a parity vector based on the control information and the parity check matrix, and outputs the parity vector to the quasi-cyclic LDPC codeword vector generator 515. The quasi-cyclic LDPC codeword vector generator 515 generates a quasi-cyclic LDPC codeword vector by concatenating the parity vector and the information word vector, based on the control information.

Alternatively, the quasi-cyclic LDPC codeword vector generator 515 may generate the quasi-cyclic LDPC codeword vector by concatenating a converted parity vector and the information word vector. The converted parity vector is generated by puncturing the parity vector.

Figure 6:
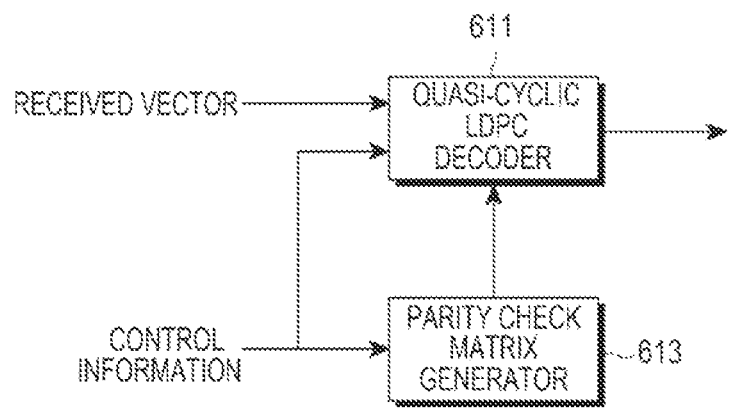
FIG. 6 is a block diagram illustrating a quasi-cyclic LDPC code decoder included in a signal reception apparatus in an MMT system according to an embodiment of the present invention.

FIG. 6 is a block diagram illustrating a quasi-cyclic LDPC code decoder included in a signal reception apparatus in an MMT system according to an embodiment of the present invention.

Referring to FIG. 6, a quasi-cyclic LDPC code decoder includes a quasi-cyclic LDPC decoder 611 and a parity check matrix generator 613.

A received vector is input to the quasi-cyclic LDPC decoder 611. For example, the received vector may be a quasi-cyclic LDPC vector output from a quasi-cyclic LDPC encoder. Control information including (k,n,m) information is input to the quasi-cyclic LDPC decoder 11. The control information is described before, so the detailed description will be omitted herein.

The parity check matrix generator 613 also inputs the control information, converts a prestored base matrix into a parity check matrix, based on the control information, and outputs the parity check matrix to the quasi-cyclic LDPC decoder 611.

The quasi-cyclic LDPC decoder 611 generates a recovered information vector by quasi-cyclic LDPC decoding the received vector, based on the control information.

Although FIG. 6 illustrates the parity check matrix generator 613 generating the parity check matrix and outputting the parity check matrix to the quasi-cyclic LDPC decoder 611, alternatively, the quasi-cyclic LDPC decoder 611 may prestore the parity check matrix, and in this case, the parity check matrix generator 613 is not utilized.

Although FIG. 6 illustrates the control information being input from the outside to the quasi-cyclic LDPC decoder 611 and the parity check matrix generator 613, alternatively, the quasi-cyclic LDPC decoder 611 and the parity check matrix generator 613 may prestore the control information.

While the quasi-cyclic LDPC decoder 611 and the parity check matrix generator 613 are illustrated in FIG. 6 as separate units, alternatively, these components may be incorporated into a single unit.

Although not illustrated, the signal reception apparatus includes the quasi-cyclic LDPC code decoder and a receiver, and the quasi-cyclic LDPC code decoder and the receiver may be incorporated into a single unit.

Figure 7:
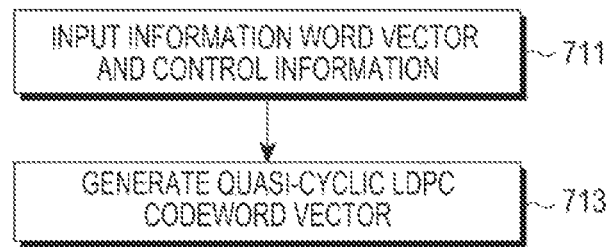
FIG. 7 is a flowchart illustrating an operation process of a quasi-cyclic LDPC code generator included in a signal transmission apparatus in an MMT system according to an embodiment of the present invention.

FIG. 7 is a flow chart illustrating an operation process of a quasi-cyclic LDPC code generator included in a signal transmission apparatus in an MMT system according to an embodiment of the present invention.

Referring to FIG. 7, in step 711, a quasi-cyclic LDPC code generator receives an information word vector and control information. In step 713, the quasi-cyclic LDPC code generator generates a quasi-cyclic LDPC codeword vector by performing a quasi-cyclic LDPC encoding operation on the information word vector, based on the control information. The quasi-cyclic LDPC codeword vector includes an information word vector including k information word symbols and a parity vector including m parity symbols.

Figure 8:
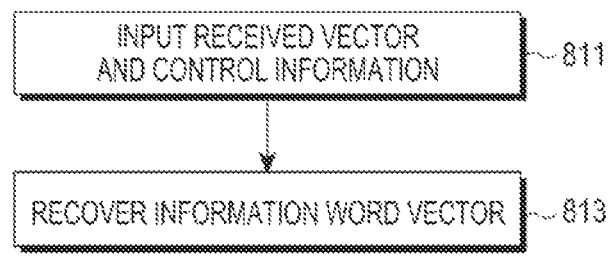
FIG. 8 a flowchart illustrating an operation process of a quasi-cyclic LDPC code decoder included in a signal reception apparatus in an MMT system according to an embodiment of the present invention.

FIG. 8 is a flow chart illustrating an operation process of a quasi-cyclic LDPC code decoder included in a signal reception apparatus in an MMT system according to an embodiment of the present invention.

Referring to FIG. 8, in step 811, a quasi-cyclic LDPC code decoder receives a received vector and control information. In step 813, the quasi-cyclic LDPC code decoder recovers an information word vector by quasi-cyclic LDPC decoding the received vector using the control information and a parity check matrix.

As is apparent from the foregoing description, various embodiments of the present invention provide quasi-cyclic LDPC code transmission and reception supporting various codeword lengths and code rates in a multimedia communication system. Further, the above-described embodiments of the present invention provide quasi-cyclic LDPC code encoding and decoding that support various codeword lengths using a scaling scheme and a shortening scheme in a multimedia communication system, and support various code rates using a row separation scheme or a row merge scheme, and a puncturing scheme in a multimedia communication system.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for transmitting a Low Density Parity Check (LDPC) code by a signal transmission apparatus in a multimedia system, the method comprising:

generating an LDPC code based on a resulting parity check matrix which is generated by performing a row splitting operation on a base parity check matrix; and transmitting the LDPC code, wherein the row splitting operation includes splitting each row block included in the base parity check matrix into row blocks, wherein a number of the row blocks is determined based on a splitting factor, and wherein the splitting factor is determined based on a number of repair symbols included in a repair symbol block of the base parity check matrix, a number of rows included in the base parity check matrix, and a scaling factor for determining a size of each permutation matrix in the resulting parity check matrix and a size of each zero matrix included in the resulting parity check matrix.

2. The method of claim 1, wherein the base parity check matrix is represented as a sequence of pairs $(t_{ij}, e_{ij})$, where $t_{ij}$ is an index of a column block corresponding to a j-th permutation matrix among permutation matrixes included in the base parity check matrix, and $e_{ij}$ is an exponent of the column block corresponding to the j-th permutation matrix, and wherein an (S2×i+j)-th row block of the resulting parity check matrix is expressed as:

$$T'_{(S2 \times i)+j} = \{(t_{i,k}, e_{i,k}) | k \bmod S2 = (S2-1-j), 0 \le k < Di\}$$

where, S2 denotes the splitting factor, and Di denotes a number of permutation matrixes included in each row block of the base parity check matrix.

3. The method of claim 1, wherein the splitting factor is expressed as:

$$S2 = ceil(P/(M \times L)/S1))$$

where, S2 denotes the splitting factor, P denotes the number of repair symbols included in the repair symbol block of the base parity check matrix, M denotes the number of rows included in the base parity check matrix, L denotes a size of each permutation matrix included in the base parity check matrix, and S1 denotes the scaling factor.

4. The method of claim 1, wherein the scaling factor is expressed as $S1=2^a$, and wherein "a" denotes a largest integer satisfying $k \le (K \times L)/2^a$, where k denotes a number of source symbols included in a source symbol block of the base parity check matrix, K denotes a number of column blocks included in the base parity check matrix, and L denotes a size of each permutation matrix included in the base parity check matrix.

5. The method of claim 4, wherein the base parity check matrix is represented as a sequence of pairs $(t_{ij}, e_{ij})$, where $t_{ij}$ is an index of a column block corresponding to a j-th permutation matrix, and $e_{ij}$ is an exponent of the column block corresponding to the j-th permutation matrix.

6. A signal transmission apparatus in a multimedia system, the signal transmission apparatus comprising:

an encoder configured to generate a Low Density Parity Check (LDPC) code based on a resulting parity check matrix which is generated by performing a row splitting operation on a base parity check matrix; and a transmitter configured to transmit the LDPC code, wherein the row splitting operation includes splitting each row block included in the base parity check matrix into row blocks, wherein a number of the row blocks is determined based on a splitting factor, and wherein the splitting factor is determined based on a number of repair symbols included in a repair symbol block of the base parity check matrix, a number of rows included in the base parity check matrix, and a scaling factor for determining a size of each permutation matrix in the resulting parity check matrix and a size of each zero matrix included in the resulting parity check matrix.

7. The signal transmission apparatus of claim 6, wherein the base parity check matrix is represented as a sequence of pairs $(t_{ij}, e_{ij})$, where $t_{ij}$ is an index of a column block corresponding to a j-th permutation matrix among permutation matrixes included in the base parity check matrix, and $e_{ij}$ is an exponent of the column block corresponding to the j-th permutation matrix, and wherein an (S2×i+j)-th row block of the resulting parity check matrix is expressed as:

$$T'_{(S2 \times i)+j} = \{(t_{i,k}, e_{i,k}) | k \bmod S2 = (S2-1-j), 0 \le k < Di\}$$

where, S2 denotes the splitting factor, and Di denotes a number of permutation matrixes included in each row block of the base parity check matrix.

8. The signal transmission apparatus of claim 6, wherein the splitting factor is expressed as:

$$S2 = ceil(P/(M \times L)/S1))$$

where, S2 denotes the splitting factor, P denotes the number of repair symbols included in the repair symbol block of the base parity check matrix, M denotes the number of rows included in the base parity check matrix, L denotes a size of each permutation matrix included in the base parity check matrix, and S1 denotes the scaling factor.

9. The signal transmission apparatus of claim 6, wherein the scaling factor is expressed as $S1=2^a$, and wherein "a" denotes a largest integer satisfying $k \le (K \times L)/2^a$, where k denotes a number of source symbols included in a source symbol block of the base parity check matrix, K denotes a number of column blocks included in the base parity check matrix, and L denotes a size of each permutation matrix included in the base parity check matrix.

10. The signal transmission apparatus of claim 9, wherein the base parity check matrix is represented as a sequence of pairs $(t_{ij}, e_{ij})$, where $t_{ij}$ is an index of a column block corresponding to a j-th permutation matrix, and $e_{ij}$ is an exponent of the column block corresponding to the j-th permutation matrix.

* * * * *